United States Patent
Horikawa et al.

[19]

[11] Patent Number: 6,049,103
[45] Date of Patent: *Apr. 11, 2000

[54] SEMICONDUCTOR CAPACITOR

[75] Inventors: Tsuyoshi Horikawa; Yoshikazu Tsunemine; Takeharu Kuroiwa; Tetsuro Makita; Noboru Mikami, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/620,606

[22] Filed: Mar. 22, 1996

[30] Foreign Application Priority Data

Mar. 22, 1995 [JP] Japan ..................... 7-063081
Apr. 11, 1995 [JP] Japan ..................... 7-085537
Feb. 29, 1996 [JP] Japan ..................... 8-043427

[51] Int. Cl.[7] .................. H01L 27/108; H01L 29/76; H01L 29/94; H01L 31/119
[52] U.S. Cl. .................. 257/303; 257/306; 257/309; 257/296; 257/310; 257/532; 257/534
[58] Field of Search .................. 257/303, 532, 257/534, 297, 306, 309, 310, 296

[56] References Cited

U.S. PATENT DOCUMENTS

| | | | |
|---|---|---|---|
| 5,005,102 | 4/1991 | Larson | 361/313 |
| 5,053,917 | 10/1991 | Miyasaka et al. | 361/321 |
| 5,122,923 | 6/1992 | Matsubara et al. | 361/321 |
| 5,191,510 | 3/1993 | Huffman | 361/313 |
| 5,382,817 | 1/1995 | Kashihara et al. | 257/295 |
| 5,418,388 | 5/1995 | Okudaira et al. | 257/295 |
| 5,442,213 | 8/1995 | Okudaira et al. | 257/310 |
| 5,717,236 | 2/1998 | Shinkawata | 257/306 |
| 5,774,327 | 6/1998 | Park | 361/321.5 |
| 5,796,133 | 8/1998 | Kwon et al. | 257/295 |

FOREIGN PATENT DOCUMENTS

| | | |
|---|---|---|
| 3-44019 | 2/1991 | Japan . |
| 4-6867 | 1/1992 | Japan . |

*Primary Examiner*—William Mintel

[57] ABSTRACT

A thin film capacitor structure of a random access memory includes plurality of capacitors formed on an interlayer insulating film. The capacitor structure includes a plurality of lower electrodes formed on the interlayer insulating film, a first dielectric film formed over the plurality of lower electrodes and portions of the interlayer insulating film between lower electrodes, a second dielectric film formed on the first dielectric film, and an upper electrode formed on the second dielectric layer. A silicon oxide film is formed at the step portions of the first dielectric film which result at the periphery of the lower electrodes to prevent leakage current between adjacent capacitors.

2 Claims, 65 Drawing Sheets

SEMICONDUCTOR CAPACITOR

BACKGROUND OF THE INVENTION

1. Field of the Invention

The present invention relates to a semiconductor device and a fabrication method therefor, or in particular to a semiconductor device having a capacitor comprising a dielectric film made of a material having a high dielectric material, such as a dynamic random access memory, and a fabrication method therefor.

2. Description of the Prior Art

Electric circuits formed in semiconductor devices such as a dynamic random access memory (RAM) include various thin film capacitors. A dynamic random access memory needs a thin film transistor for each memory cell in order to hold signal charges in a very small area. In order to increase degree of integration of a dynamic random access memory, it is required to fabricate a thin film capacitor in an area as small as possible. That is, it is needed to increase a capacitance of a thin film capacitor. The capacitance of a thin film capacitor is proportional to a dielectric constant of a dielectric film. Then, in a semiconductor device described in Japanese Patent laid open Publication No. 44019/1991, a dielectric film of the capacitor is made of a material such as $BaTiO_3$ having a high relative dielectric constant. In order to increase the degree of integration of a dynamic random access memory, it is needed to adopt a multi-layer structure with insulating films provided between circuits in layers.

However, a prior art thin film capacitor has a problem that the dielectric constant of the capacitor decreases by a leak current caused by defects in the dielectric film. A leak current is needed to be low in order to have a high capacitance enough to secure sufficient signal charges at a low voltage and to prevent dispersion of the charges. In general, there is a tendency that the capacitance can be increased by decreasing the thickness of the dielectric film while this increases the leak current due to trap levels in the film. In order to decease trap levels in order to decrease the leak current, annealing is performed on the material such as $BaTiO^3$ having a high dielectric constant. However, in order to decease trap levels in order to decrease the leak current, annealing has to be performed at a temperature of 600° C. or higher, and this high temperature process is liable to cause a bad influence to a transistor or the like fabricated below the thin film transistor. Further, even when such annealing is performed, the leak current is not sufficiently low, and it is desired to further decrease the leak current and to increase the dielectric constant.

Further, when a thin film capacitor is formed in a semiconductor device such as a DRAM, very fine patterns of a thin film are fabricated by etching with very fine resist patterns with ultraviolet rays of a short wavelength. As the degree of integration becomes larger as in a DRAM of 1 gigabits, it is expected that a minimum of processing width becomes 0.2 $\mu$m or less. Then, exposure with soft X rays will be required. However, because X rays have an energy per photon, there are problems that defects are generated due to radiations in the dielectric film of the capacitor in a memory cell so that this deteriorates characteristics of the thin film capacitor. Especially in a DRAM, metallization is performed after forming thin film capacitors. However, aluminum used in the metallization has a low melting point, it is difficult to recover the characteristics of the thin film capacitors by annealing or the like.

Platinum is usually used for a lower electrode of a thin film capacitor. However, this has a problem because a material below the lower electrode disperses through the lower electrode to the dielectric film, to decrease a dielectric constant of the thin film capacitor.

Especially, in a multi-layer DRAM for high integration, a lower electrode of a thin film capacitor is connected through a silicon plug to a transistor formed below the capacitor. However, in a high temperature process (>350° C.) silicon disperses through the plug to the dielectric film, and this also decreases a dielectric constant of the thin film capacitor.

When platinum is used for a lower electrode of a thin film capacitor, it is difficult to form a reaction layer between an interface with a dielectric film. However, an amorphous layer having a low dielectric constant is liable to be formed at an interface with the dielectric film due to lattice mismatching between the platinum electrode and the dielectric film.

SUMMARY OF THE INVENTION

A first object of the present invention is to provide a semiconductor device including a thin film capacitor which is not deteriorated in a manufacturing method therefor and a manufacturing method therefor.

A second object of the present invention is to provide a semiconductor device including a thin film capacitor having a small leak current.

A third object of the present invention is to provide a semiconductor device including a thin film capacitor having a large capacitance.

A fourth object of the present invention is to provide a semiconductor device including a plurality of transistors and thin film capacitors and having a multi-layer structure wherein the device is not deteriorated in the manufacturing method therefor.

A fifth object of the present invention is to provide a semiconductor device including a thin film capacitor which is not deteriorated by X ray exposure, and a manufacturing method therefor.

In a first aspect of the invention, a thin film capacitor in a semiconductor device included a first electrode formed on a semiconductor substrate, a dielectric film formed on the first electrode, and a second electrode formed on the dielectric film. At least one of the first and second electrodes includes as a main constituent element at least one metallic element whose oxide or nitride having a relative dielectric constant equal to or larger than 20, or a metallic electrode made of at least one metallic element whose oxide or nitride is electrically conducting. Then, even if such an oxide or nitride is formed at an interface of the first or second electrode with the dielectric film, the capacitance of the capacitor is not decreased.

In second aspect of the invention, in a semiconductor device which includes a capacitor having of a dielectric film formed between first and second electrodes, a protection film may be is formed at an interface of at least one of the first and second electrodes opposite to an interface thereof with the dielectric film, for preventing diffusion into the at least one of the first and second electrodes. A different type of protection film may be formed between the dielectric film and at least one of the first and second electrodes for preventing diffusion into the dielectric film, and the protection film includes an insulator having a dielectric constant of 20 or larger or includes an electrical conductor. Thus, the capacitance of the capacitor is not deteriorated due to diffusion or reduction on fabricating the capacitor.

In a third aspect of the invention, in a semiconductor device including a capacitor having of a dielectric film formed between first and second electrodes, the second electrode has a polycrystalline film including a noble metal as a main component and having an average crystalline grain size equal to or less than 50 nm. Thus, the leak current is reduced. In a different way, in a semiconductor device including a capacitor having of a dielectric film formed between first and second electrodes, the dielectric film includes an insulator portion near a side of the dielectric film. Thus, the leak current through the side is reduced.

In a fourth aspect of the invention, in a semiconductor device including a capacitor having of a dielectric film formed between first and second electrodes, the dielectric film is made of a dielectric material having perovskite structure, and at least one of the first and second electrodes is made of a metal or metallic compound having a lattice constant being different within 2 atomic percent from that of the dielectric film. This is realized for example by using a solid solution or alloy. Thus, generation of a layer having a low dielectric constant due to lattice mismatching is suppressed, and deterioration of the thin film capacitor is prevented.

In a fifth aspect of the invention, in a capacitor in a semiconductor device including of a dielectric film formed between first and second electrodes, the first electrode has a rough interface with the dielectric film. Thus, an effective area of the first electrode is enhanced, and the capacitance is improved.

In a sixth aspect of the invention, in a semiconductor device including a capacitor having of a dielectric film formed between first and second electrodes, the first electrode has a barrier metal layer and another metallic layer formed between the barrier metal layer and the dielectric film, and the barrier metal includes a material preventing diffusion from a layer adjacent to the barrier metal. Then, insulation between adjacent capacitors is improved. In a different way, an insulating film is formed between adjacent second electrodes in order to improve insulation between adjacent capacitors.

In a seventh aspect of the invention, when a thin film capacitor is formed, a cavity is formed on an insulating layer, and a conductive film is applied to the insulating layer including the cavity. Then, the conductive film is removed from the surface thereof until it remains only in the cavity as a first electrode of the capacitor.

In an eighth aspect of the invention, a semiconductor device includes a transistor having source and drain regions and a gate electrode formed on a gate insulation film, and a capacitor connected to the source or drain region through a contact formed in a layer insulation film provided between the transistor and the capacitor. A gate insulation layer is formed on which the gate electrode is formed, and an insulation layer is provided to cover the gate electrode. The gate insulator layer or the insulation layer below or above the gate electrode is made of a material which is not etched by an etchant of the layer insulation film for forming the contact.

In a ninth aspect of the invention on a fabrication method of a semiconductor device including a capacitor having of a dielectric film formed between first and second electrodes, when the dielectric film is formed on the first electrode, it is exposed to high energy radiations to generate quasi-stable defects therein. Further, the dielectric film is annealed after exposure to the high energy radiations to annihilate defects with the quasi-stable defects.

In a tenth aspect of the invention, when a semiconductor device is fabricated including a capacitor having a dielectric film formed between first and second electrodes, an X ray absorption film is formed above the second electrode to absorb X rays when a resist pattern is produced with X rays. Preferably, a product of an absorption coefficient of the X ray absorption film and a thickness of the X ray absorption film is equal to or larger than one.

An advantage of the present invention is that a thin film capacitor in the device has a small leak current.

A second advantage of the present invention is that a semiconductor device has a large capacitance.

A third advantage of the present invention is that a semiconductor device including a thin film capacitor is not deteriorated in a fabrication method therefor.

A fourth advantage of the present invention is that a semiconductor device including a thin film capacitor is not deteriorated by X ray exposure.

BRIEF DESCRIPTION OF THE DRAWINGS

These and other objects and features of the present invention will become clear from the following description taken in conjunction with the preferred embodiments thereof with reference to the appended drawings, and in which.

DETAILED DESCRIPTION OF THE PREFERRED EMBODIMENTS

Figure 1:
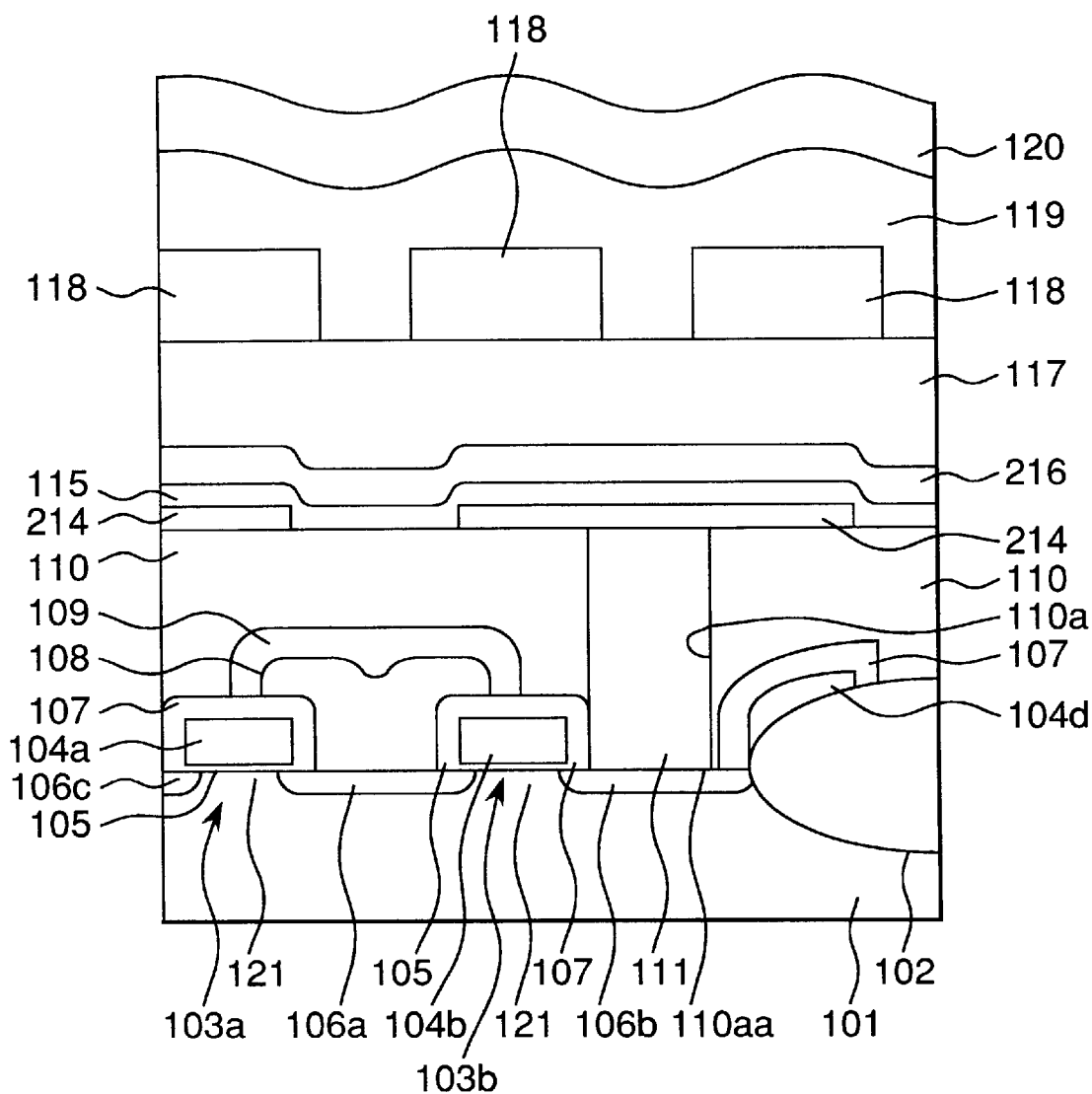
FIG. 1 is a partial sectional view of a dynamic random access memory of a first embodiment of the invention.

Referring now to the drawings, wherein like reference characters designate like or corresponding parts throughout the views, embodiments of the invention are explained. FIG. 1 is a partial sectional view of a dynamic random access memory (DRAM) of a first embodiment of the invention. A structure below a thin film capacitor is similar to a prior art structure. Transfer transistors 103a and 103b and a field oxide film 102 are formed on a P type semiconductor substrate 101. That is, gate electrodes 104a and 104b are formed on a gate insulating films 105 and covered with oxide films 107. A metallic region 104d and an insulating film 107 are also formed on the field oxide film 102. N type impurity regions 106a, 106b are formed in the semiconductor substrate 101 between the gate electrodes 106a, 106b and between the gate electrode 106b and the field oxide film 102. A bit line 108 is formed on the N type impurity region 106a between the gate electrodes 104a, 104b, and an insulating film 109 is formed on the bit line 108. A first layer insulation film 110 are formed on the insulator films 107, 109. A contact hole 110a is formed on the N type impurity region 106b through the first layer insulation film 110, and a plug 111 is formed in the hole 110a.

Then, a thin film capacitor is formed. That is, a lower electrode 214 is formed first so as to be connected to the plug 111. Then, a dielectric film 115 and an upper electrode 216 are formed successively on the lower electrode 214 and the layer insulation film 110. In this embodiment, the electrodes 214 and 216 are made of an alloy of hafnium 80 atomic percent (at %) and tantalum 20 at %, instead of prior art platinum. They are formed with sputtering by using an alloy target in argon atmosphere. The thickness of the lower electrode 214 is preferably between 30 and 150 nm, and that of the upper electrode 216 is preferably between 40 and 200 nm. The dielectric film 115 is prepared by forming a $BaTiO_3$ film made with a sol-gel process and by annealing it in an oxygen environment at 400–700° C. thereafter for crystallization. Etching of the electrode films and the dielectric film are performed with a reactive ion etching. Because the electrodes are made of an alloy of hafnium 80 at % and tantalum 20 at %, fabrication with the reactive ion etching becomes easy. Further, after thermal annealing for crystallizing, a layer having a low dielectric constant such as an oxide layer is not formed. Thus, capacitor characteristics are stable and reliable.

A structure above the thin film capacitor is similar to a prior art structure. A second layer insulation film 117 is formed. Next, first aluminum metallization layers 118, a protection film 119 and aluminum metallization layers 120 are formed successively similarly to a prior art device.

Figure 2:
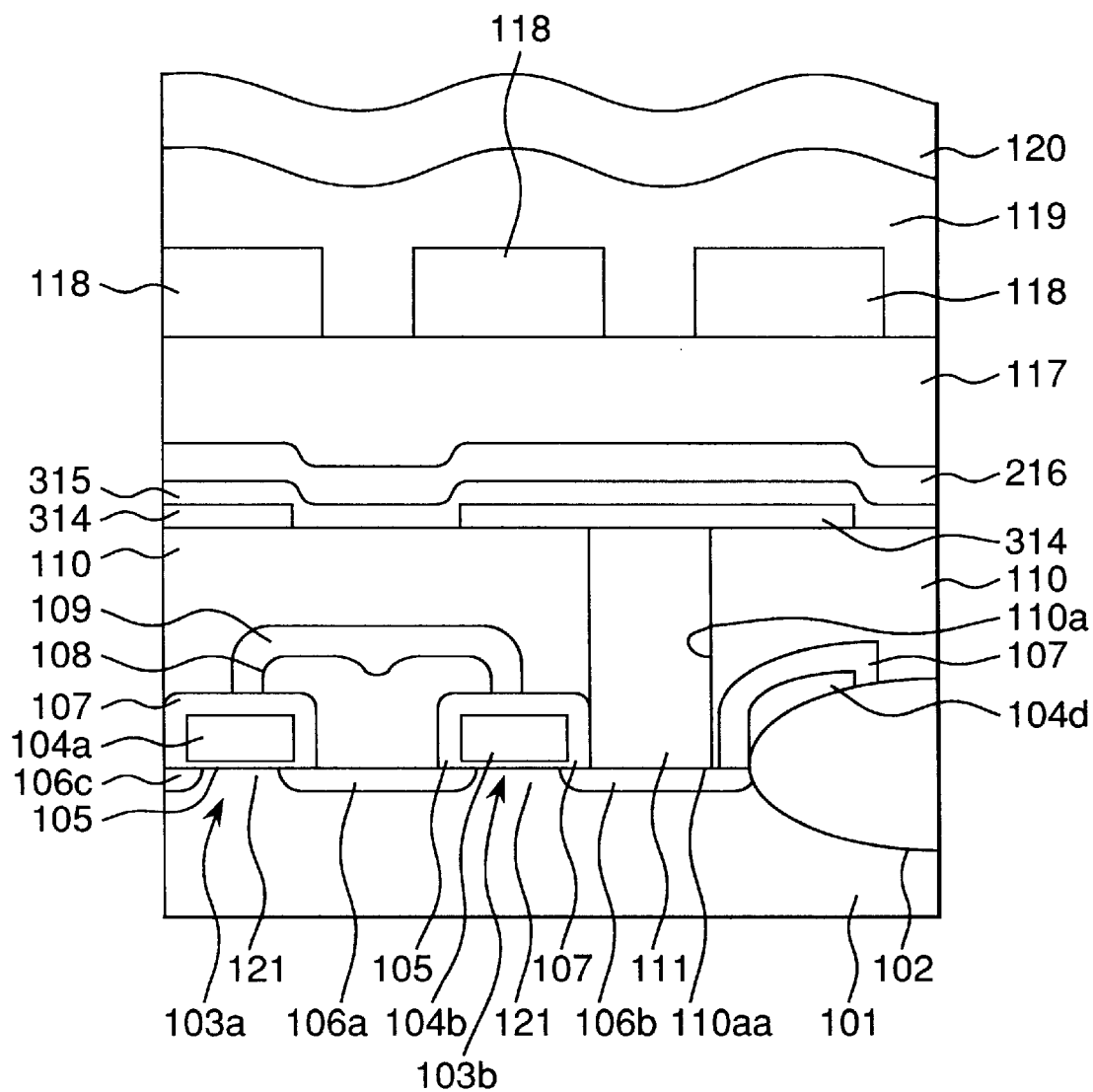
FIG. 2 is a partial sectional view of a dynamic random access memory of a second embodiment of the invention.

FIG. 2 shows a partial sectional view of a dynamic random access memory of a second embodiment of the invention. The device of this embodiment is similar to that of the first embodiment with the exception of aspects of the thin film capacitor discussed below. Lower and upper electrodes 314 and 316 are made of an alloy of tantalum 80 at % and titanium 20 at %, instead of platinum used in prior arts. They are formed with sputtering by using an alloy target in argon atmosphere. The thickness of the lower electrode 314 is preferably between 30 and 150 nm, and that of the upper electrode 316 is preferably between 40 and 200 nm. The dielectric film 315 is prepared by forming a $BaTiO_3$ film made with a chemical vapor deposition process in an oxygen environment at 400–600° C.. Etching of the electrode films and the dielectric film are performed with a reactive ion etching. Because the electrodes are made of an alloy of tantalum 80 at % and titanium 20 at %, fabrication with the reactive ion etching becomes easy. Though a very thin layer is found to be formed at an interface between the lower electrode 314 and the dielectric film 315 ascribable to oxidation of the lower electrode on high temperature generation of the dielectric film. However, the capacitance of the thin film capacitor is equivalent to that of a prior art capacitor using platinum electrodes. Thus, capacitance is not deteriorated due to oxidation of electrode materials.

Figure 3:
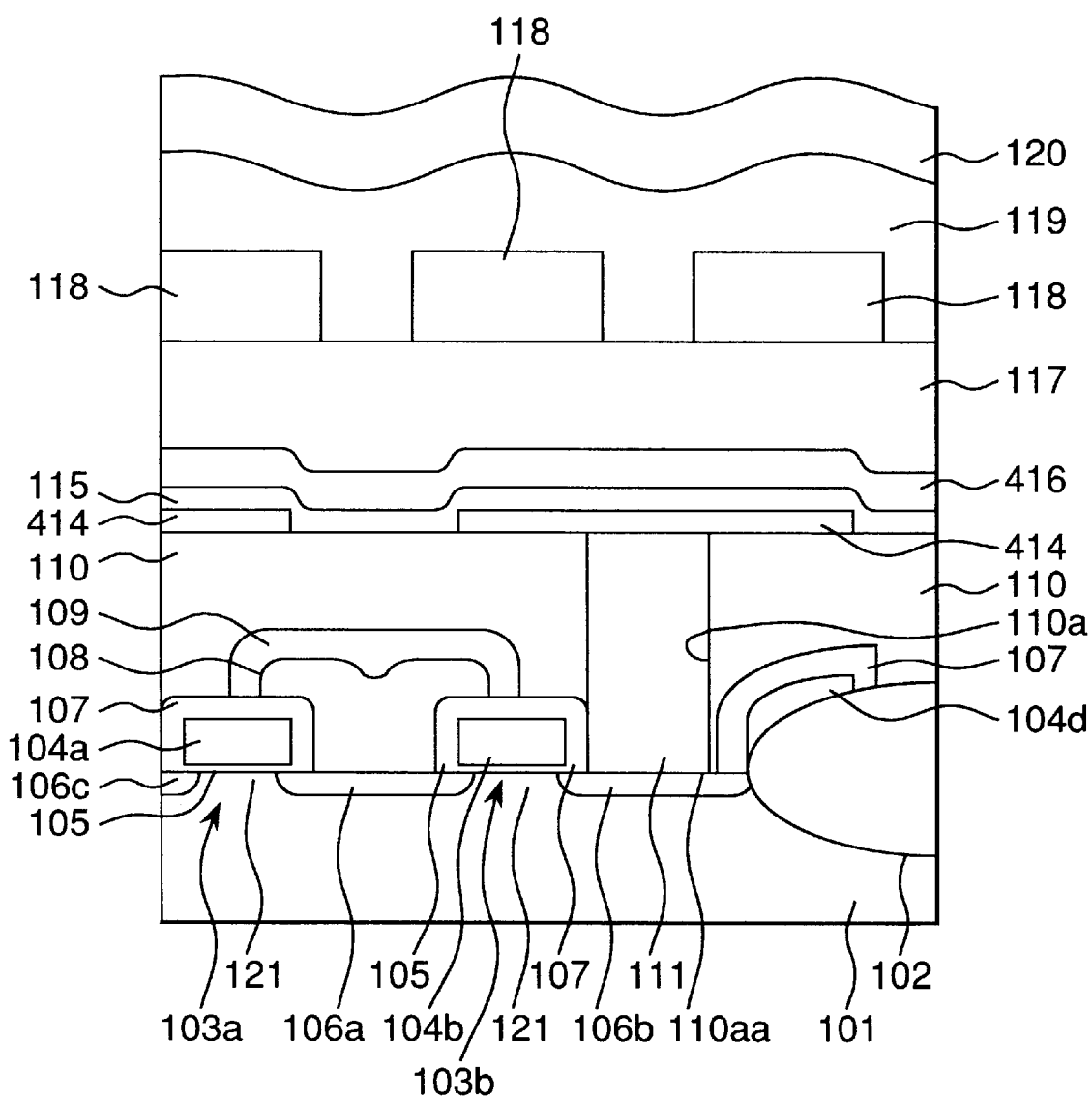
FIG. 3 is a partial sectional view of a dynamic random access memory of a third embodiment of the invention.

FIG. 3 shows a partial sectional view of a dynamic random access memory of a third embodiment of the invention. The device of this embodiment is similar to that of the first embodiment with the exception of aspects of the thin film capacitor discussed below. Lower and upper electrodes 414 and 416 are made of an alloy of ruthenium 80 at % and palladium 20 at %, instead of platinum used in prior arts. They are formed with sputtering by using an alloy target in argon atmosphere. The thickness of the lower electrode 414 is preferably between 30 and 150 nm, and that of the upper electrode 416 is preferably between 40 and 200 nm. The dielectric film 115 is prepared similarly to in the first embodiment by forming a $BaTiO_3$ film made with a chemical vapor deposition process in an oxygen environment at 400–600° C. Etching of the electrode films and the dielectric film are performed with a reactive ion etching. Because the electrodes are made of an alloy of ruthenium 80 at % and palladium 20 at %, fabrication with the reactive ion etching becomes easy. Further, after thermal annealing for crystallizing, a layer having a low dielectric constant such as an oxide layer is not formed. Thus, capacitor characteristics are stable and reliable.

Figure 4:
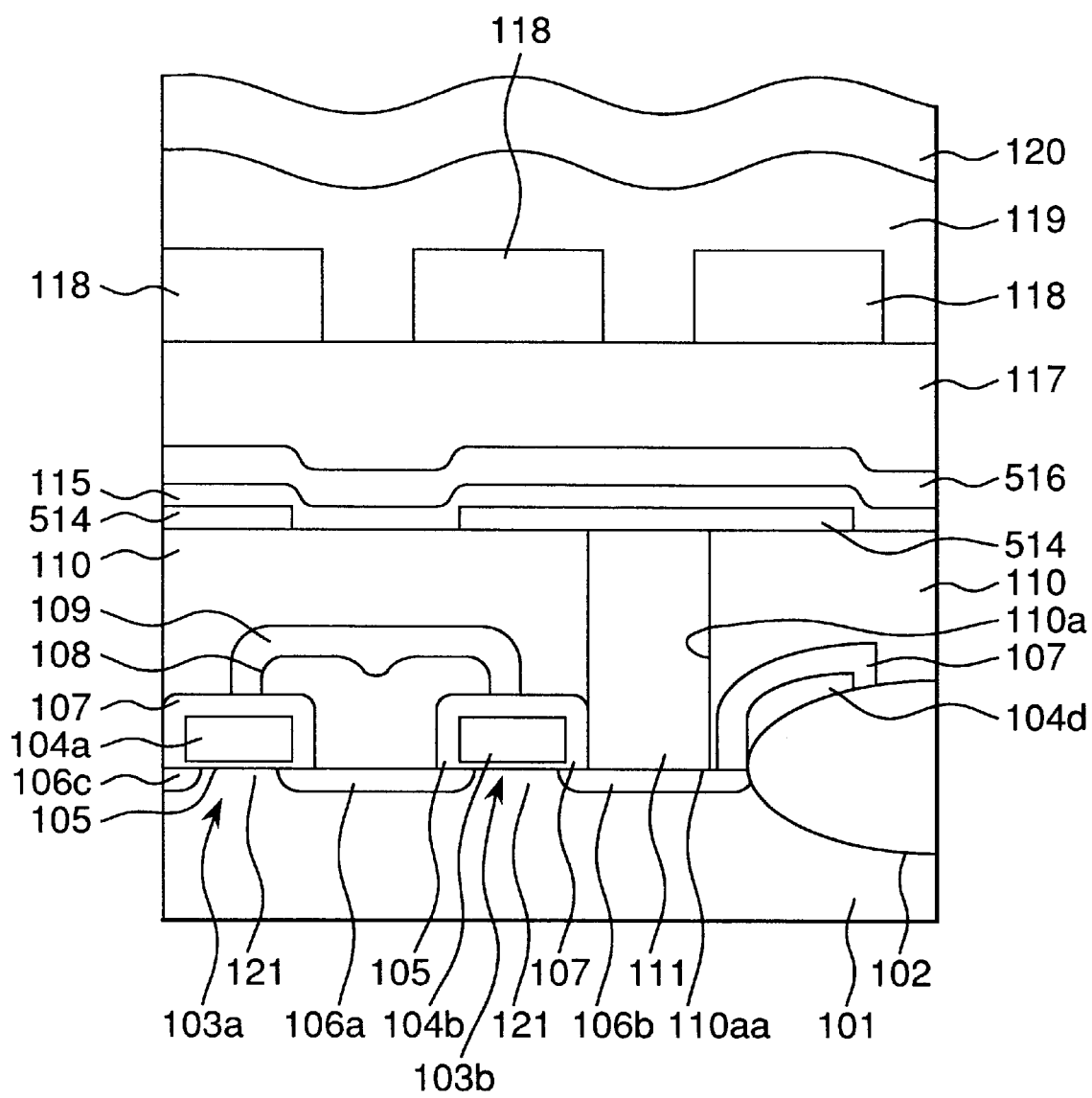
FIG. 4 is a partial sectional view of a dynamic random access memory of a fourth embodiment of the invention.

FIG. 4 shows a partial sectional view of a dynamic random access memory of a fourth embodiment of the invention. The device of this embodiment is similar to that of the second embodiment with the exception of aspects of the thin film capacitor discussed below. Lower and upper electrodes 514 and 516 are made of iridium, instead of platinum used in prior arts. They are formed with sputtering in argon atmosphere. The thickness of the lower electrode 514 is preferably between 30 and 200 nm, and that of the upper electrode 516 is preferably between 40 and 200 nm. The dielectric film 115 is prepared similarly to the second embodiment by forming a $BaTiO_3$ film made with a chemical vapor deposition process in an oxygen environment at 400–600° C. Etching of the electrode films and the dielectric film are performed with a reactive ion etching. Because the electrodes are made of iridium, fabrication with the reactive ion etching becomes easy. Though a very thin layer is found to be formed at an interface between the lower electrode 514 and the dielectric film 115 ascribable to oxidation of the lower electrode on high temperature generation of the dielectric film. However, the capacitance of the thin film capacitor is equivalent to that of a prior art capacitor using platinum electrodes. Thus, capacitance is not deteriorated due to oxidation of electrode materials.

Figure 5:
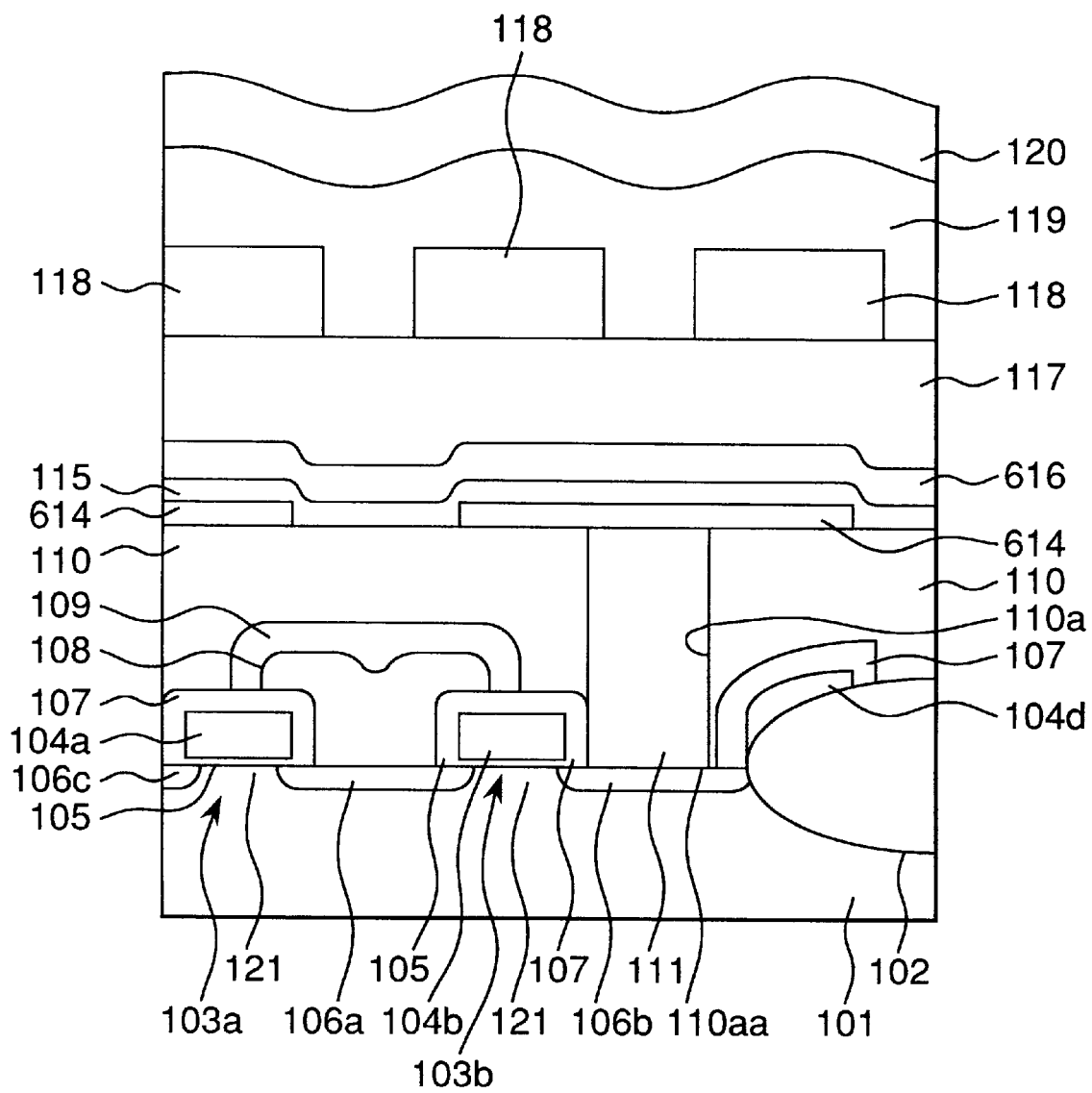
FIG. 5 is a partial sectional view of a dynamic random access memory of a fifth embodiment of the invention.

FIG. 5 shows a partial sectional view of a dynamic random access memory of a fifth embodiment of the invention. The device of this embodiment is similar to that of the first embodiment with the exception of aspects of the thin film capacitor discussed below. Lower and upper electrodes 614 and 616 are made of a platinum alloy including 0.5–5 at % of one of ruthenium, palladium and rhenium. They are formed with sputtering in argon atmosphere. The thickness of the lower electrode 614 is preferably between 30 and 200 nm, and that of the upper electrode 616 is preferably between 40 and 200 nm. The dielectric film 115 is prepared similarly to in the first embodiment by forming a $BaTiO_3$ film made with a chemical vapor deposition process in an oxygen environment at 400–600° C. Etching of the electrode films and the dielectric film are performed with a reactive ion etching. Because the electrodes 614, 616 are made of a platinum alloy including a small amount of ruthenium, palladium or rhenium, a yield is not deteriorated due to separation of the dielectric film 115 from the lower electrode 614, and capacitor characteristics are stable and reliable.

In the DRAMs of the first to fifth embodiments described above, a thin film capacitor is provided therein, and it comprises a dielectric film interposed between a lower electrode and an upper electrode. In the thin film capacitor, at least one of the lower and upper electrodes comprises as a main constituent element at least one metallic element whose oxide or nitride having a relative dielectric constant equal to or larger than 20. Alternately, at least one of the lower and upper electrodes comprises as a main constituent element at least one metallic element whose oxide or nitride is electrically conducting. Then, diffusion of silicon or the like into the dielectric film is prevented, while the electrode can be fabricated more easily. Even if an oxide or the like is formed at an interface of the electrode with the dielectric film, a decrease in dielectric constant due to the oxides or the like can be prevented because they are dielectrics having high dielectric constant or electrical conductors.

Figure 6:
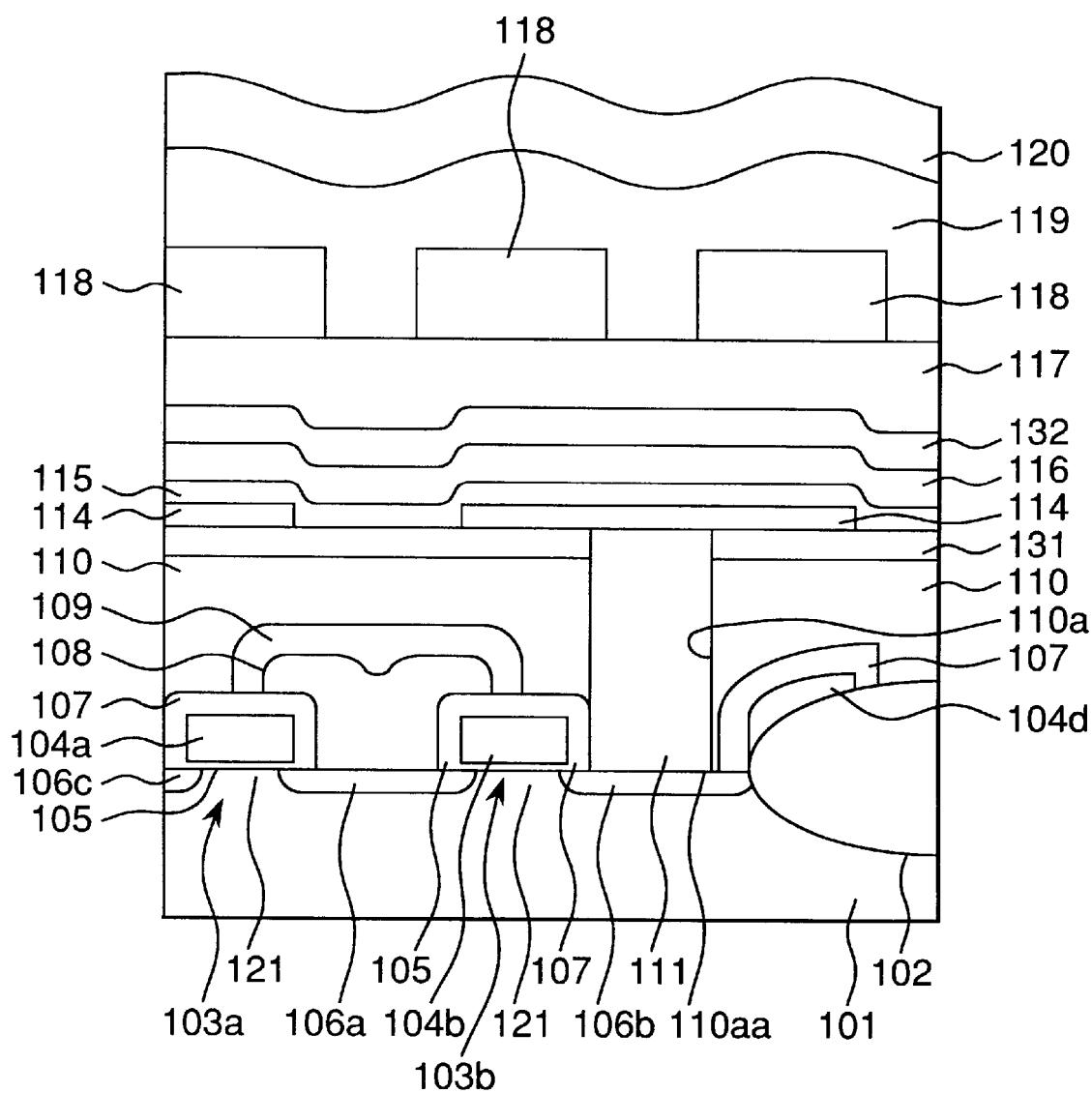
FIG. 6 is a partial sectional view of a dynamic random access memory of a sixth embodiment of the invention.

FIG. 6 shows a partial sectional view of a dynamic random access memory of a sixth embodiment of the invention. The device of this embodiment is similar to that of the first embodiment with the exception of the addition of protection films 131 and 132 provided for a thin film capacitor. The first protection film 131 is formed on the first layer insulation film 110, and the plug 111 is formed through the layer insulation film 110 and the protection film 131. Then, a thin film capacitor is formed on the first protection film 131. The capacitor comprises lower and upper electrodes 114 and 116 and a dielectric film 115 between them. The electrodes 114 and 116 are made of platinum. The dielectric film 115 is prepared by forming a $BaTiO_3$ film made with a chemical vapor deposition process in an oxygen environment at 400–600° C. Etching of the electrode films and the dielectric film are performed with a reactive ion etching. Then, the second protection film 132 is formed on the upper electrode 116, and the second layer insulation film 117 is formed on the second protection film 132.

The first and second protection films 131 and 132 are made of silicon nitride prepared with plasma chemical vapor deposition process. The thicknesses of the first and second protection films 131 and 132 are preferably 30–100 nm, and it is 50 nm in an example. The first and second layer insulation films 110 and 117 are made of silicon oxide prepared with tetraethyl orthosilicate process. After the film 110, 117 is formed, the film surface is flattened by reflow process at 800–900° C. By providing the first and second protection films, diffusion of water content from the layer insulation films 110, 117 to the dielectric film 115 can be suppressed.

Figure 7:
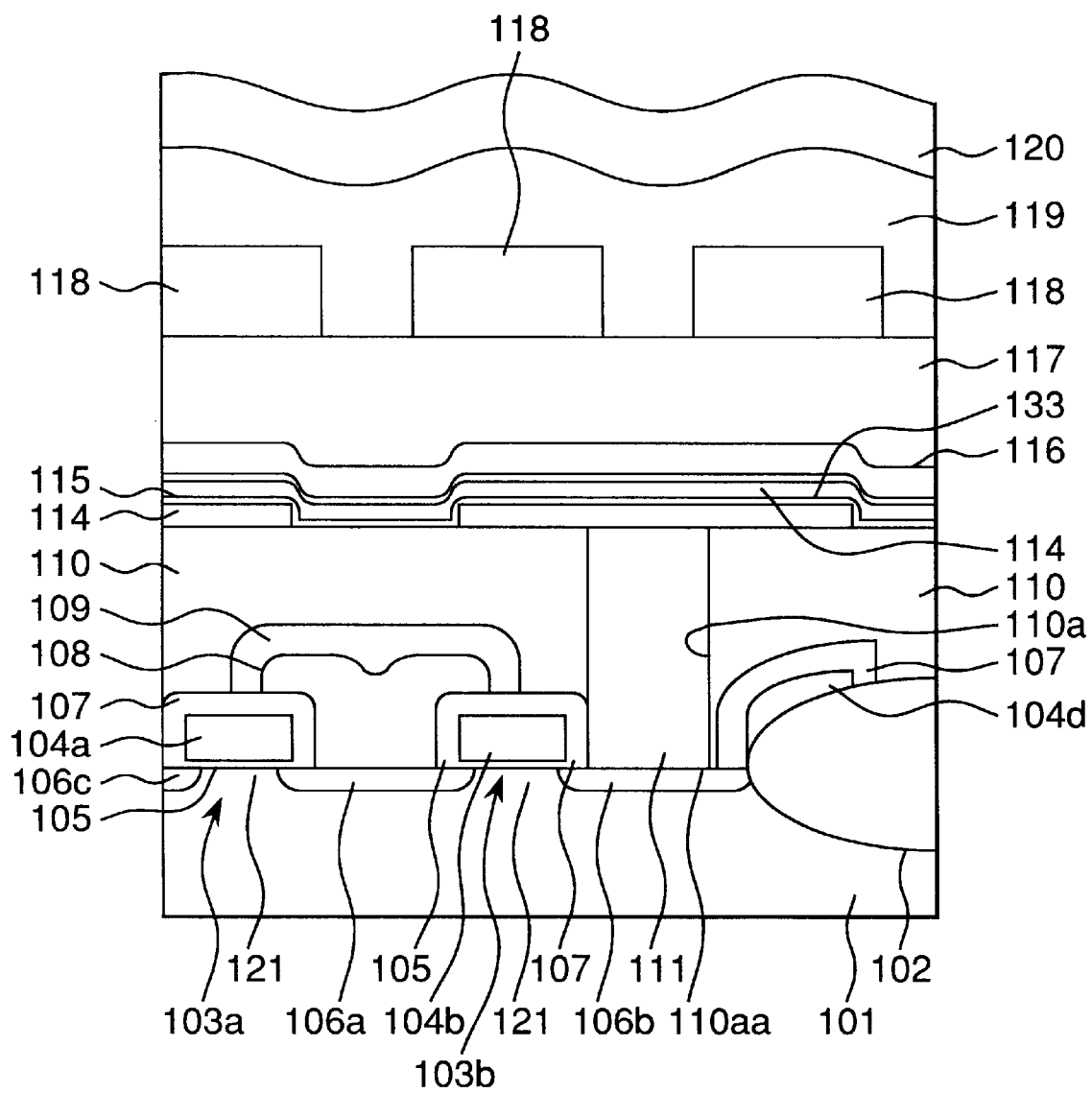
FIG. 7 is a partial sectional view of a dynamic random access memory of a seventh embodiment of the invention.

FIG. 7 shows a partial sectional view of a dynamic random access memory of a seventh embodiment of the invention. The device of this embodiment is similar to that of the first embodiment with the exception that the thin film capacitor includes dispersion prevention films 133 and 134. The capacitor comprises lower and upper platinum electrodes 114 and 116 and a dielectric film 115 between them besides the dispersion prevention films 133 and 134. The dielectric film 115 is prepared by forming a $BaTiO_3$ film made with a chemical vapor deposition process. The first dispersion prevention film 133 is formed between the lower electrode 114 and the dielectric film 115, while the second dispersion film 134 is formed between the dielectric film 115 and the upper electrode 116. The first and second dispersion prevention films 133, 134 are made of titanium oxide, and the thickness thereof is preferably between 5 and 20 nm, and it is 10 nm in an example. The titanium oxide films have a dielectric constant as high as 80–90, and the capacitance nearly decreases due to the existence of the dispersion prevention films 133, 134. Further, the insulation is improved by the dispersion prevention films. Secondary ion mass spectroscopy shows that dispersion of platinum into the dielectric film 115 is reduced. Thus, a semiconductor device having good capacitance characteristic can be provided.

Figure 8:
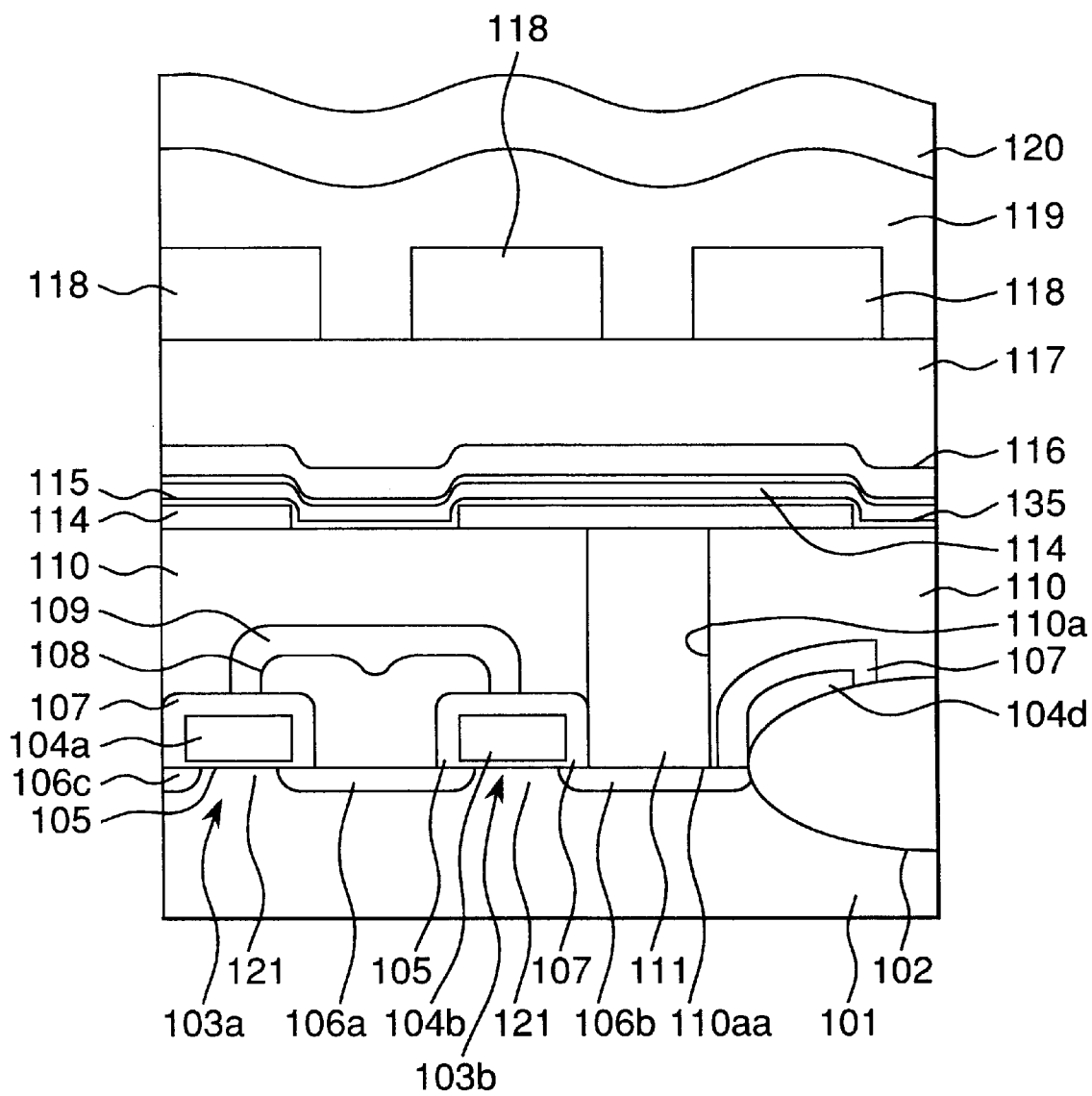
FIG. 8 is a partial sectional view of a dynamic random access memory of an eighth embodiment of the invention.

FIG. 8 shows a partial sectional view of a dynamic random access memory of a eighth embodiment of the invention. The device of this embodiment is similar to that of the seventh embodiment with the exception of the makeup of dispersion prevention films 135 and 136. The first dispersion prevention film 135 is formed between the lower electrode 114 and the dielectric film 115, while the second dispersion film 136 is formed between the dielectric film 115 and the upper electrode 116. This embodiment is different from the seventh embodiment in that the first and second dispersion prevention films 135, 136 are made of titanium nitride. The thickness thereof is preferably between 10 and 40 nm, and it is 10 nm in an example. The titanium nitride films are electrically conducting, and the capacitance nearly decreases due to the existence of the dispersion prevention films 135, 136. Further, the insulation is improved by the dispersion prevention films. Secondary ion mass spectroscopy shows that dispersion of platinum into the dielectric film 115 is reduced. Thus, a semiconductor device having good capacitance characteristic can be provided.

Figure 9:
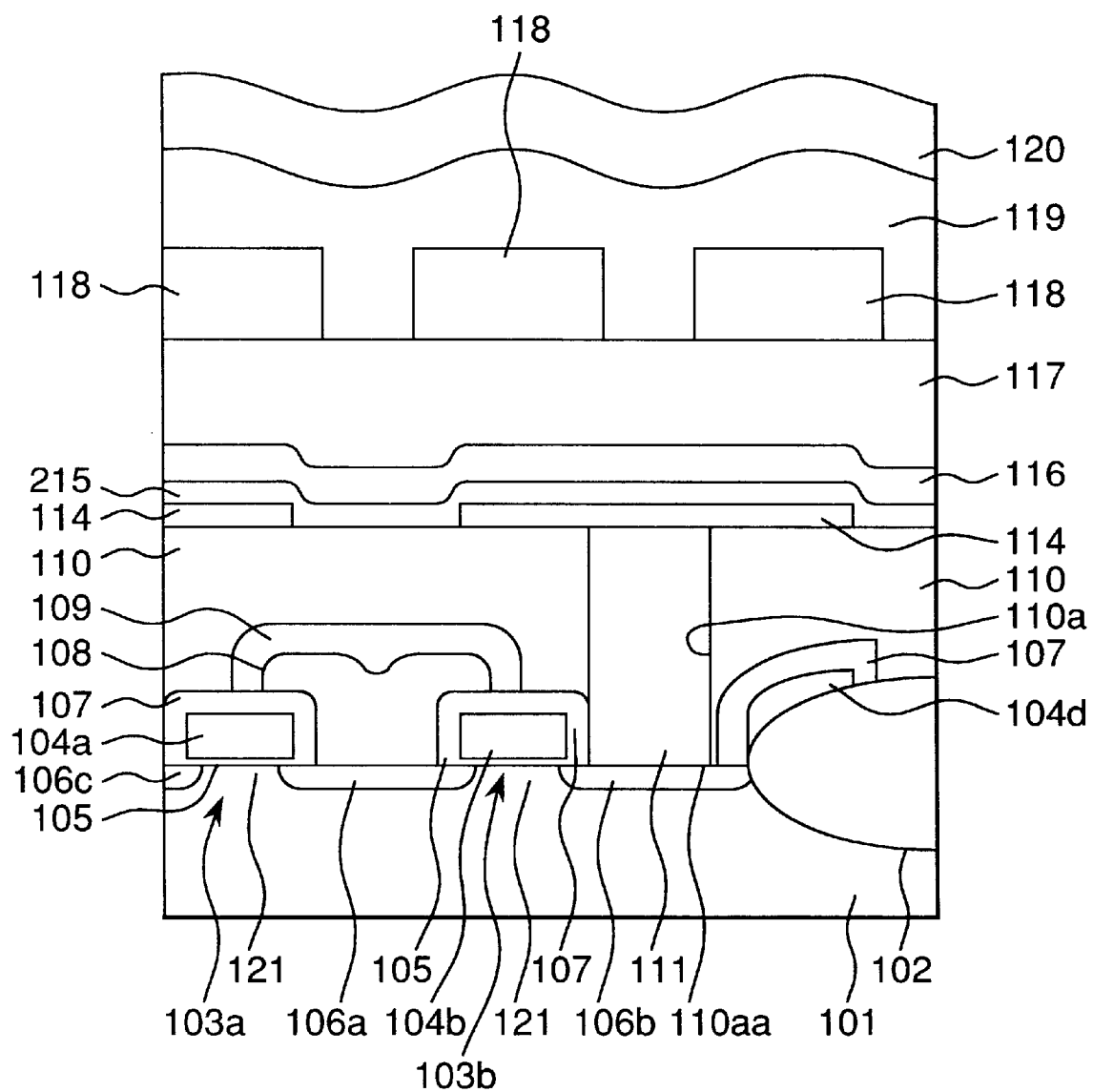
FIG. 9 is a partial sectional view of a dynamic random access memory of a ninth embodiment of the invention.

FIG. 9 shows a partial sectional view of a dynamic random access memory of a ninth embodiment of the invention. The device of this embodiment is similar to that of the first embodiment with the exception of aspects of the thin film capacitor discussed below. The thin film capacitor comprises lower and upper platinum electrodes 114 and 116 prepared with sputtering and a dielectric film 215 interposed between them. The dielectric film 215 made of a $BaTiO_3$ or $SrTiO_3$ film is prepared with a reactive sputtering process, by controlling substrate temperature and pressure of an environment on crystal growth.

Figure 10:
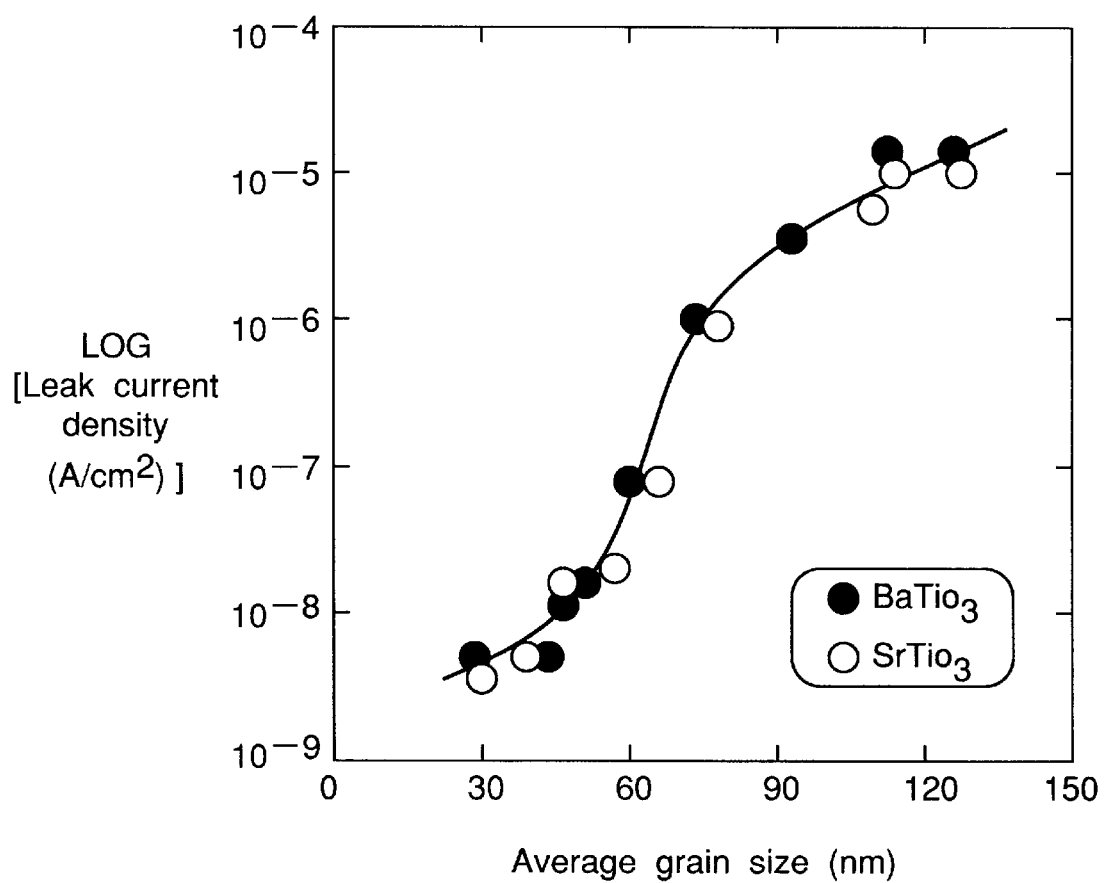
FIG. 10 is a graph of leak current density plotted against average size of dielectric grains.

FIG. 10 shows leak current density at an applied voltage of 2 volts plotted against average grain size of dielectric grains in a $BaTiO_3$ or $SrTiO_3$ film measured along the principal plane thereof. The leak current depends on the average grain size. In order to reduce the leak current density equal to or less than $6*10^{-8}$ $A/cm^2$ or to have good leak current characteristic, average grain size is preferably 50 nm or less. A nitride film may also be used instead of the oxide film.

As explained above, a leak current can be suppressed by providing an insulator film such as an oxide film or a nitride film near an edge or a side of the lower electrode, without deteriorating adhesiveness between the lower electrode and the dielectric film.

Figure 11:
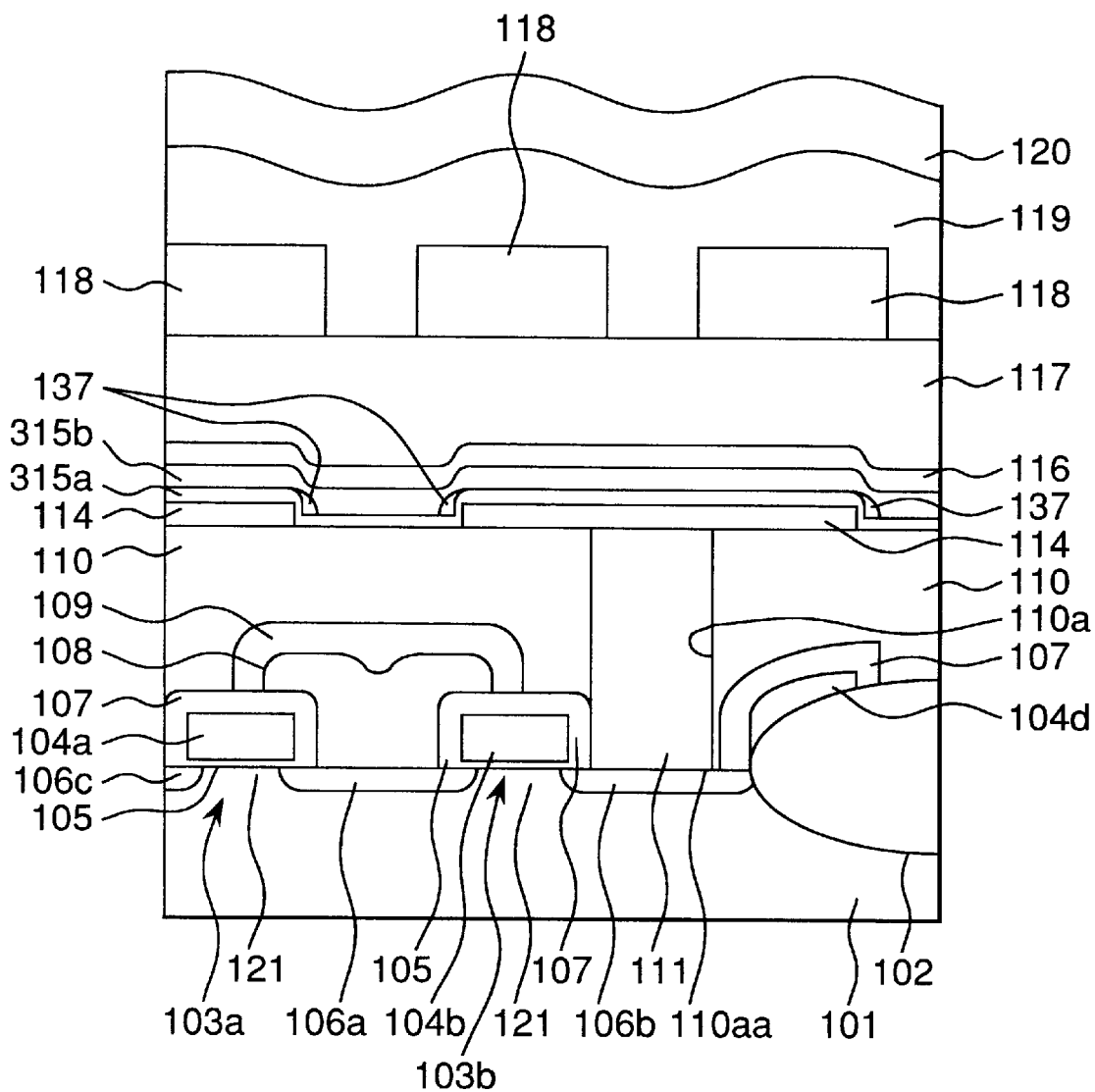
FIG. 11 is a partial sectional view of a dynamic random access memory of a tenth embodiment of the invention.

FIG. 11 shows a partial sectional view of a dynamic random access memory of a tenth embodiment of the invention. The device of this embodiment is similar to that of the ninth embodiment except that the thin film capacitor includes a two-layer dielectric film 315a, 315b. A first dielectric layer 315a is formed on a lower platinum electrode 114, and silicon oxide films 137 are formed so as to cover side walls of the lower electrodes 114. Next, a second dielectric layer 315b is formed on the first one 315a. Then, an upper platinum electrode 116 is formed on the second dielectric layer 315b. The dielectric layers 315a, 315b are prepared by forming a BaTiO$_3$ film made with a reactive sputtering process. The thickness thereof is preferably 5 nm or larger, and it is 30 nm in an example. The silicon oxide films 137 are formed by depositing a silicon oxide layer of about 300 nm thickness with a plasma chemical vapor deposition process and by performing anisotropic etching to leave it so as to cover steps in correspondence to the sides of the lower electrodes 114. By leaving the silicon oxide films 137 at the steps, the leak current of the capacitor can be reduced by about two digits. It is $6*10^{-8}$ A/cm$^2$ for an applied voltage of 2 V. Thus, by providing silicon oxide films in a two-layer dielectric film, the leak through the sides of the lower electrode 114 is reduced, and the capacitor has good leak characteristics.

Figure 12:
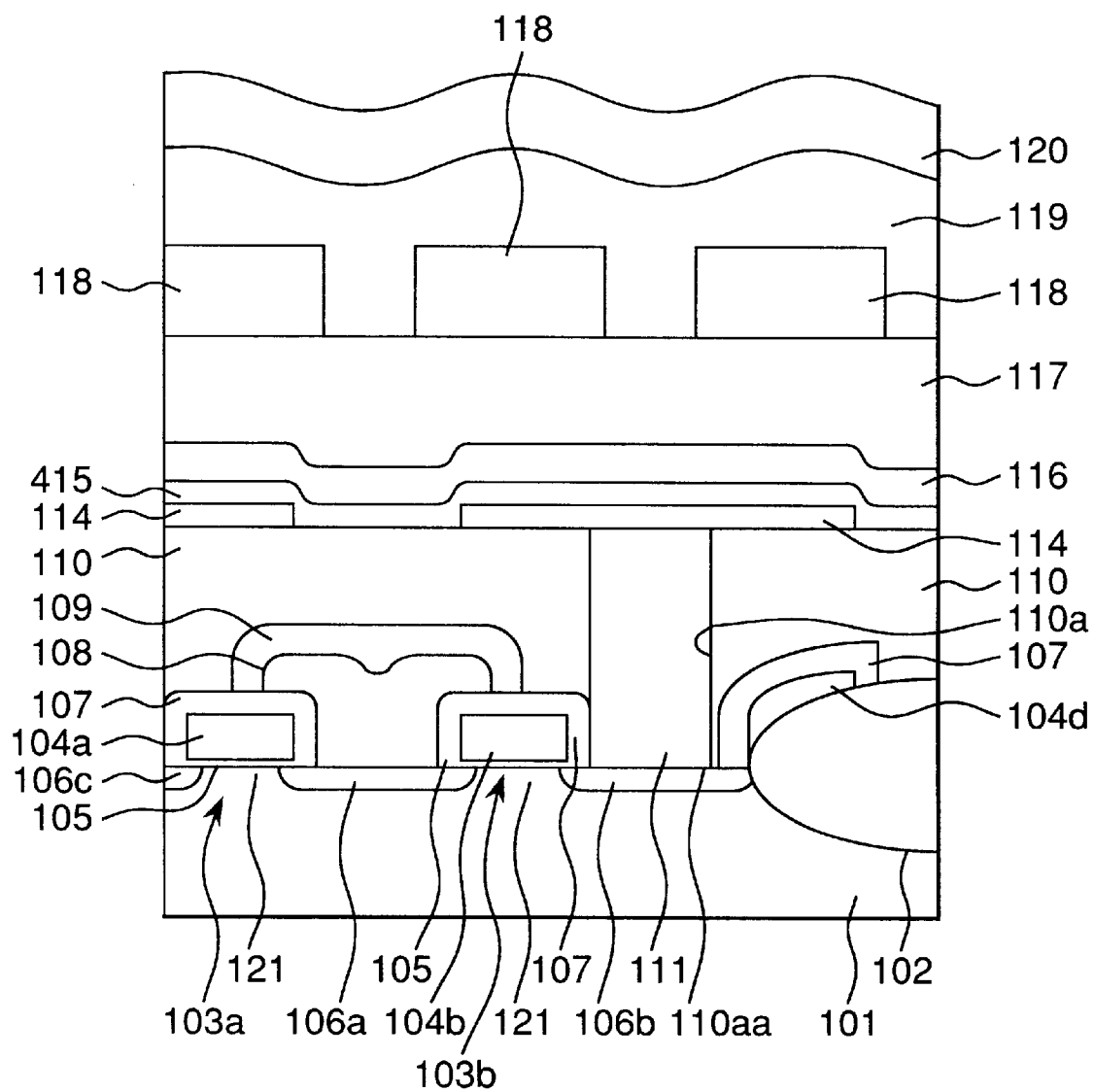
FIG. 12 is a partial sectional view of a dynamic random access memory of an eleventh embodiment of the invention.

FIG. 12 shows a partial sectional view of a dynamic random access memory of an eleventh embodiment of the invention. The device of this embodiment is similar to that of the ninth embodiment with the exception of a dielectric film 415. The dielectric film 415 is formed on a lower platinum electrode 114, and an upper platinum electrode 116 is formed on the dielectric film 415. The dielectric film 415 is made of a solid solution (BaTiO$_3$)$_{1-x}$ (SrTiO$_3$)$_x$ of about 200 nm thickness with a reactive sputtering process.

Figure 13:
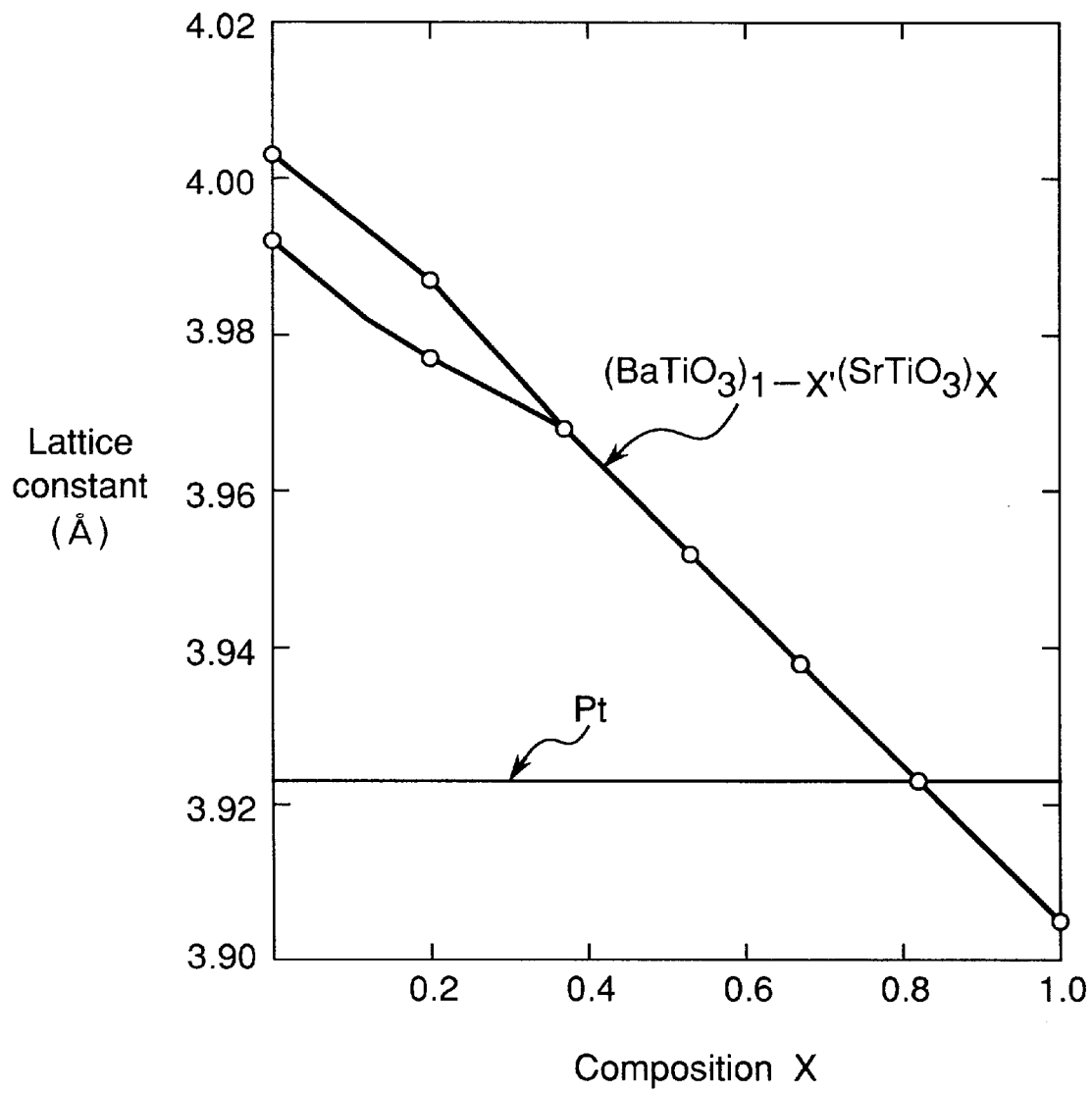
FIG. 13 is a graph of lattice constant plotted against mol ratio X of a solid solution $(BaTiO_3)_x(SrTiO_3)_{1-x}$ in the eleventh embodiment of the invention.

FIG. 13 is a graph of lattice constant plotted against mol ratio x of the solid solution (BaTiO$_3$)$_x$(SrTiO$_3$)$_{1-x}$. The result is similar to that of M. McQuarrie (Landolt-Boernstein, New Series, Group III, Volume 16, Ferroelectrics and Related Substances, Subvolume e a: Oxides, Springer-Verlag Berlin, Heidelberg, New York 1981, p 416, FIG. 669.) FIG. 13 shows that the lattice constant of the solid solution (BaTiO$_3$)$_x$(SrTiO$_3$)$_{1-x}$ agrees with that of platinum for x between 0.8 and 0.9 within 3 at %.

Figure 14:
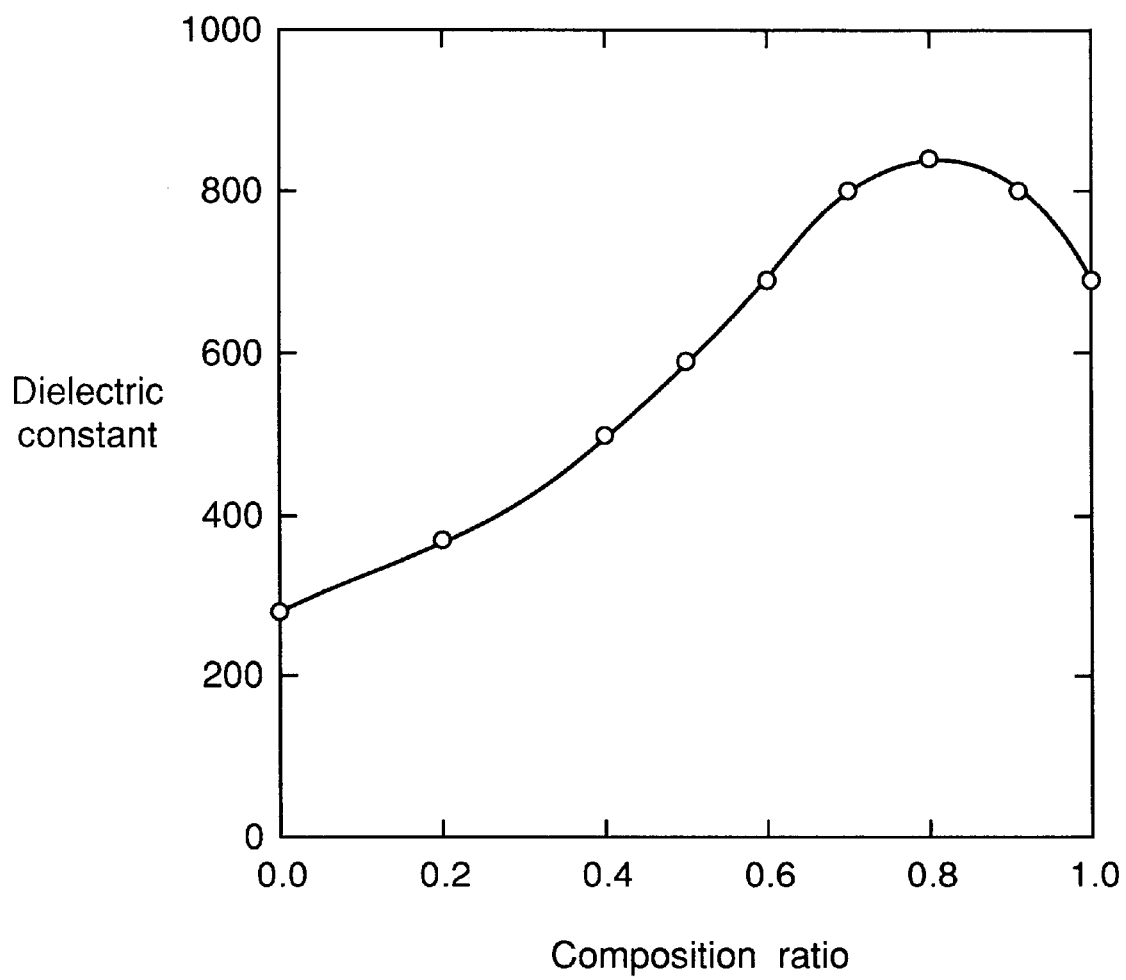
FIG. 14 is a graph of dielectric constant plotted against mol ratio X of a solid solution $(BaTiO_3)_x(SrTiO_3)_{1-x}$ in the eleventh embodiment of the invention.

Further, FIG. 14 shows dielectric constant plotted against mol ratio X of a solid solution (BaTiO$_3$)$_x$(SrTiO$_3$)$_{1-x}$. It is found that the dielectric constant has a maximum around ratio x=0.8. This is considered that because a difference of lattice constant is small between the platinum and the dielectric film, it can be avoided to form a layer having a low dielectric constant. As explained above, by controlling a ratio c in a solid solution of two metallic oxides Perovskite structures, lattice matching can be realized. Then, it can be avoided to form a layer having a low dielectric constant, and a dielectric film 415 having a high dielectric constant can be prepared stably.

Though a solid solution (BaTiO$_3$)$_x$(SrTiO$_3$)$_{1-x}$ is adopted in this embodiment, similar advantages can be obtained by performing lattice matching by controlling a ratio in a solid solution of two or more oxides having Perovskite structure such as PbTiO$_3$ or CaTiO$_3$.

Figure 15:
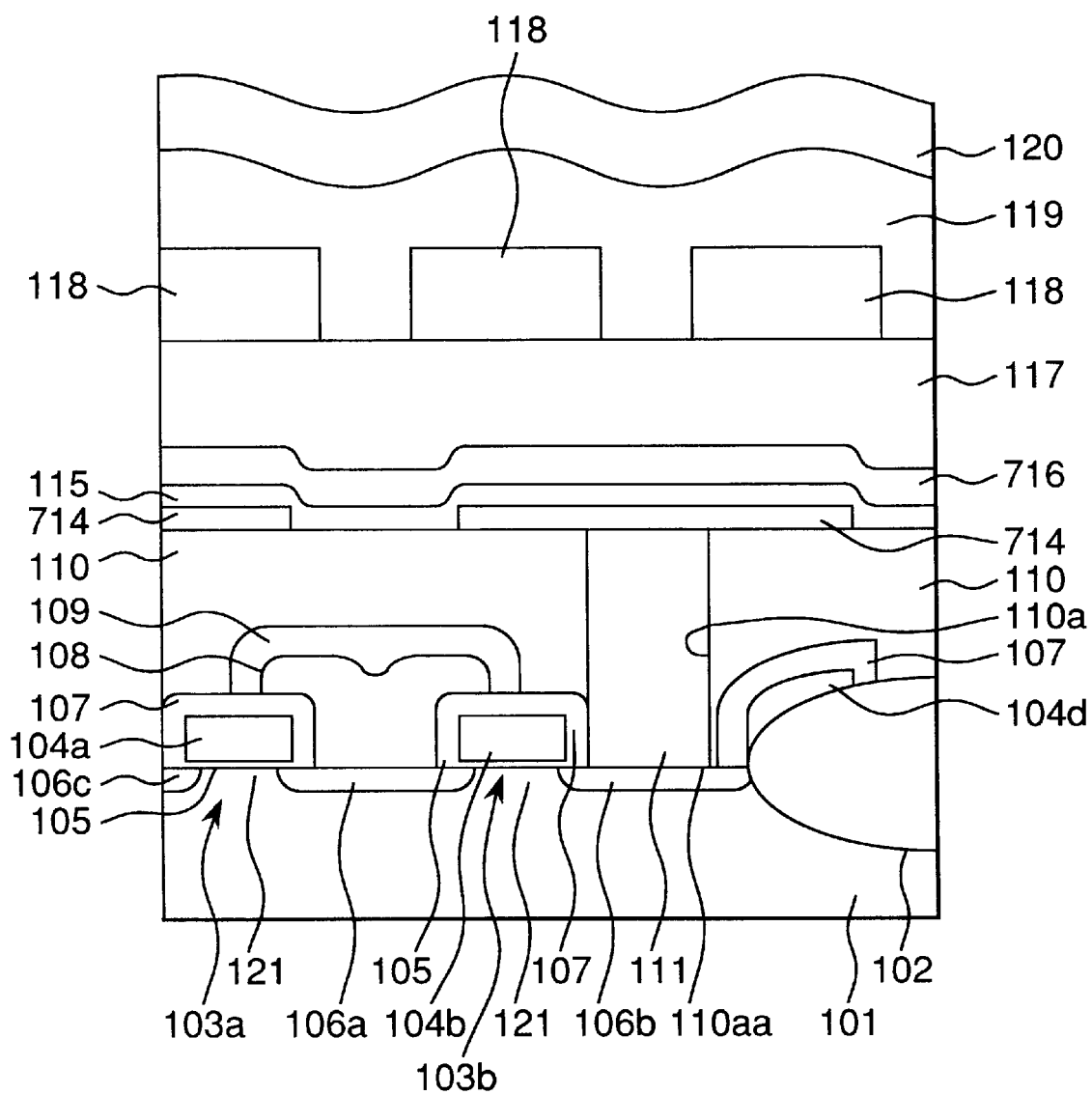
FIG. 15 is a partial sectional view of a dynamic random access memory of a twelfth embodiment of the invention.

FIG. 15 shows a partial sectional view of a dynamic random access memory of a twelfth embodiment of the invention. The device of this embodiment is similar to that of the ninth embodiment with the exception of aspects of the thin film capacitor discussed below. A dielectric film 115 is formed on a lower electrode 714, and an upper electrode 716 is formed on the dielectric film 115. The dielectric film 115 is made of SrTiO$_3$ of about 200 nm thickness with a reactive sputtering process. The electrodes 714 and 716 are made of platinum including a small amount of rhenium. Dependence of lattice constant of the electrodes and dielectric constant of the capacitor on the amount of rhenium as 0, 5, 10 and 15 weight percent (wt %) are observed.

Figure 16:
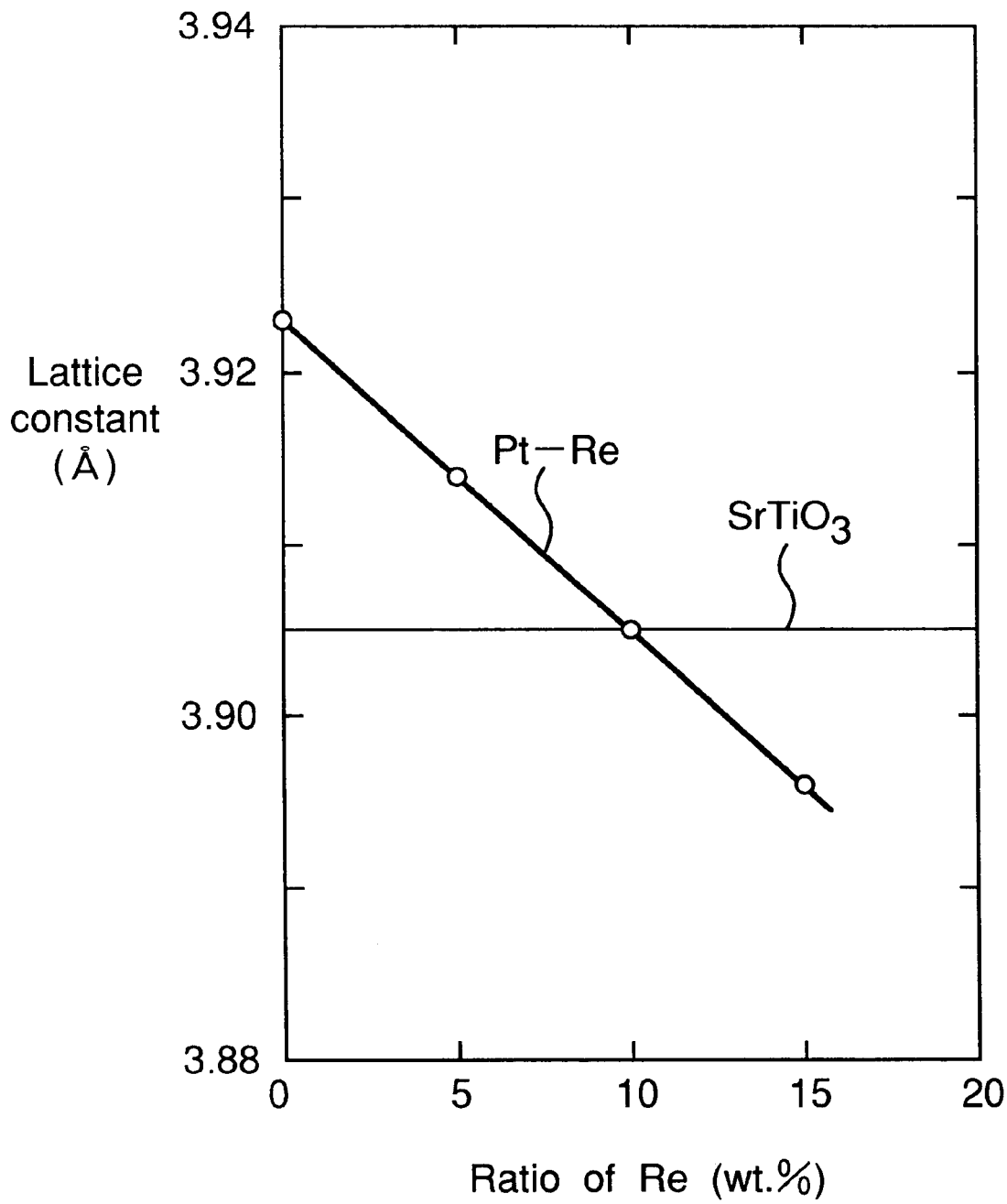
FIG. 16 is a graph of lattice constant plotted against addition ratio of rhenium in the twelfth embodiment of the invention.

FIG. 16 shows lattice constant of the electrodes plotted against addition ratio of rhenium. The lattice constant increases monotonously with increasing addition ration of rhenium. When rhenium is added by 10 wt %, the lattice constant of 3.90 Å equivalent to that of SrTiO$_3$.

Figure 17:
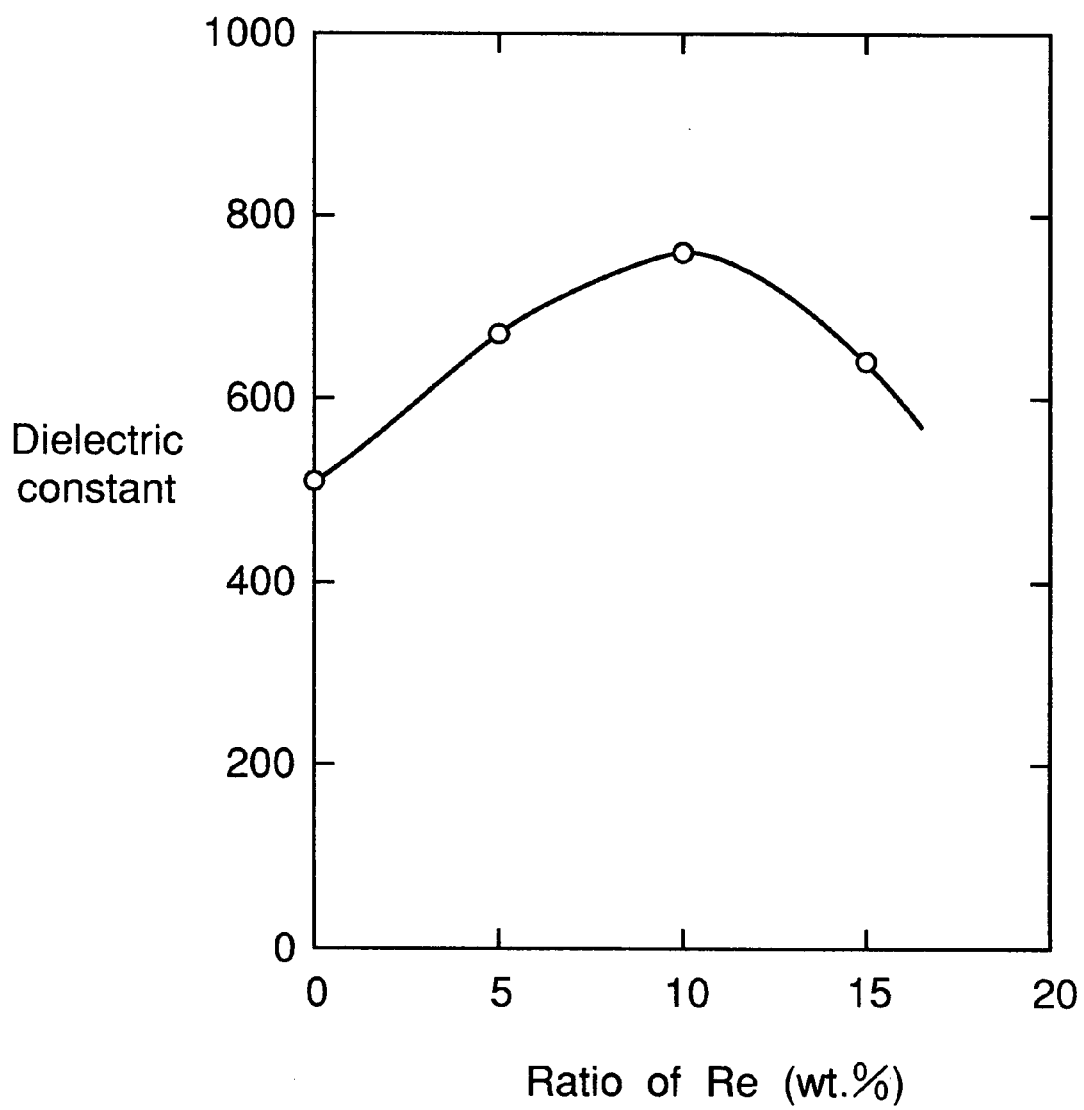
FIG. 17 is a graph of dielectric constant plotted against addition ratio of rhenium in the twelfth embodiment of the invention.

FIG. 17 shows dielectric constant of the thin film capacitor plotted against addition ratio of rhenium. When rhenium is added by 10 wt %, the dielectric constant has a maximum value. This is considered that because a difference between the lattice constants of the electrodes and of the dielectric film is small, a layer having a small dielectric constant is prevented to be generated.

As explained above, by controlling a ratio in a solid solution, lattice matching can be realized between the dielectric constant and one of the electrodes, it can be avoided to form a layer having a low dielectric constant, and a dielectric film having a high dielectric constant can be prepared stably. Thus, a soft error ratio of the semiconductor device can be reduced.

Though a solid solution of platinum with rhenium is used for the electrodes in this embodiment, similar advantages can be obtained by performing lattice matching by adding a metallic element to a metal having a face centered lattice structure.

Figure 18:
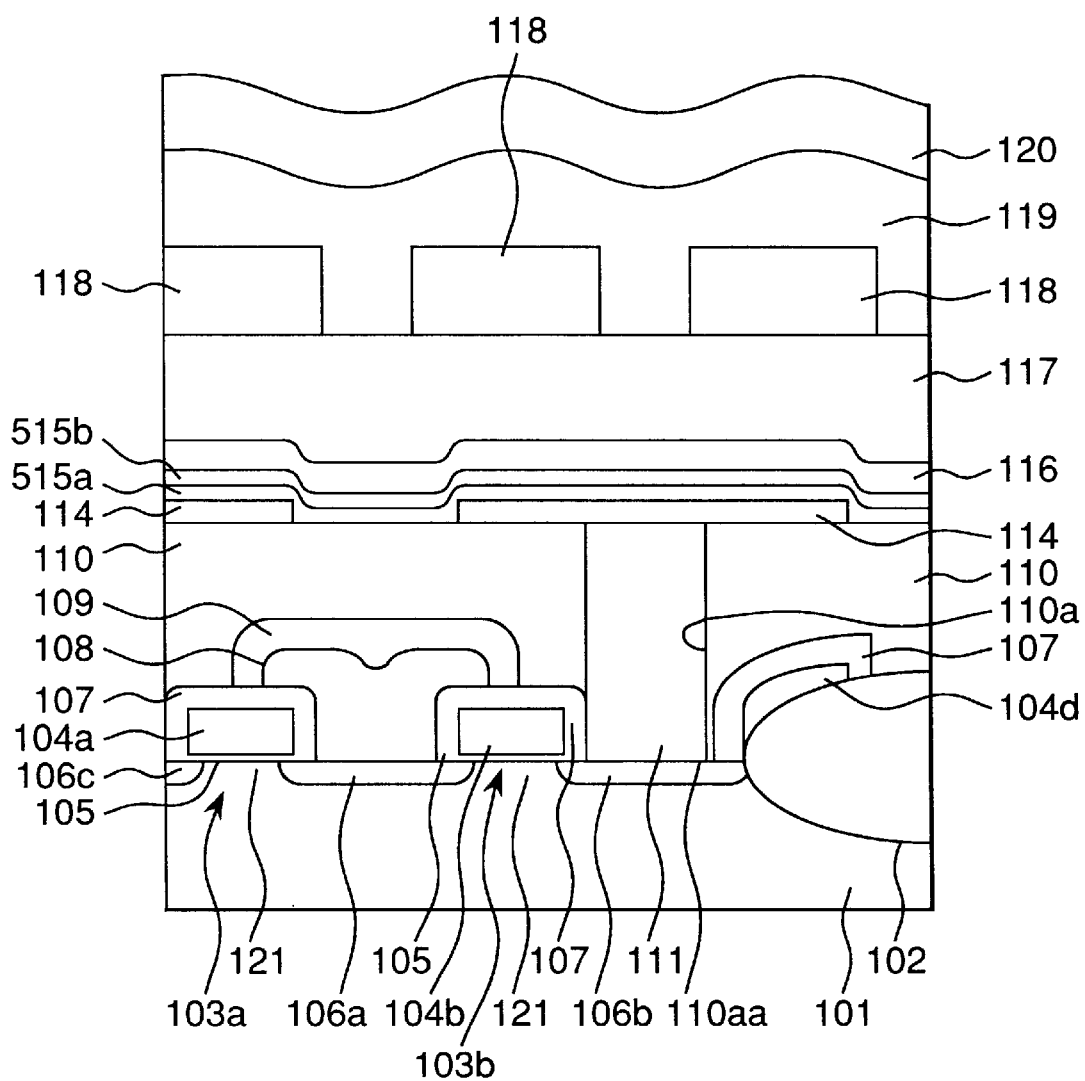
FIG. 18 is a partial sectional view of a dynamic random access memory of a thirteenth embodiment of the invention.

FIG. 18 shows a partial sectional view of a dynamic random access memory of a thirteenth embodiment of the invention. The device of this embodiment is similar to that of the tenth embodiment with the exception that the thin film capacitor includes a two-layer dielectric film 515a, 515b. A first dielectric layer 515a is formed on a lower platinum electrode 114, and an upper platinum electrode 116 is formed on the second dielectric layer 515b. The first dielectric layer 515a is made of a solid solution (BaTiO$_3$)$_{0.6}$ (SrTiO$_3$)$_{0.4}$ of about 20 nm thickness with a reactive sputtering process. Then, the second dielectric layer 515b made of BaTiO$_3$ of about 200 nm thickness is formed on the first one 515a with a reactive sputtering process.

This is considered that a layer having a small dielectric constant is prevented to be generated because the dielectric film having dielectric constants intermediate between those of the electrodes, in contrast to a thin film capacitor including a BaTiO$_3$ dielectric film which has a large mismatching of dielectric constant at the interface between the dielectric film and the electrode.

Though a solid solution (BaTiO$_3$)$_x$(SrTiO$_3$)$_{1-x}$ film and a BaTiO$_3$ film are used in this embodiment, this technique is advantageous for preventing a film having a low dielectric constant due to lattice mismatching between a metallic electrode having a face centered lattice structure and a Perovskite type oxide such as SrTiO$_3$, BaTiO$_3$ or PbTiO$_3$.

Figure 19:
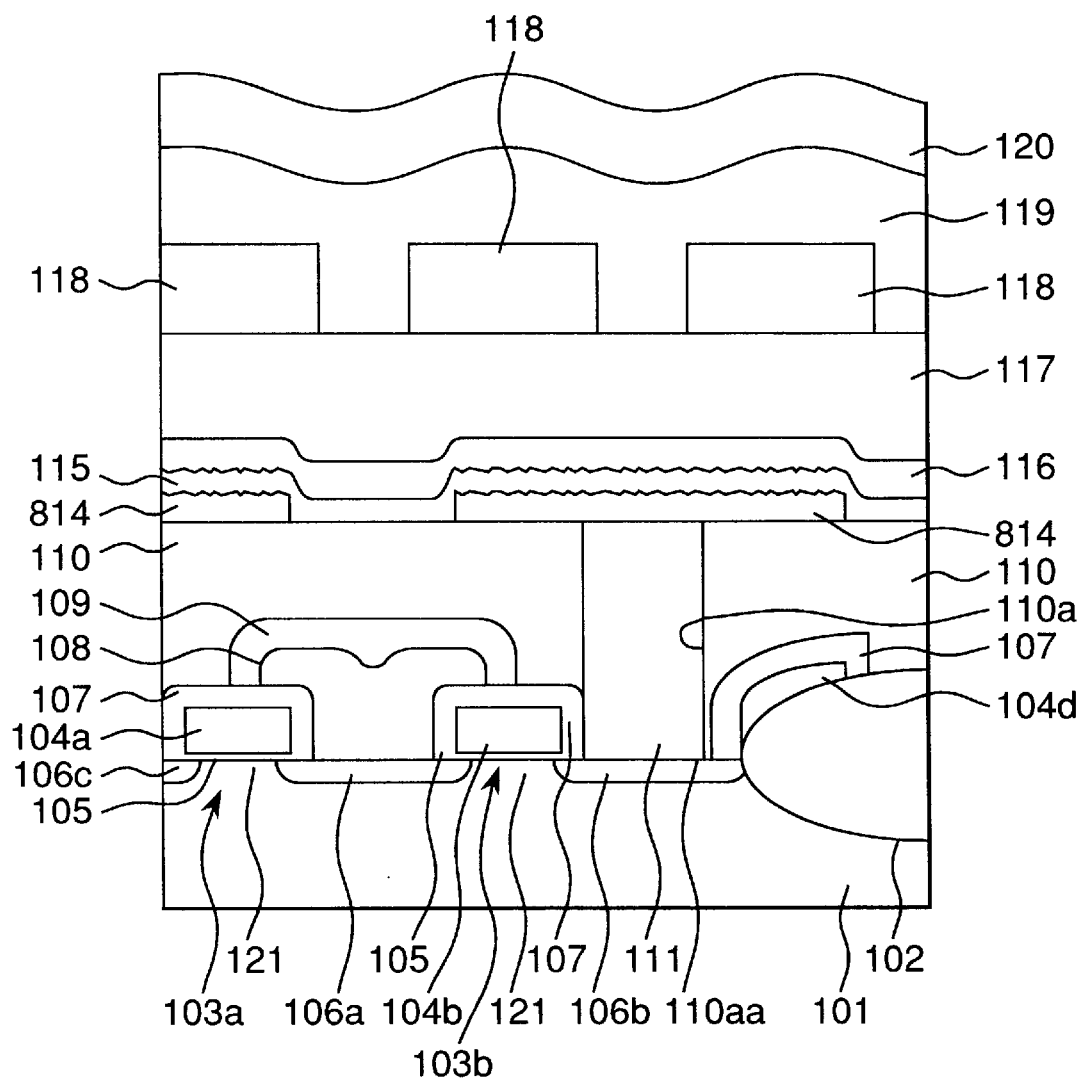
FIG. 19 is a partial sectional view of a dynamic random access memory of a fourteenth embodiment of the invention.

FIG. 19 shows a partial sectional view of a dynamic random access memory of a fourteenth embodiment of the invention. The device of this embodiment is similar to that of the ninth embodiment with the exception of aspects of the thin film capacitor discussed below. The thin film capacitor comprises lower and upper electrodes 814 and 116 prepared with sputtering and a dielectric film 115 between them. The lower electrode 814 made of platinum or platinum added with 1 at % of aluminum is formed to have a rough surface with sputtering. The thickness thereof is preferably between 60 and 300 nm, and it is 100 nm in this example. The dielectric film 115 of a BaTiO$_3$ film is prepared with a reactive sputtering process. The upper electrode 116 is made of platinum. In this embodiment, an effective area of the capacitor is increased, and the capacitance can be increased.

Figure 20:
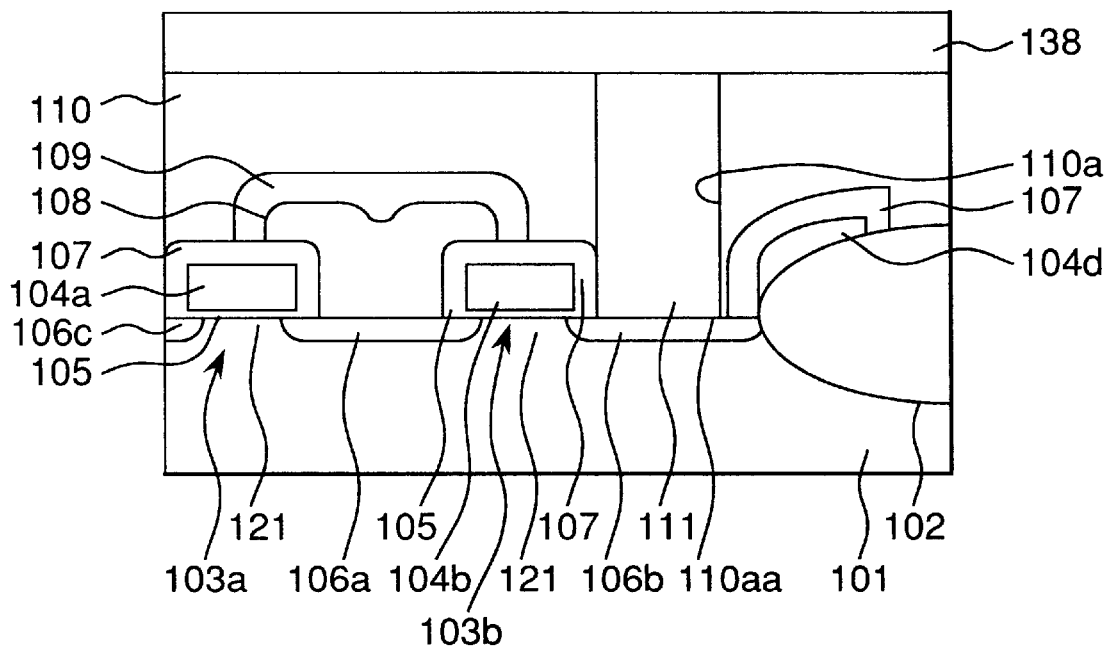
FIG. 20 is a partial sectional view of the dynamic random access memory in a first step in the fourteenth embodiment of the invention.

A fabrication method of this device is explained with reference to FIGS. 20–23. As shown in FIG. 20, in order to form the lower electrode 814, a thin film 138 made of platinum or platinum added with 1 at % of aluminum is formed on the first layer insulation film 110 with sputtering. Processes before forming the first insulation film 110 are the same as prior art method, and they are not explained here. The thickness of the thin film 138 is preferably between 60 and 300 nm, and it is 100 nm in this example.

Figure 21:
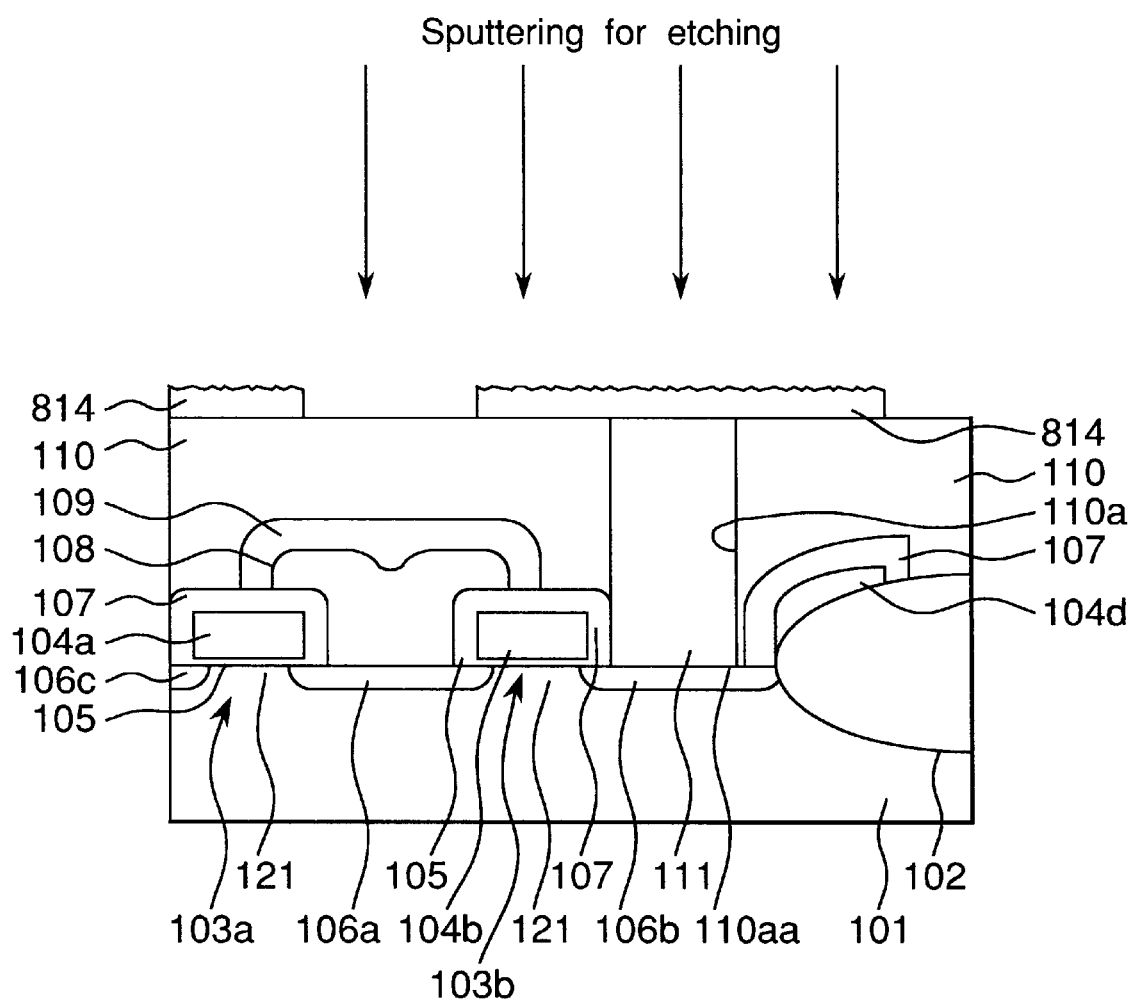
FIG. 21 is a partial sectional view of the dynamic random access memory in a second step in the fourteenth embodiment of the invention.
Figure 22:
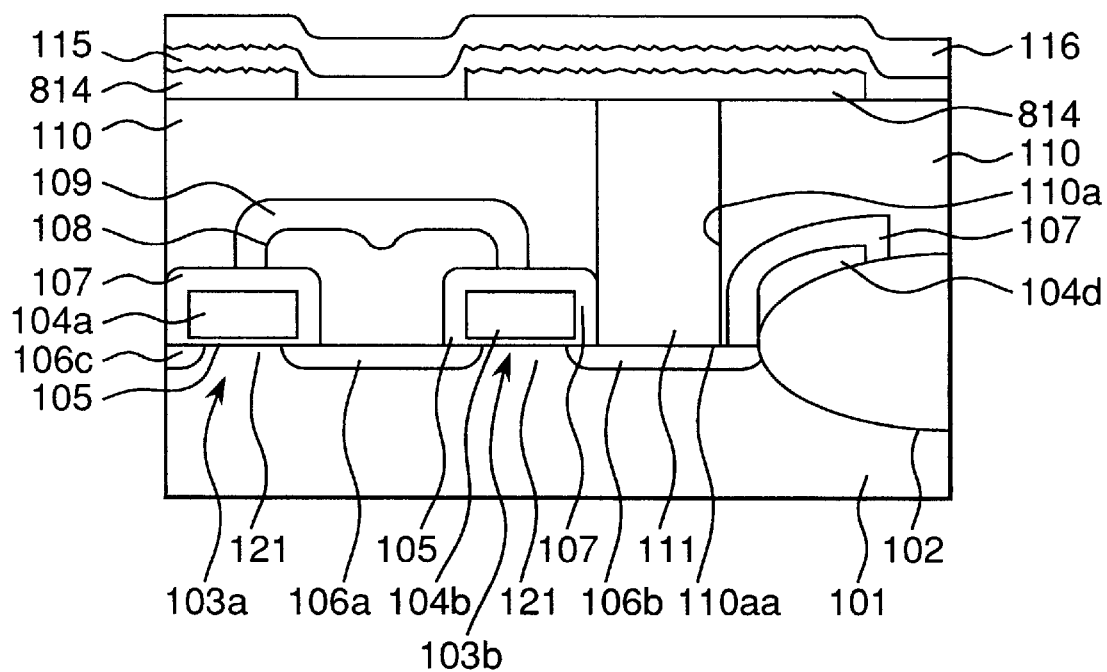
FIG. 22 is a partial sectional view of the dynamic random access memory in a third step in the fourteenth embodiment of the invention.

Then, as shown in FIG. 21, the thin film 138 is subjected to patterning in correspondence to the lower electrodes 814. Then, the surface of the film are roughened. When the thin film 138 is made of platinum, sputtering etching is performed in an argon atmosphere. On the other hand, when the thin film 138 is made of platinum added with 1 at % of aluminum, after aluminum oxide is segregated at grain boundaries by thermal annealing in an oxygen environment, only the aluminum oxide is removed by reactive ion etching Next, as shown in FIG. 22, the lower electrode 814 having the roughened surface is covered with the dielectric film 115 of BaTiO$^3$ with reactive sputtering process, and a platinum film as the upper electrode 116 is formed with sputtering on the dielectric film 115.

Figure 23:
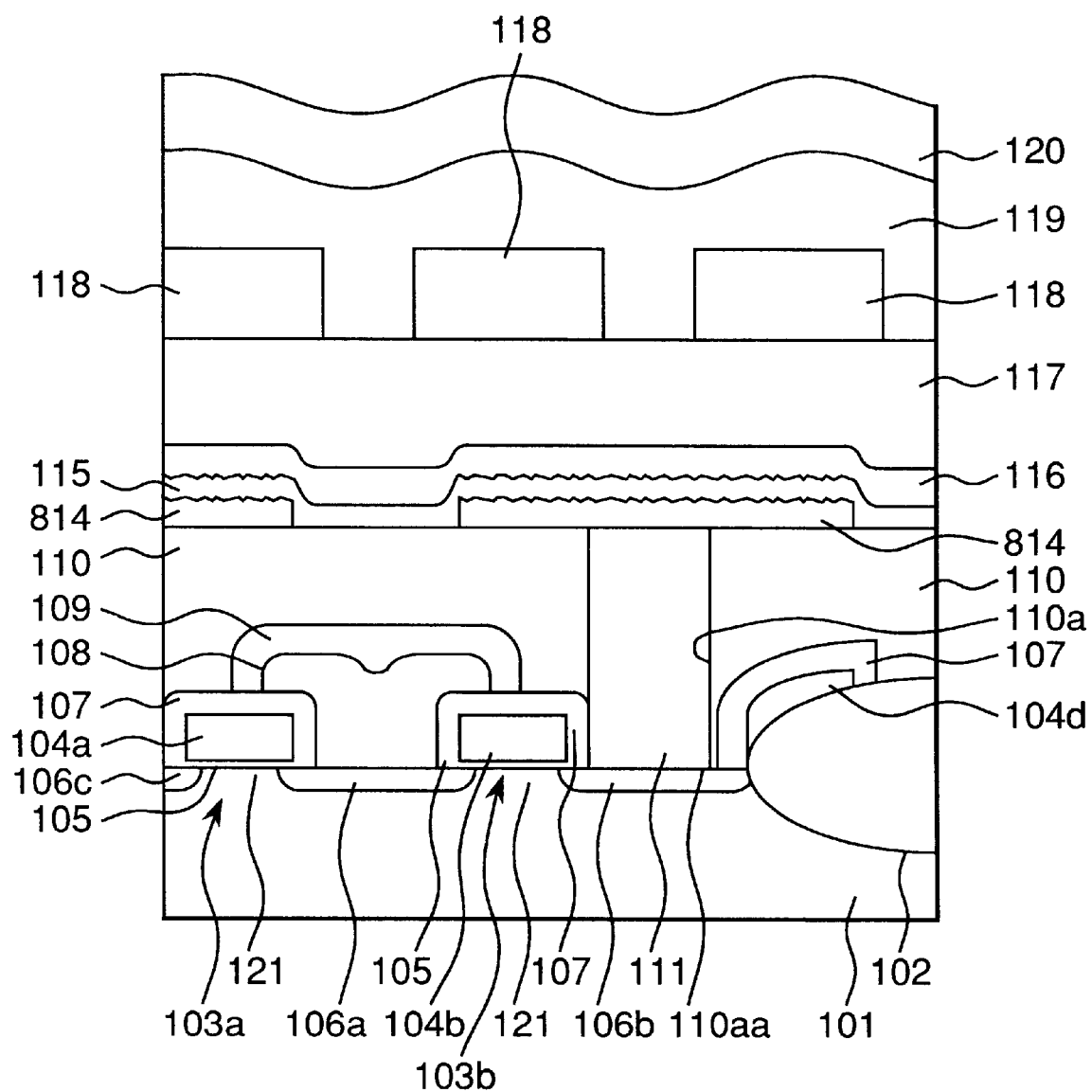
FIG. 23 is a partial sectional view of the dynamic random access memory in a fourth step in the fourteenth embodiment of the invention.

Then, as shown in FIG. 23, a structure above the thin film capacitor is formed similarly in a prior art method for forming metallization lines.

A dynamic random access memory prepared as explained above increases the capacitance of the thin film capacitor by about 10 at % for the thin film capacitor including rhodium electrode subjected to sputtering etching, and by about 20 at % for the thin film capacitor including rhodium-aluminum electrode subjected to restrictive ion etching. The surface of such lower electrode has unevenness of about 30 nm after roughening processing. Thus, it is considered that an increase in capacitance is ascribed to an increase in effective area of the capacitor. Properties such as leak current are not different so much from those of prior art devices.

In the fabrication method of this embodiment, only by adding a simple process for roughening the surface of the lower electrode, the effective area of the capacitor can be increased, and a semiconductor device having good capacitor characteristics can be provided.

Figure 24:
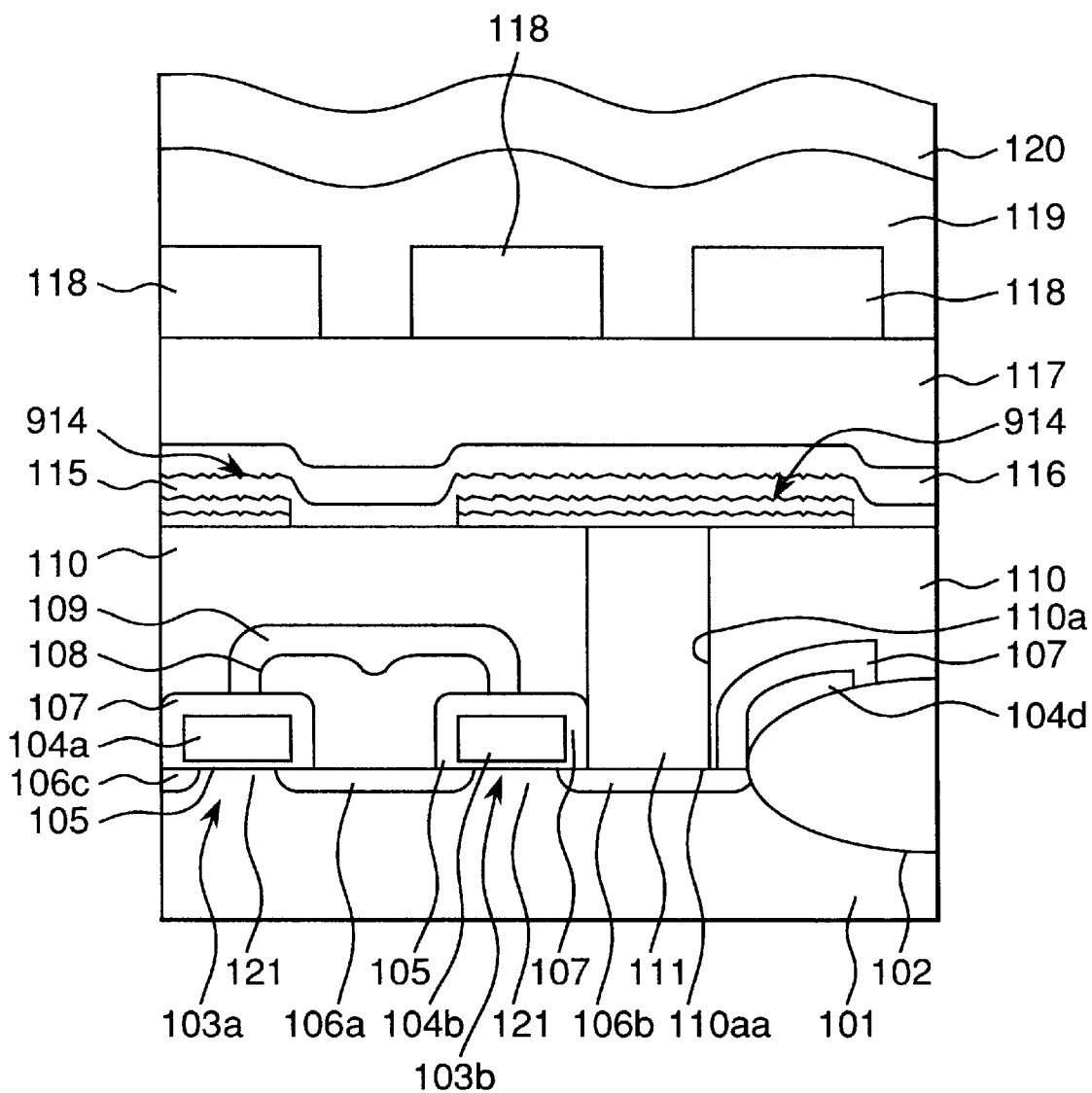
FIG. 24 is a partial sectional view of a dynamic random access memory of a fifteenth embodiment of the invention.

FIG. 24 shows a partial sectional view of a dynamic random access memory of a fifteenth embodiment of the invention. The device of this embodiment is similar to that of the fourteenth embodiment. The thin film capacitor comprises lower and upper electrodes 914 and 116 prepared with sputtering and a dielectric film 115 between them. The lower electrode 914 has a two-layer structure made of a titanium film and a platinum film formed successively. After the lower electrode 914 is formed, its surface is roughened by heat treatment in an oxygen environment. The dielectric film 115 of a BaTiO$_3$ film is prepared with a reactive sputtering process. Then, a platinum upper electrode 116 is formed on the dielectric film 115. In this embodiment, an effective area of the capacitor is increased by the roughened surface, and the capacitance can be increased.

Figure 25:
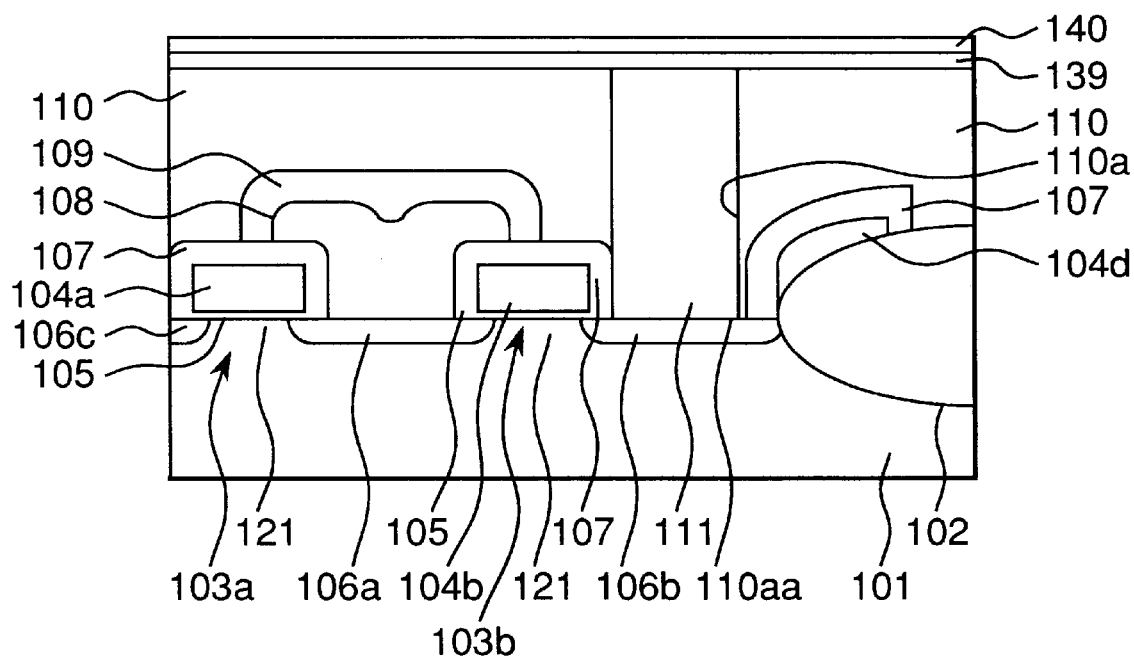
FIG. 25 is a partial sectional view of the dynamic random access memory in a first step in the fifteenth embodiment of the invention.
Figure 26:
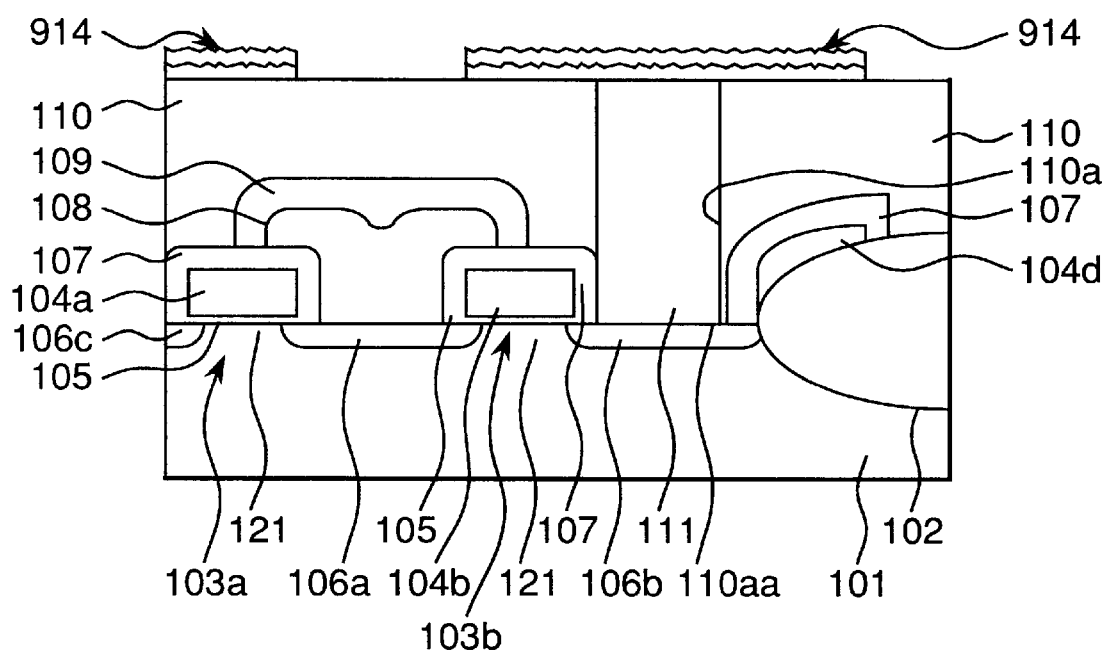
FIG. 26 is a partial sectional view of the dynamic random access memory in a second step in the fifteenth embodiment of the invention.
Figure 27:
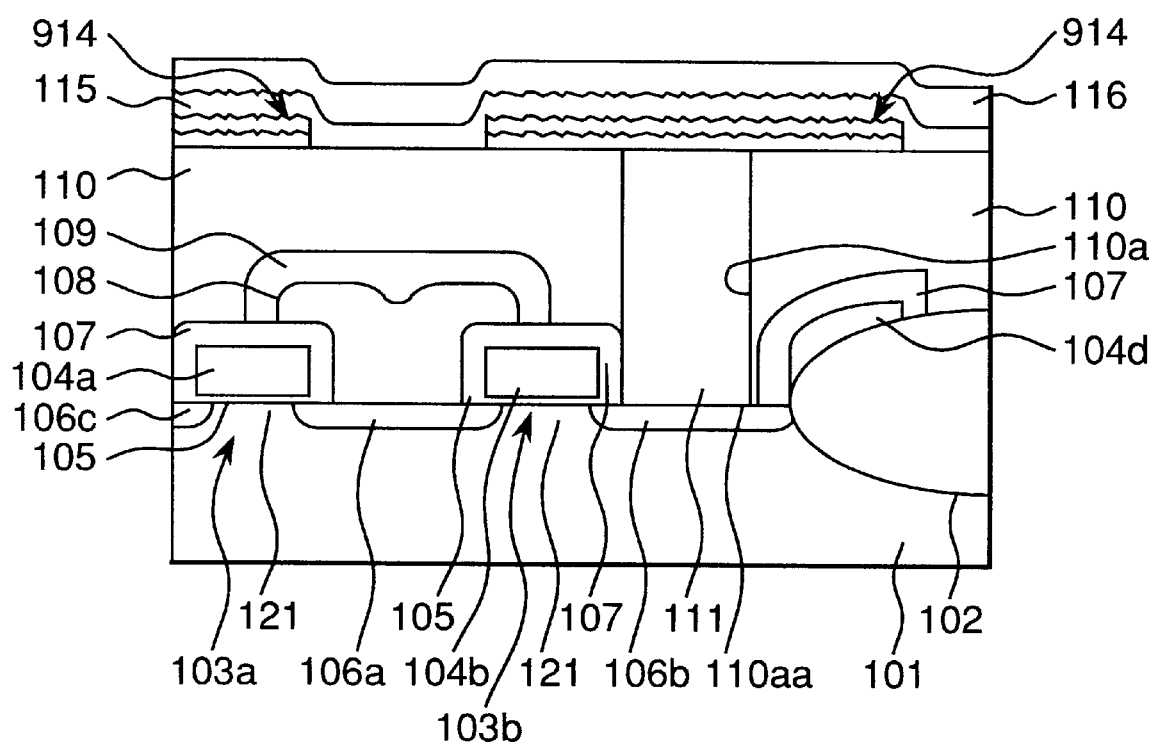
FIG. 27 is a partial sectional view of the dynamic random access memory in a third step in the fifteenth embodiment of the invention.
Figure 28:
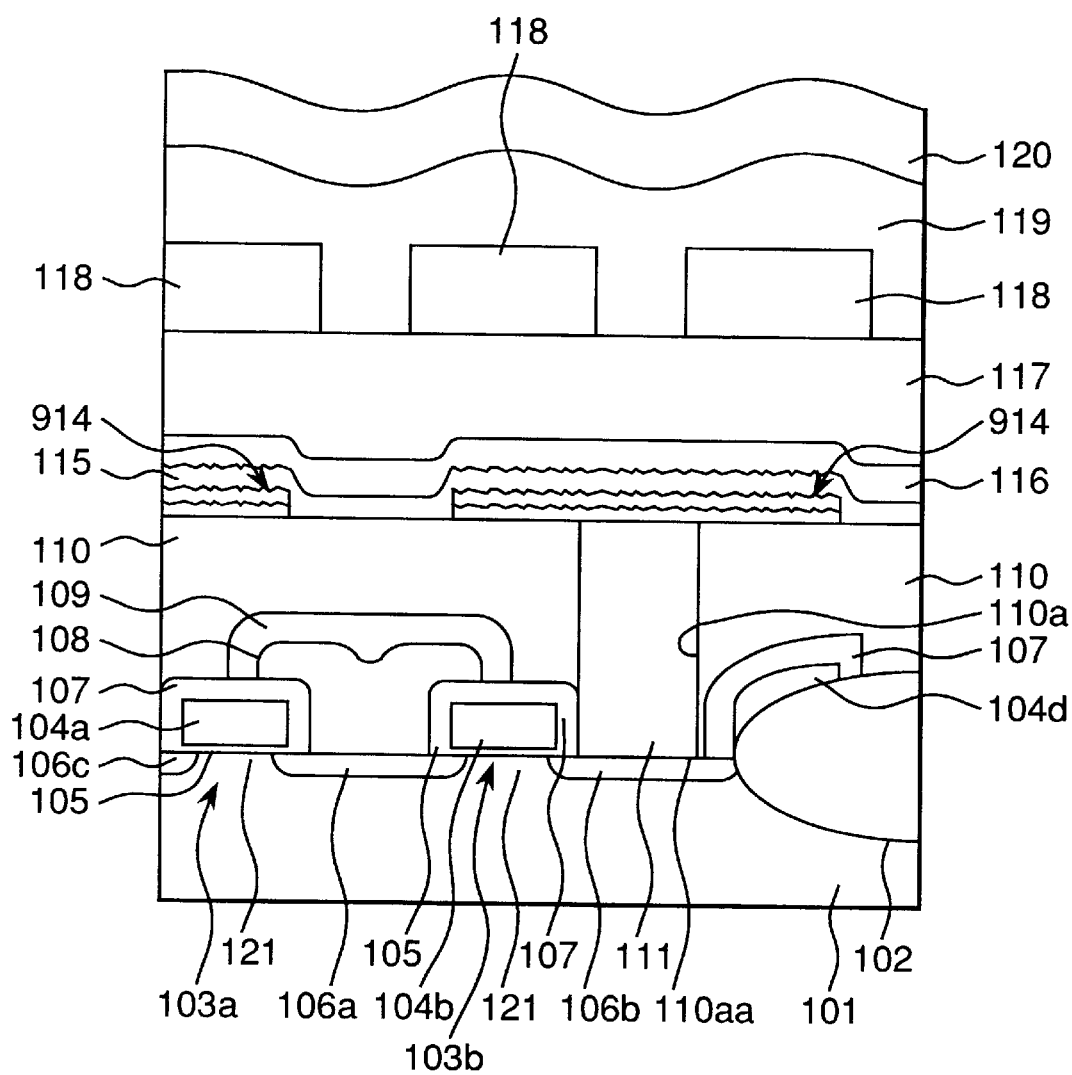
FIG. 28 is a partial sectional view of the dynamic random access memory in a fourth step in the fifteenth embodiment of the invention.

A fabrication method of the device of the fifteenth embodiment is explained with reference to FIGS. 25–28. As shown in FIG. 25, in order to form the lower electrode 914, a titanium thin film 139 and a platinum thin film 140 are deposited with sputtering successively on the first layer insulation film 110. The thickness of the titanium film 139 is preferably between 10 and 50 nm, while that of the platinum film 140 is preferably between 50 and 200 nm. Then, as shown in FIG. 26, the films 139 and 140 are subjected to patterning to form a lower electrode 914. Then, the lower electrode 914 is subjected to heat treatment in oxygen environment between 400 and 900° C., to form unevenness of about 100 nm on the surface of the lower electrode 914. Next, as shown in FIG. 27, a BaTiO$_3$ film is formed as the dielectric film 115 with reactive sputtering on the lower electrode 914 and the first layer insulation film 110. Further, a platinum film is formed thereon as the upper electrode 116 with sputtering. Then, as shown in FIG. 28, the second film insulation film 117, the first aluminum metallization layers 118, the protection layer 119 and the second aluminum metallization layers 120 are formed successively as in the prior art device.

By fabricating the DRAM as described above, a capacitance can be increased. The capacitance increases by 10–30 at % depending on heat treatment temperature according to heat treatment for roughening in a temperature range between 600–900° C., and this is ascribed to increase in unevenness of the lower electrode.

The lower electrode 914 is evaluated with Auger electronic spectroscopy. It is found that platinum and titanium are mixed almost homogeneously to form a single layer. Further, X ray analysis shows that titanium exists in the film as titanium oxide. Then, the appearance of the unevenness caused by heat treatment is ascribed to interdiffusion between titanium and platinum and oxidation of titanium. As to properties such as leak current are not so different from the counterparts of the prior art devices.

Similarly to the previous embodiment, in the fabrication method of this embodiment, only by adding a simple process for roughening the surface of the lower electrode, the effective area of the capacitor can be increased, and a semiconductor device having good capacitor characteristics can be provided.

Figure 29:
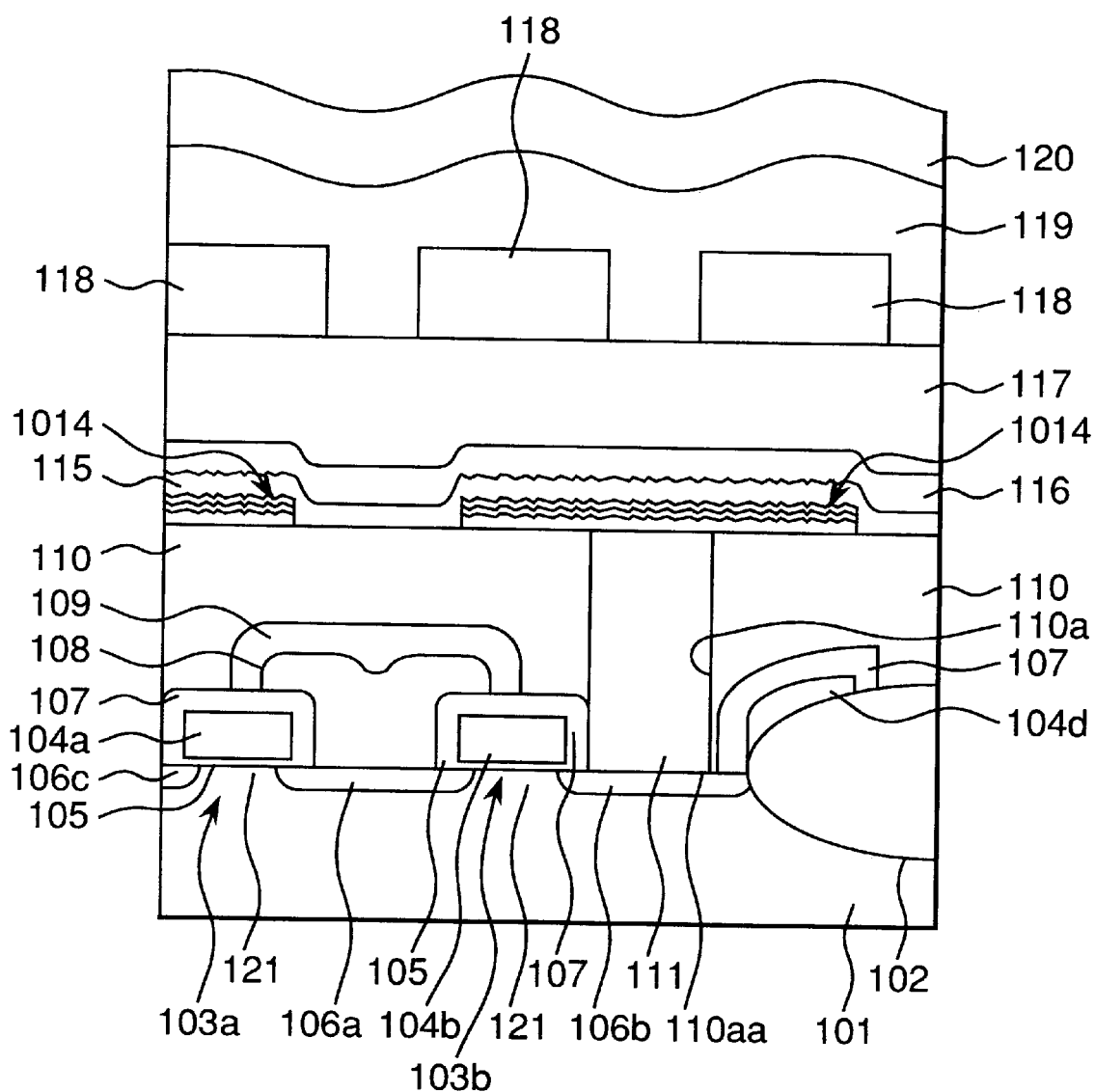
FIG. 29 is a partial sectional view of a dynamic random access memory of a sixteenth embodiment of the invention.

FIG. 29 shows a partial sectional view of a dynamic random access memory of a sixteenth embodiment of the invention. The device of this embodiment is similar to that of the fourteenth embodiment. The thin film capacitor comprises lower and upper electrodes 1014 and 116 and a dielectric film 115 between them. The lower electrode 1014 has a layered structure made of a polycrystalline silicon film, a titanium nitride film and a platinum film formed successively. After the lower electrode 1014 is formed, its surface is roughened by heat treatment in an oxygen environment. The dielectric film 115 of a BaTiO$_3$ film is prepared with a reactive sputtering process. Then, a platinum upper electrode 116 is formed on the dielectric film 115. In this embodiment, an effective area of the capacitor is increased by the roughened surface, and the capacitance can be increased.

Figure 30:
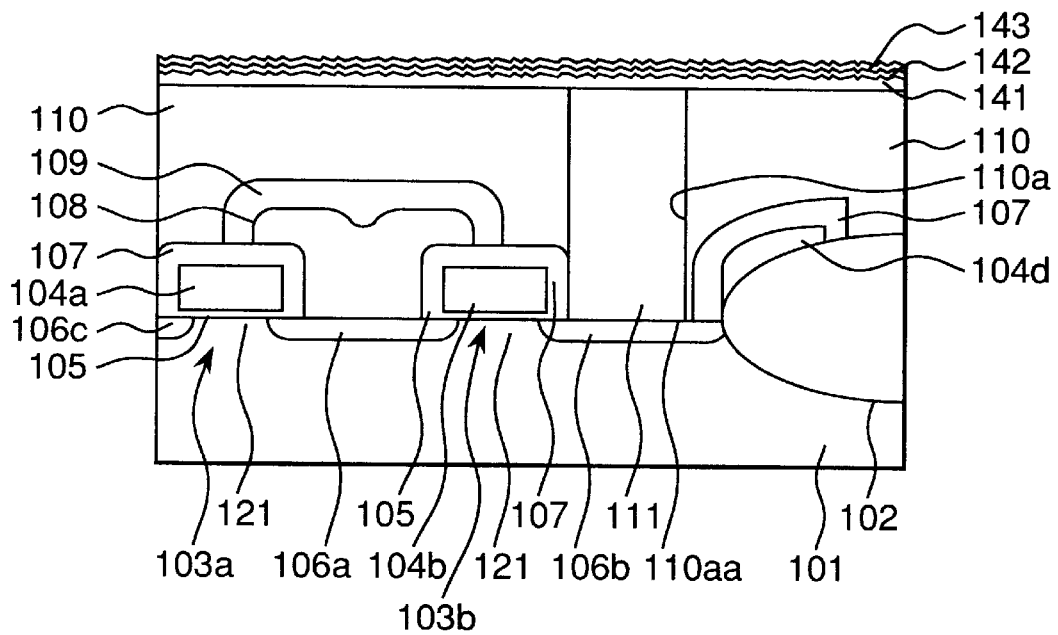
FIG. 30 is a partial sectional view of the dynamic random access memory in a first step in the sixteenth embodiment of the invention.
Figure 31:
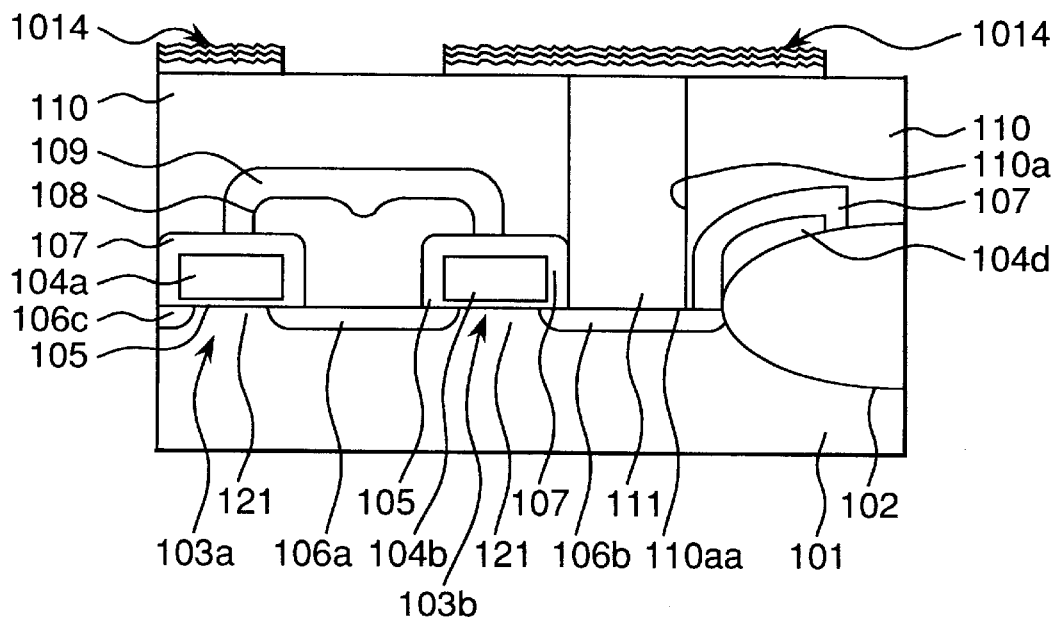
FIG. 31 is a partial sectional view of the dynamic random access memory in a second step in the sixteenth embodiment of the invention.
Figure 32:
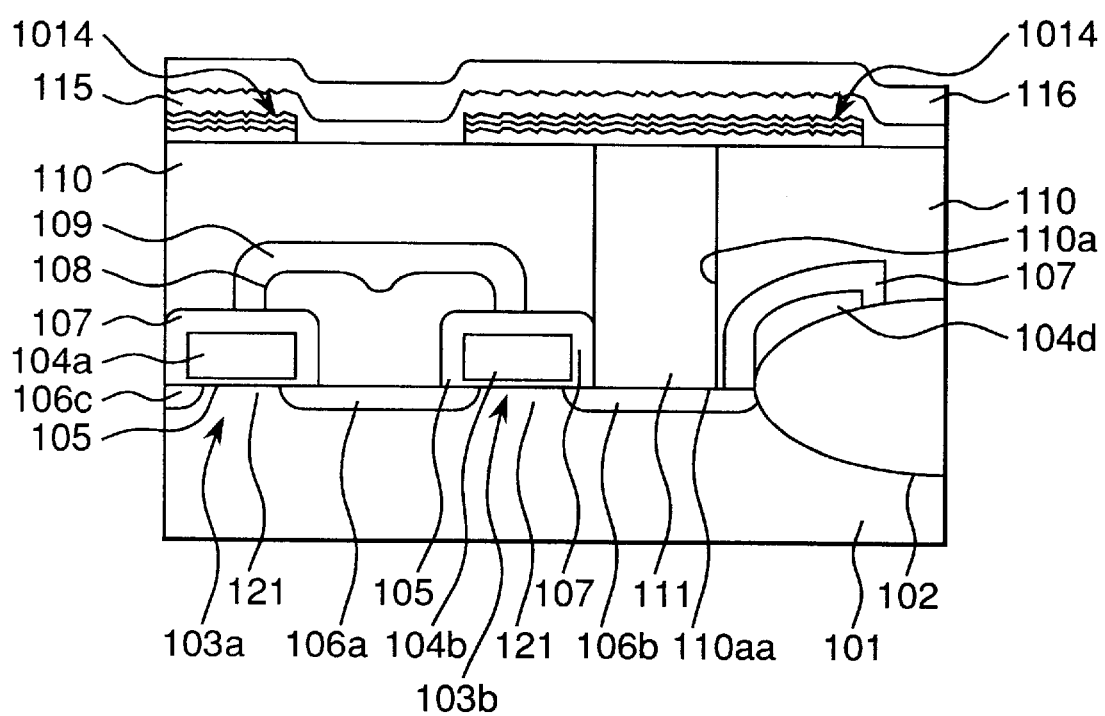
FIG. 32 is a partial sectional view of the dynamic random access memory in a third step in the sixteenth embodiment of the invention.
Figure 33:
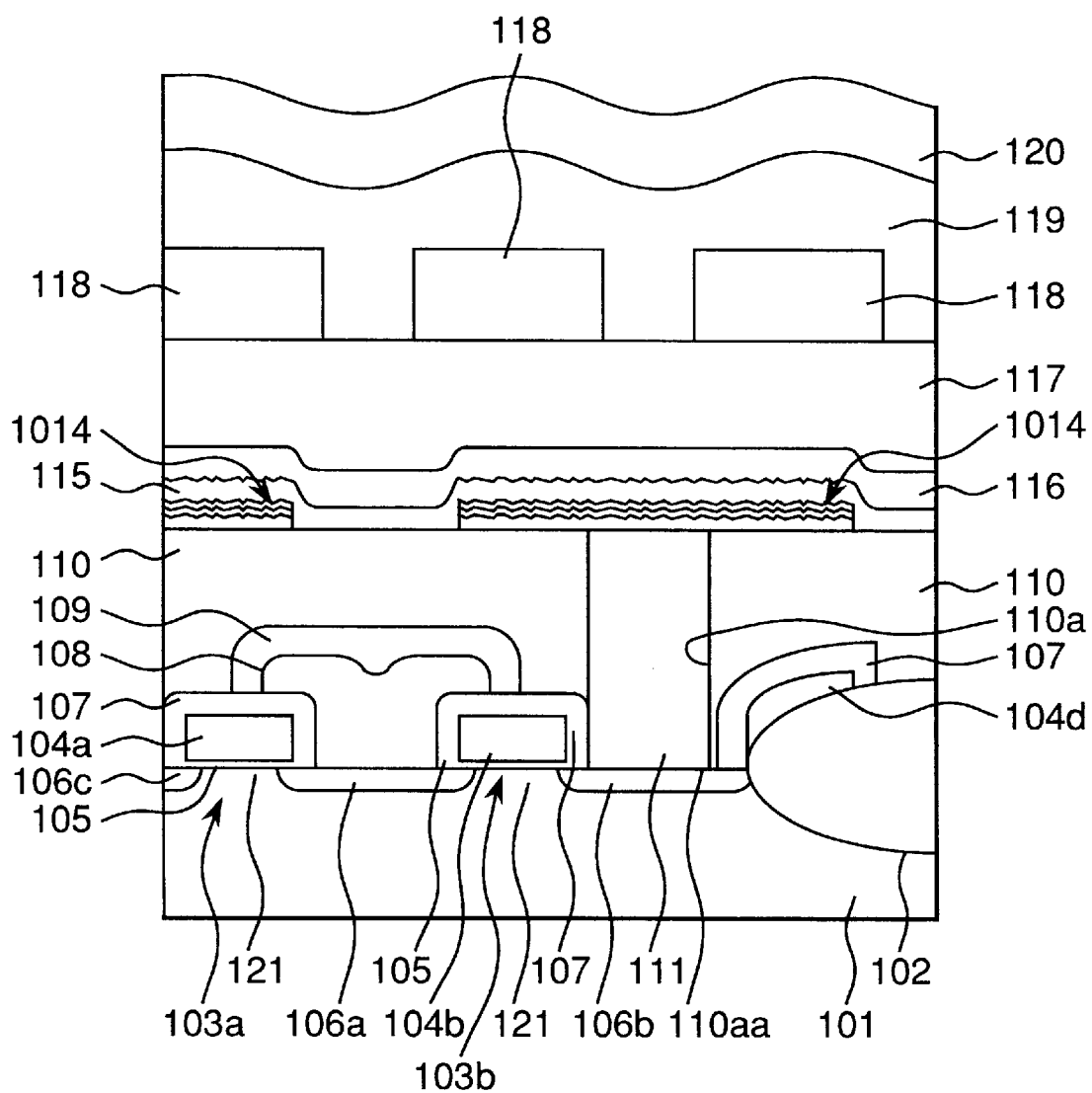
FIG. 33 is a partial sectional view of the dynamic random access memory in a fourth step in the sixteenth embodiment of the invention.

A fabrication method of the device of the sixteenth embodiment is explained with reference to FIGS. 30–33. As shown in FIG. 30, in order to form the lower electrode 1014, a phosphor doped polycrystalline silicon film 141 is deposited on the first layer insulation formed with a chemical vapor deposition process. When the polycrystalline silicon film 141 is formed, the substrate temperature is kept at about 580° C. so as to form of unevenness of about 30 nm on the surface of the film 141. Then, a titanium nitride film 142 of thickness of 20 to 100 nm and a platinum film 143 of thickness of 30 to 200 nm are deposited with sputtering successively on the polycrystalline silicon film 141. Then, as shown in FIG. 31, the films 141–143 are subjected to patterning to form a lower electrode 1014. Next, as shown in FIG. 32, a BaTiO$_3$ film is formed as the dielectric film 115 with reactive sputtering on the lower electrode 1014 and the first layer insulation film 110. Further, a platinum film is formed thereon as the upper electrode 116 with sputtering. Then, as shown in FIG. 33, the second film insulation film 117, the first aluminum metallization layers 118, the protection layer 119 and the second aluminum metallization layers 120 are formed successively as in the prior art device.

By fabricating the DRAM as described above, a capacitance can be increased. The capacitance increases by about 20 at % according to heat treatment for roughening in a temperature range between 600–900° C., and this is ascribed to increase in unevenness of the lower electrode. As to properties such as leak current are not so different from the counterparts of the prior art devices.

Similarly to the previous embodiment, in the fabrication method of this embodiment, only by adding a simple process for roughening the surface of the polycrystalline silicon film for the lower electrode, the effective area of the capacitor can be increased, and a semiconductor device having good capacitor characteristics can be provided.

Figure 34:
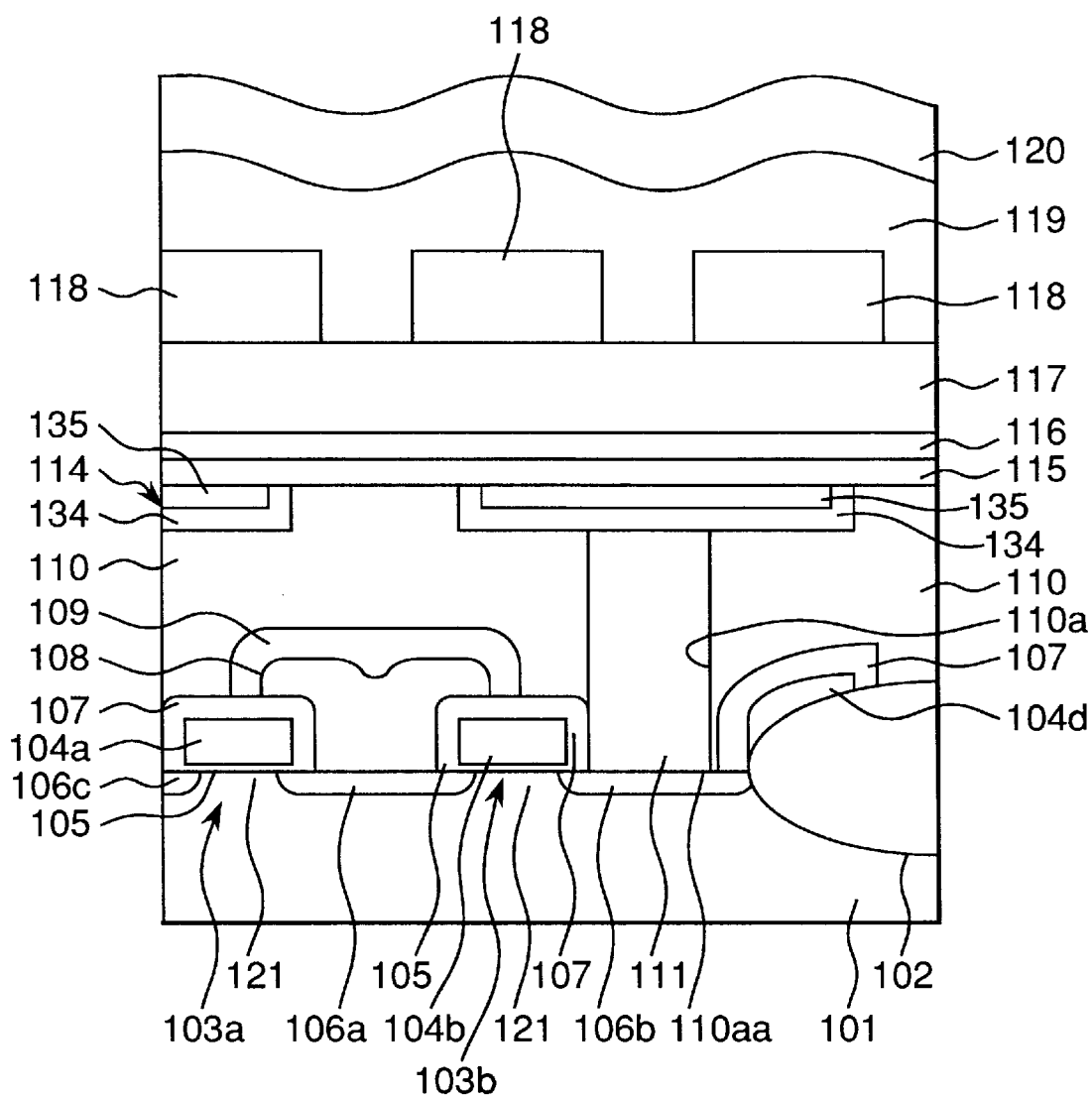
FIG. 34 is a partial sectional view of a dynamic random access memory of a seventeenth embodiment of the invention.

FIG. 34 is a partial sectional view of a dynamic random access memory (DRAM) of a seventeenth embodiment of the invention. A structure below a thin film capacitor is similar to a prior art structure. That is, a semiconductor substrate 101, a field oxide film 102, transfer transistors 103a and 103b, gate electrodes 104a, 104b, 104d, a gate insulating films 105, channel regions 106a, 106b, oxide films 107, a bit line 108 and an insulator film 109 are the same or similar to the counterparts of the device in the first embodiment shown in FIG. 1.

Then, a first layer insulation film 110 is formed to cover the insulator films 107, 109. A contact hole 110a is formed on the N type impurity region 106b through the first layer insulation film 110. The contact hole 110a has a first portion 110aa in contact electrically with the semiconductor substrate 101 and a second portion 110ab having an area wider than the portion 110aa. A plug 111 is formed in the first portion 110aa of the contact hole 110a.

Next, a thin film capacitor is formed. First, a lower electrode 114 is formed on the plug 111 in the second portion 110ab. The lower electrode 114 has of a barrier metal layer 134 for preventing diffusion of silicon from the plug 111 and a platinum layer 135 formed on the barrier metal layer 134. Then, a dielectric film 115 made of a material having a high dielectric constant such as SrTiO$_3$ or BaTiO$_3$ and an upper electrode 216 made of platinum or the like are formed successively on the lower electrode 114 and the layer insulation film 110.

A structure above the thin film capacitor is similar to that shown in FIG. 1. A second layer insulation film 117 is formed on the upper electrode 116. Next, first aluminum metallization layers 118, a protection film 119 and an aluminum metallization layers 120 are formed successively similarly to a prior art structure.

In the structure of the device described above, a stray capacitance between adjacent cells can be reduced by forming the lower electrode 114 consisting of the barrier metal layer 134 for preventing diffusion of silicon from the plug 111 and the platinum layer 135 formed on the barrier metal layer 134. That is, because the barrier metal layer 134 prevents diffusion of silicon atoms from the plug 111, the capacitance of the thin film capacitor is not affected.

Figure 35:
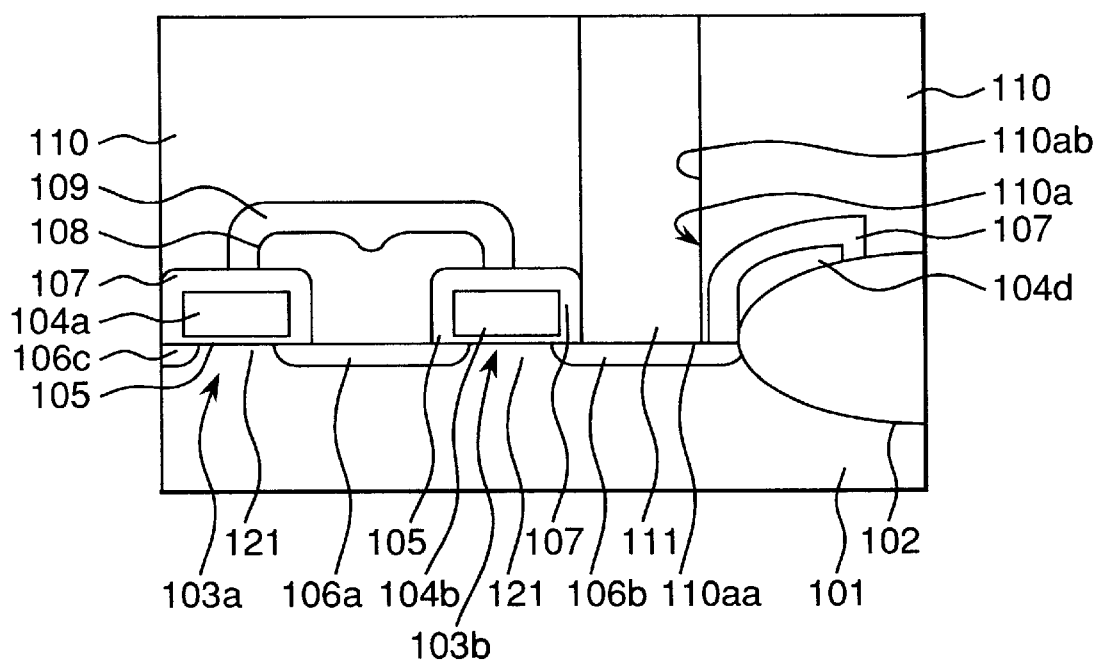
FIG. 35 is a partial sectional view of the dynamic random access memory in a first step in the seventeenth embodiment of the invention.
Figure 36:
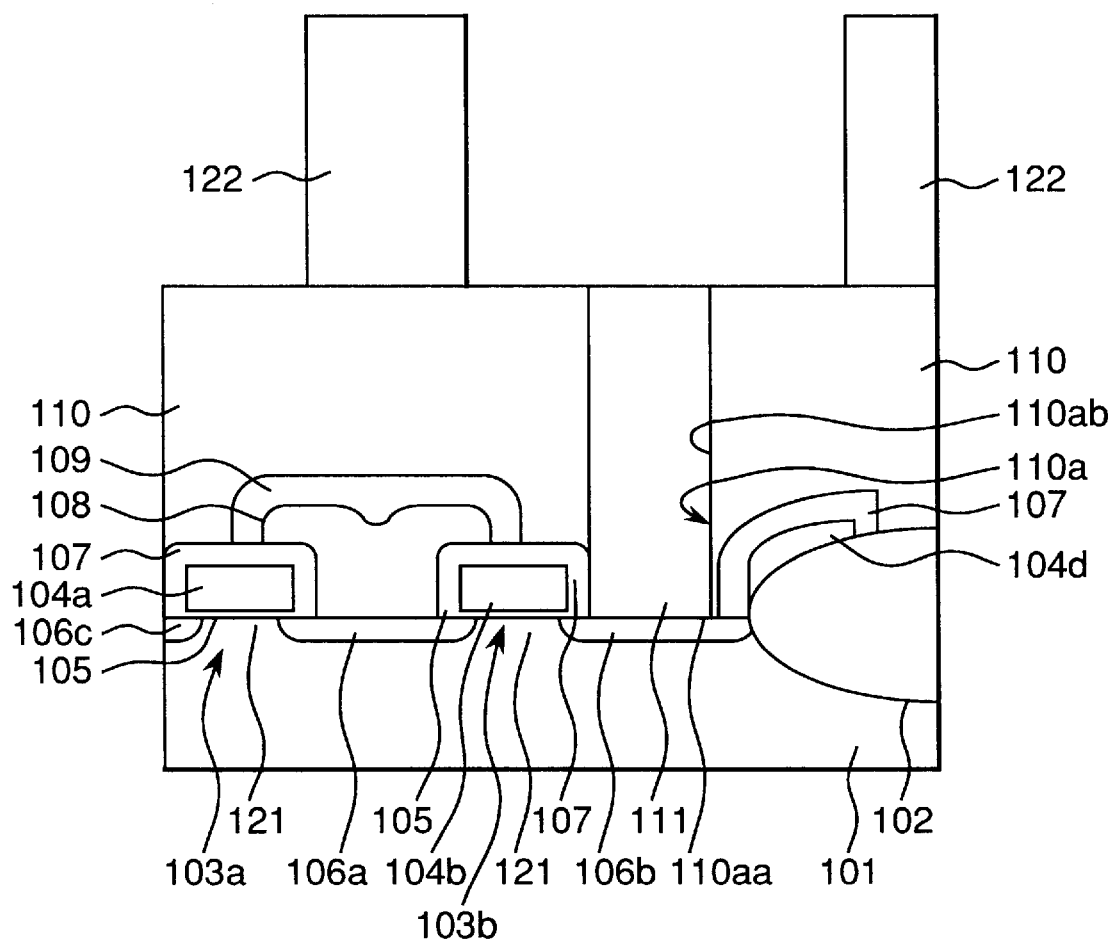
FIG. 36 is a partial sectional view of the dynamic random access memory in a second step in the seventeenth embodiment of the invention.
Figure 37:
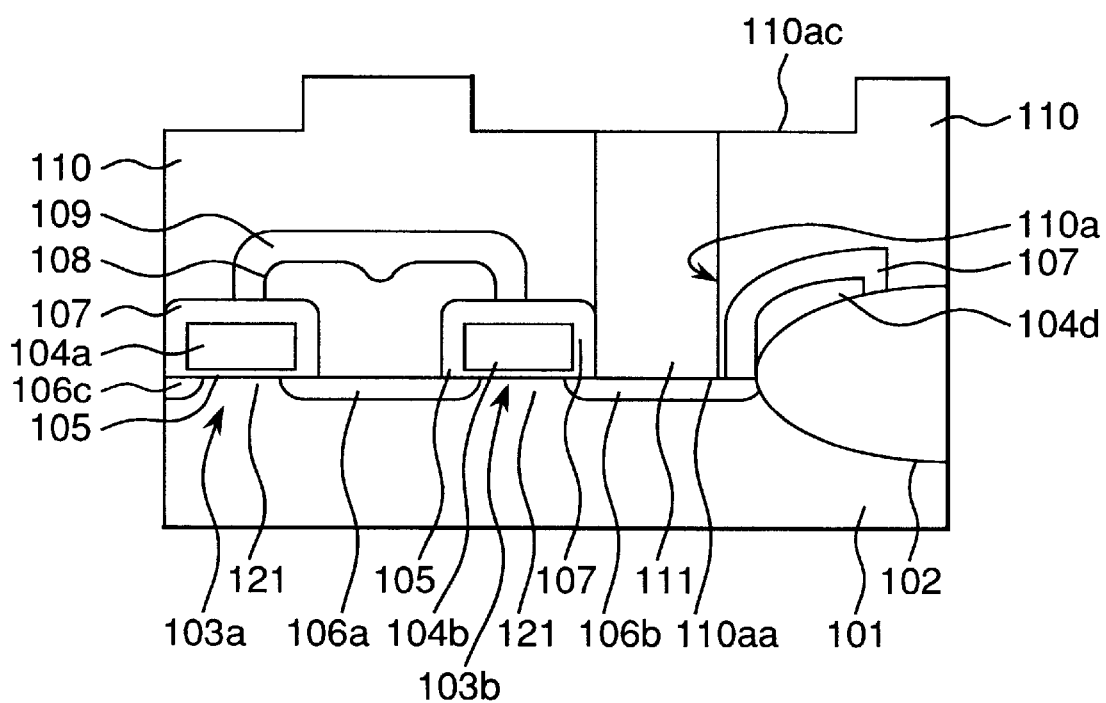
FIG. 37 is a partial sectional view of the dynamic random access memory in a third step in the seventeenth embodiment of the invention.
Figure 38:
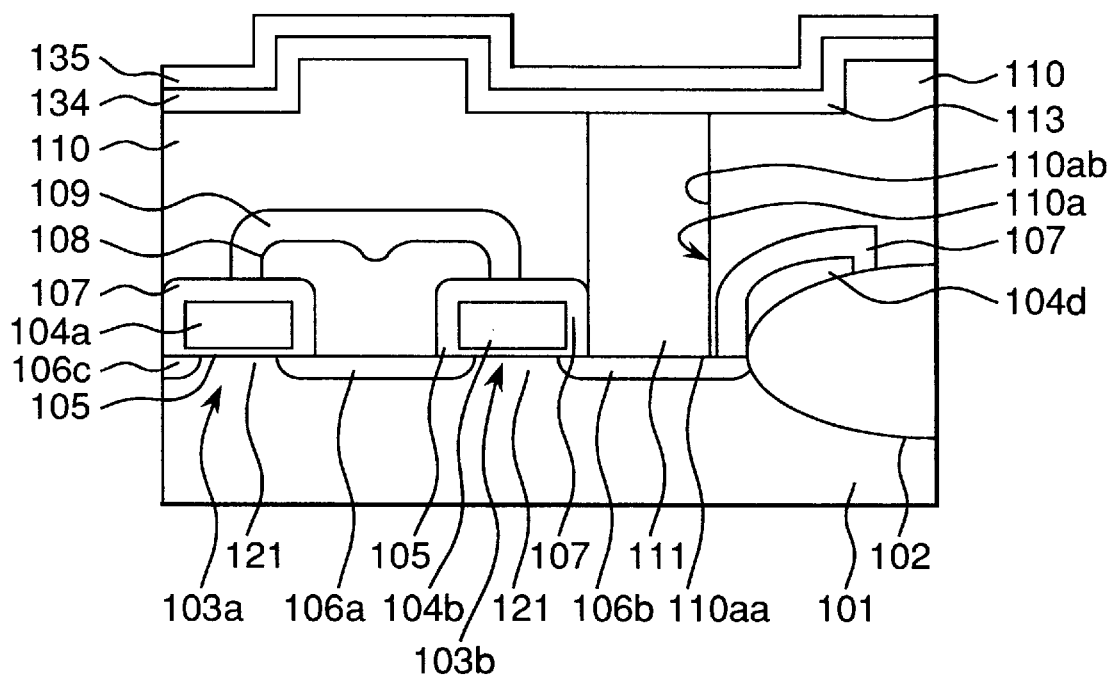
FIG. 38 is a partial sectional view of the dynamic random access memory in a fourth step in the seventeenth embodiment of the invention.
Figure 39:
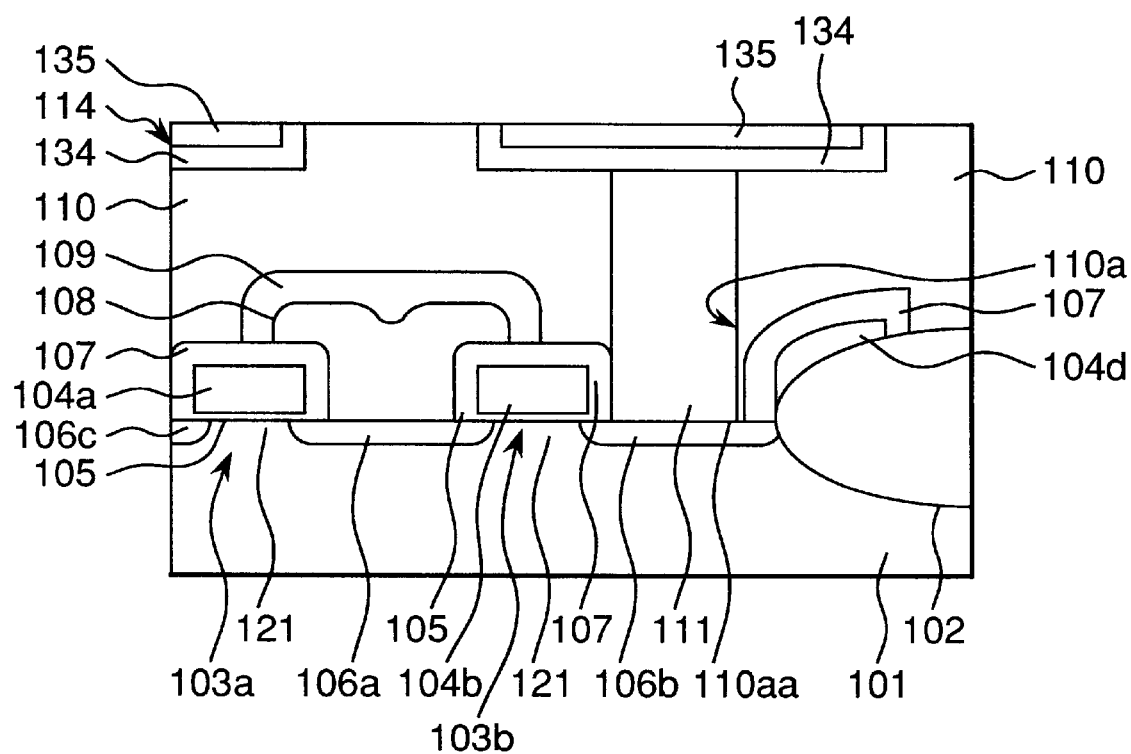
FIG. 39 is a partial sectional view of the dynamic random access memory in a fifth step in the seventeenth embodiment of the invention.
Figure 40:
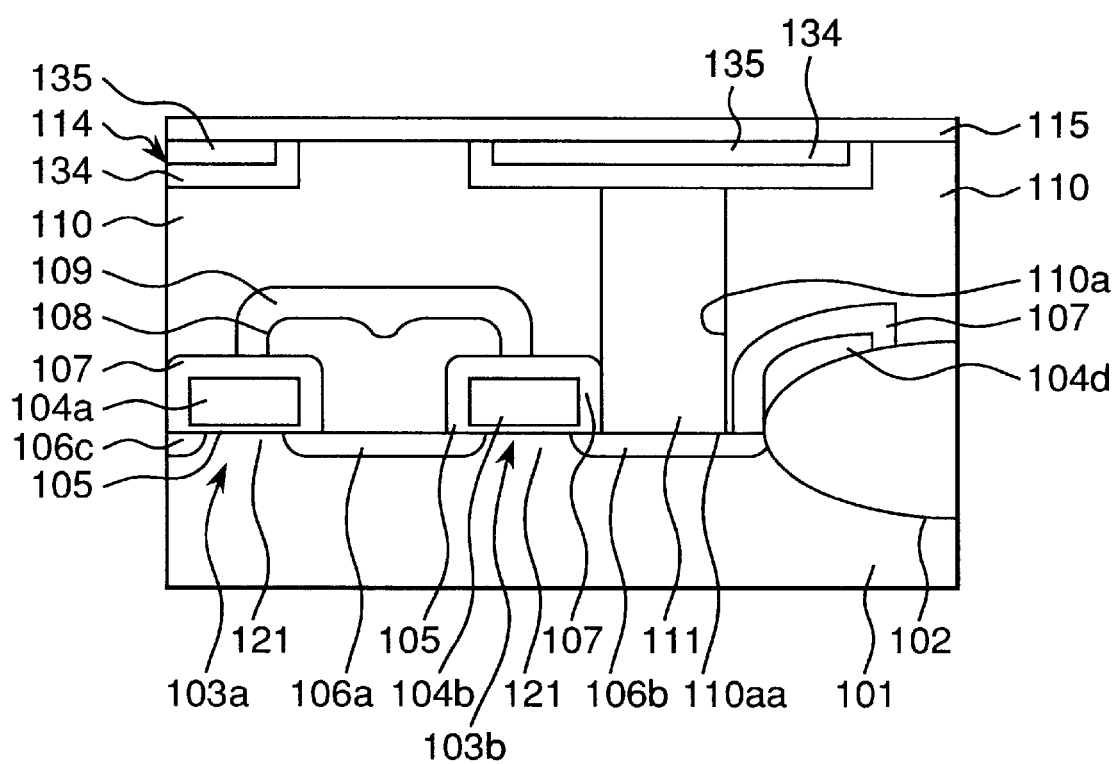
FIG. 40 is a partial sectional view of the dynamic random access memory in a sixth step in the seventeenth embodiment of the invention.
Figure 41:
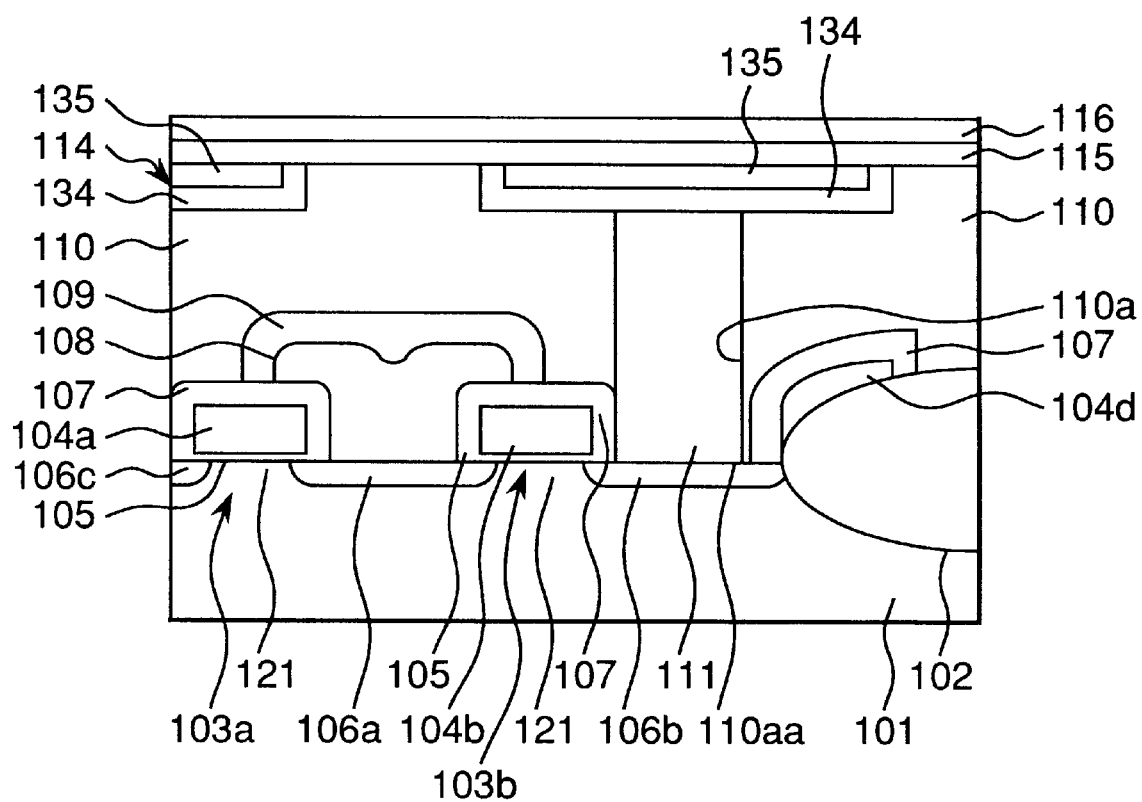
FIG. 41 is a partial sectional view of the dynamic random access memory in a seventh step in the seventeenth embodiment of the invention.

A fabrication method of the device of the seventeenth embodiment is explained with reference to FIGS. 35–41. As shown in FIG. 35, processes until the first layer insulation layer 110 and the plug 111 are formed are the same as those of the prior art device. Next, as shown in FIG. 36, a resist pattern 122 is formed on the first layer insulation film 110, and the first layer insulation film 110 and the plug 111 are etched by using the resist pattern 122 as a mask, to form a cavity 110ab for embedding the lower electrode 114, as shown in FIG. 37. Then, as shown in FIG. 38, a titanium layer 134 is deposited with sputtering on the cavity 110ab and the layer insulation film 110. The thickness of the titanium layer 134 is preferably between 30 and 100 nm. Further, a platinum layer 135 is deposited with sputtering on the titanium layer 134. The thickness of the platinum layer 135 is preferably between 200 and 500 nm. Then, as shown in FIG. 39, the titanium layer 134 and the platinum layer 135 are etched back with reactive ion etching or chemical mechanical polishing, to form the lower electrode 114 comprising the titanium layer 134 and the platinum layer 135. The layer insulation film 110 is over-etched so that no traces of the titanium layer 134 remain on the surface of the layer insulation film 110. Then, as shown in FIG. 40, a dielectric film 115 is deposited with sputtering on the lower electrode 114 and the first layer insulation film 110 at a temperature of 500–700° C. The thickness of the dielectric film 115 is preferably 50–200 nm. In this embodiment, a step between the lower electrode 114 and the surface of the first layer insulation film is small. Therefore, covering of such steps is improved if compared with a prior art method, and a film growth technique which is not superior on covering such steps may also be adopted. Then, as shown in FIG. 41, a platinum upper electrode 116 is formed on the dielectric film 115. Finally, a second layer insulation film 117, a first aluminum metallization film 118, a protection film 119 and a second aluminum metallization film 120 are formed successively, similarly to in a prior art method.

In this fabrication method, a titanium film 134 and a platinum film 135 for forming the lower electrode 114 are embedded on the cavity 110ab successively as shown in FIG. 37, where the platinum film 135 also plays a role of a protection film for the titanium film 134. Then, the thickness of the films is decreased by etching the platinum film from the surface thereof and by over-etching the insulator film 110 until no traces of the titanium film 134 remains thereon. Thus, the lower electrode 114 is formed only in the cavity 110ab, as shown in FIG. 38. Thus, a stray capacitance due to etching damages at the surface of the lower electrode 114 can be reduced.

Figure 42:
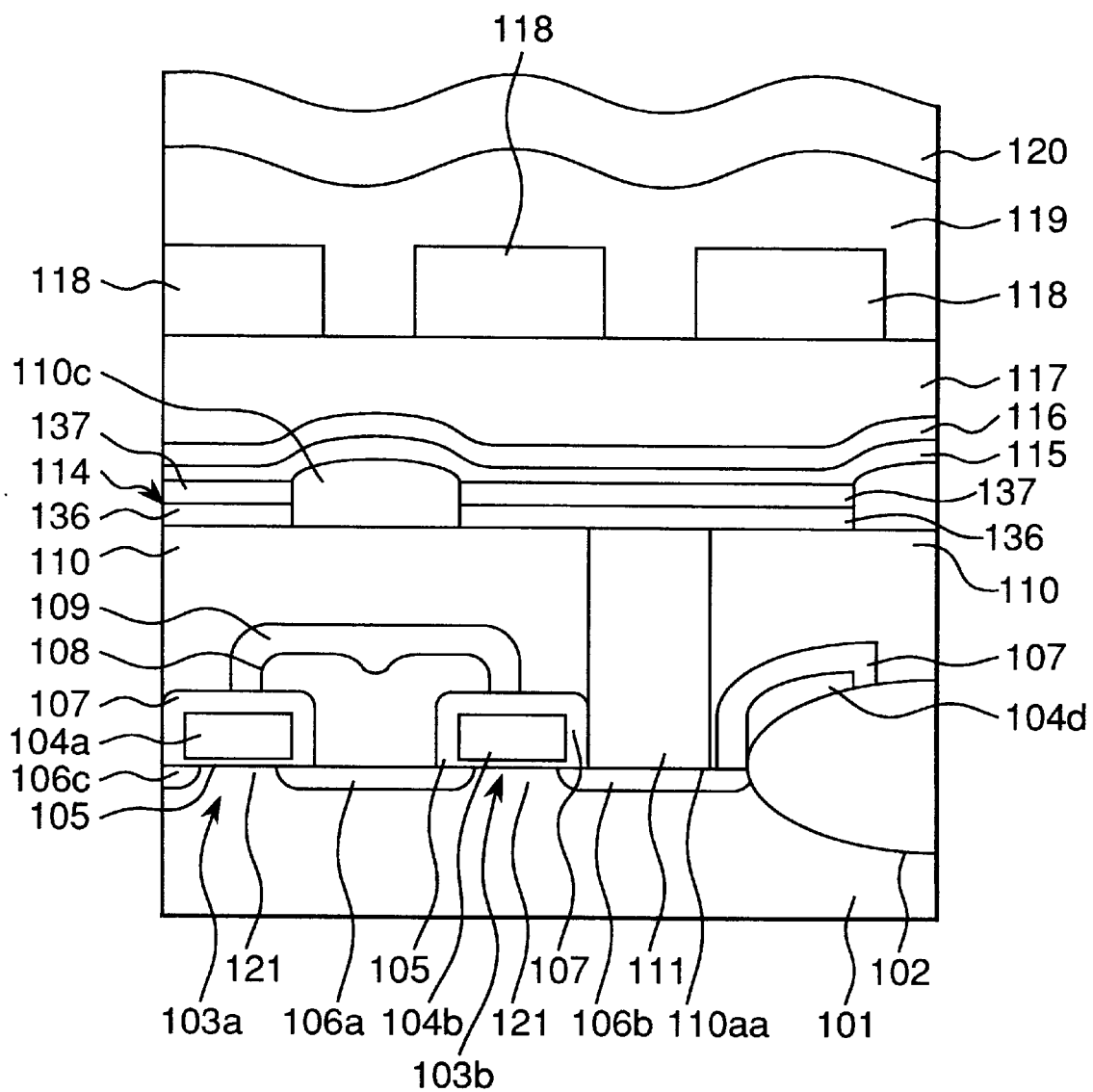
FIG. 42 is a partial sectional view of a dynamic random access memory of an eighteenth embodiment of the invention.

FIG. 42 is a partial sectional view of a dynamic random access memory (DRAM) of an eighteenth embodiment of the invention. A structure below a thin film capacitor is similar to that shown in FIG. 1. Then, a lower electrode 114 made of a barrier layer 136 and a platinum layer 137 layered successively is formed on a first layer insulation film 110 and a plug 111 formed on the N type impurity region 106b through the first layer insulation film 110. A cell insulation film 110c made of the same material as the first layer insulation film 110 is formed between the lower electrodes 114 of adjacent cells. Then, a dielectric film 115 is formed on the lower electrode 114 and the cell insulation film 110c, and an upper electrode 116 made of platinum or the like is formed successively on the dielectric film 115. Then, a second layer insulation film 117 is formed on the upper electrode 116. Next, first aluminum metallization layers 118, a protection film 119 and an aluminum metallization layers 120 are formed successively similarly to the device shown in FIG. 1. In the structure of the device described above, a stray capacitance between adjacent cells can be reduced by forming the insulating film 110c between adjacent lower electrodes 114.

Figure 43:
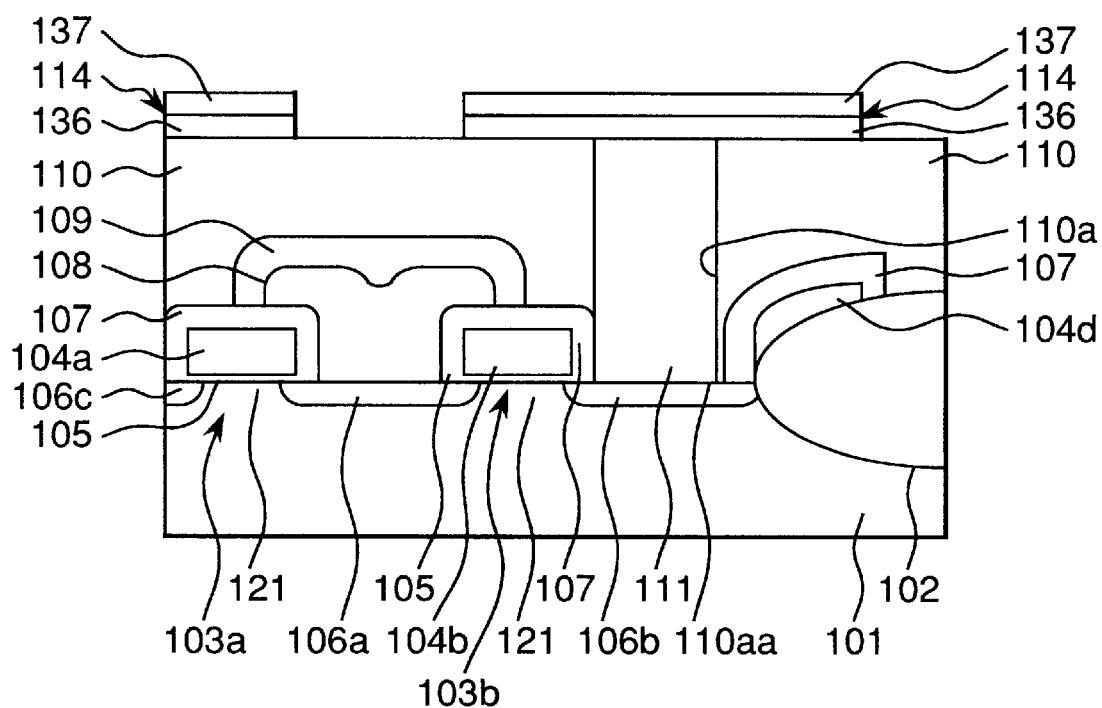
FIG. 43 is a partial sectional view of the dynamic random access memory in a first step in the eighteenth embodiment of the invention.
Figure 44:
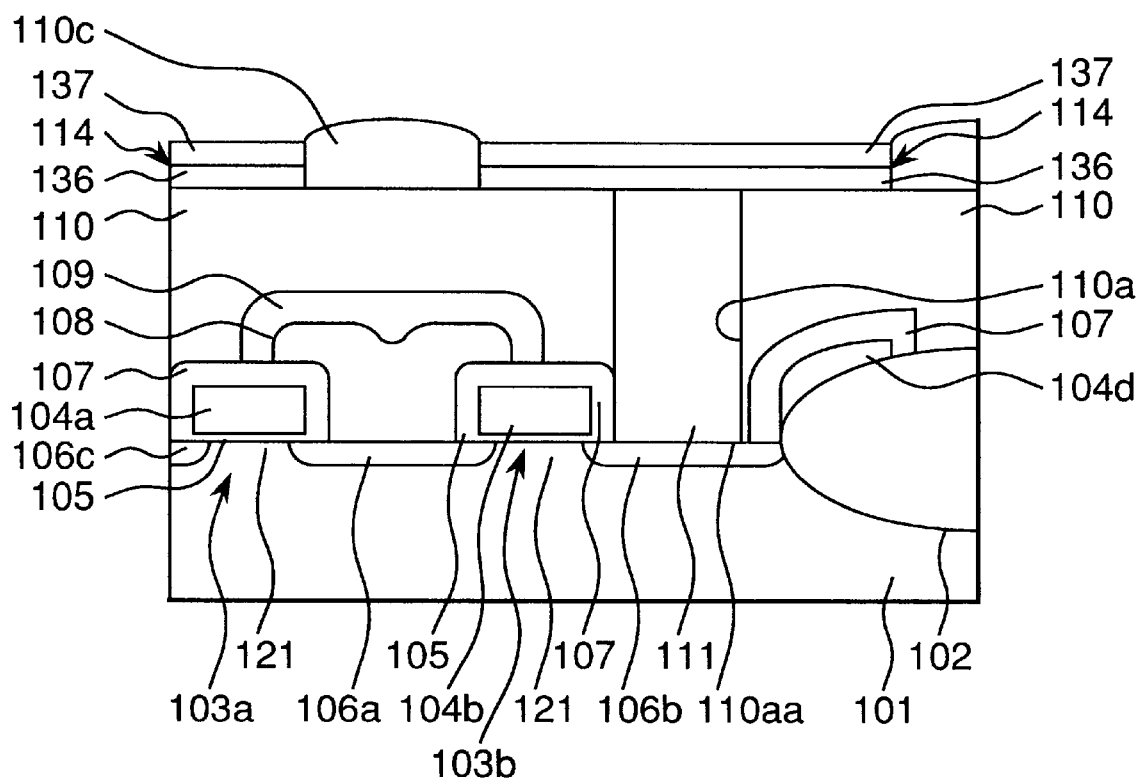
FIG. 44 is a partial sectional view of the dynamic random access memory in a second step in the eighteenth embodiment of the invention.
Figure 45:
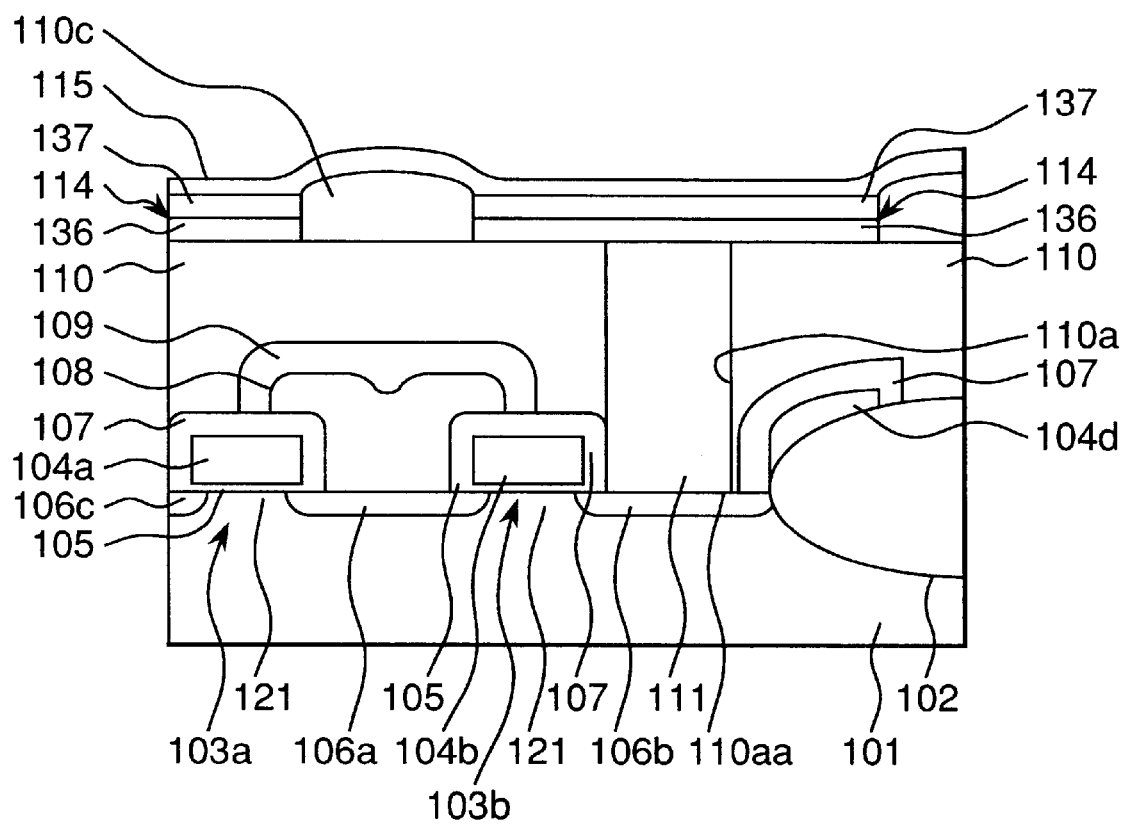
FIG. 45 is a partial sectional view of the dynamic random access memory in a third step in the eighteenth embodiment of the invention.

A fabrication method of the device of the eighteenth embodiment is explained with reference to FIGS. 43–45. As shown in FIG. 43, processes until the first layer insulation layer 110 and the plug 111 are the same as those of the prior art device. Next, a lower electrode 114 made of a titanium layer 136 and a platinum layer 137 is formed on the first layer insulation film 110 and the plug 111 with patterning. Then, as shown in FIG. 44, an insulation film 110c is formed only on the first layer insulation film 110 with selective chemical vapor deposition or spin coating. The thickness of the insulation film 110c is usually about 30–200 nm, depending on the kind of the lower electrode 114. Next, as shown in FIG. 45, a dielectric film 115 made of $SrTiO_3$ or $BaTiO_3$ is deposited with sputtering on the lower electrode 114 and the insulation film 110c at a temperature of 500–700° C. The thickness of the dielectric film 115 is preferably 50–200 nm. In this embodiment, a step between the lower electrode 114 and the surface of the insulation film 110c is small. Therefore, covering of such steps is improved if compared with a prior art method, and a film growth technique which is not superior on covering such steps may also be adopted. Then, though not shown explicitly, a platinum upper electrode 116 is formed on the dielectric film 115. Finally, a second layer insulation film 117, a first aluminum metallization film 118, a protection film 119 and a second aluminum metallization film 120 are formed successively, similarly to in a prior art method.

Figure 46:
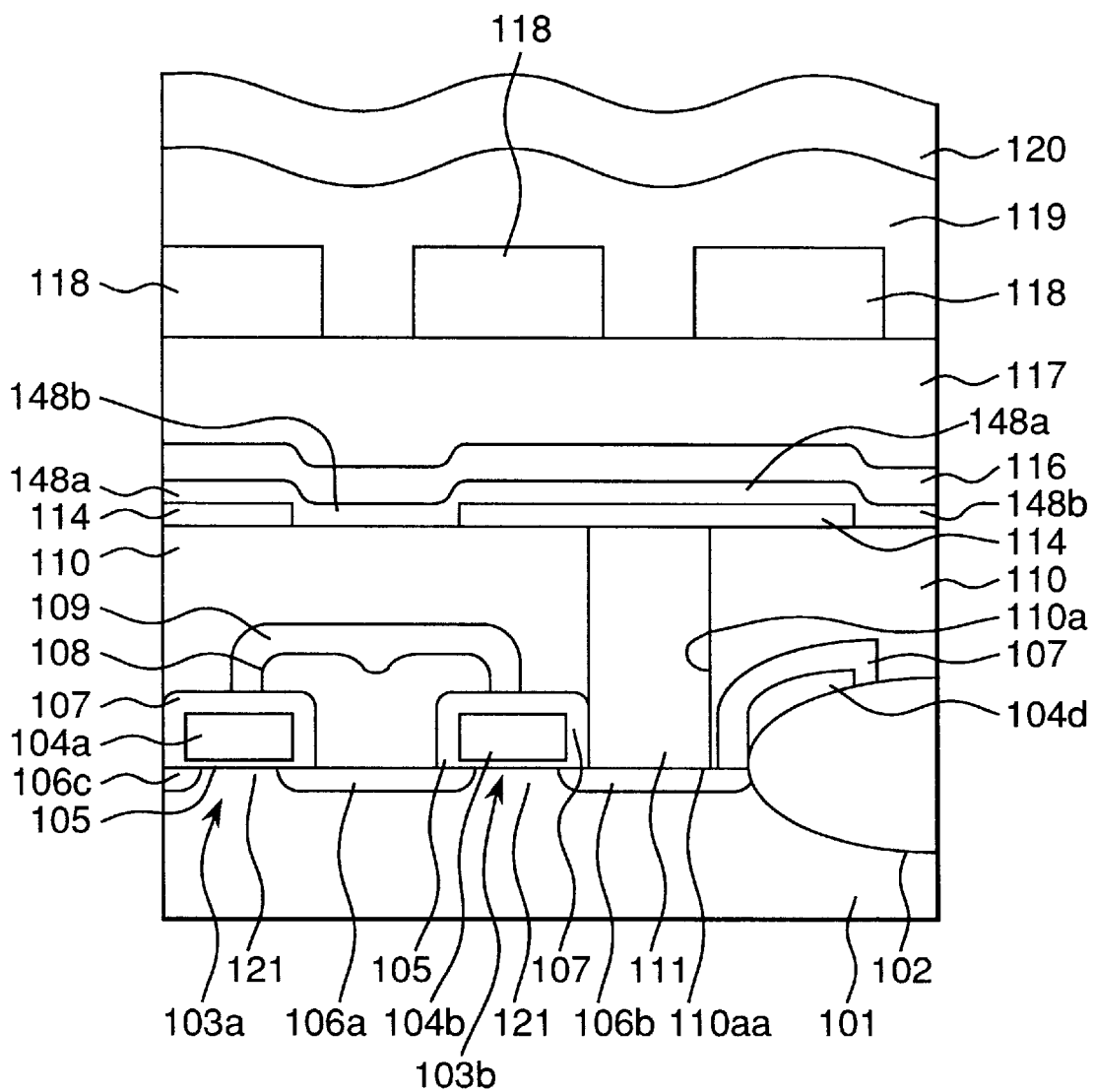
FIG. 46 is a partial sectional view of a dynamic random access memory of a nineteenth embodiment of the invention.
Figure 47:
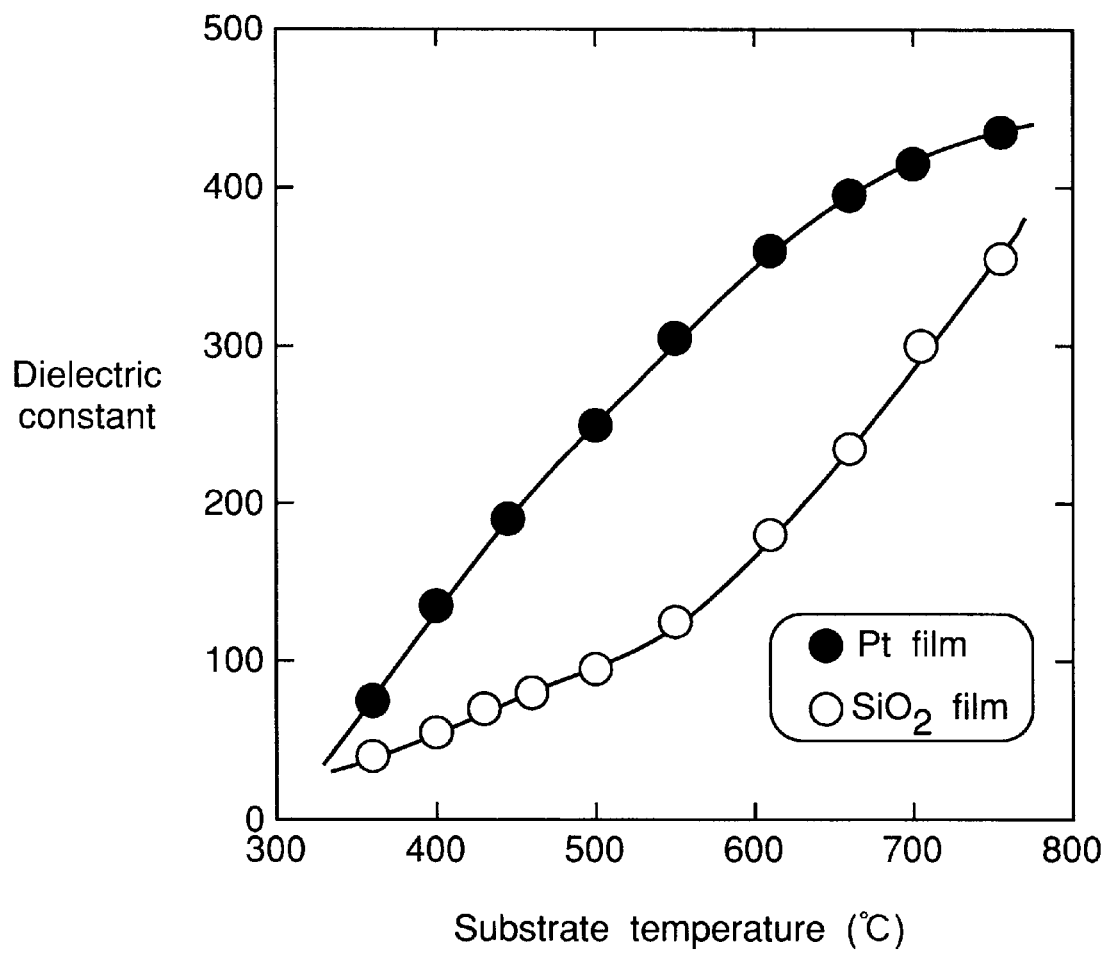
FIG. 47 is a graph of dielectric constant of $BaTiO_3$ plotted against substrate temperature for two underlayer films.

FIG. 46 is a partial sectional view of a dynamic random access memory (DRAM) of a nineteenth embodiment of the invention. A structure below a thin film capacitor is similar to that shown in FIG. 1. Processes until a first layer insulation layer 110 and a plug 111 are formed are the same as those in previous embodiments. Next, a lower electrode 114 made of platinum is formed on a first layer insulation film 110 and a plug 111. Then, a dielectric film 148 made of $BaTiO_3$ of thickness of 200 nm is deposited with reactive sputtering on the lower electrode 114 and the first layer insulation film 110 at temperature of 600° C. The deposition conditions of the dielectric film 148 are set so that the dielectric constant thereof differs largely depending on the material of $SiO_2$ and platinum at the surface. FIG. 47 shows a difference of dielectric constant of the dielectric layer 115 formed on platinum and on $SiO_2$ deposited in a temperature range of 300 to 800° C. Then, the dielectric film 148 consists of a film 148a formed on the insulation film 110 with a poor crystalline property and a low dielectric constant and a film 148b formed on the lower electrode 114 with a larger dielectric constant. Next, an upper electrode 116 made of platinum or the like is formed on the dielectric film 148a, 148b with sputtering. Then, a second layer insulation film 117 is formed on the upper electrode 116. Next, first aluminum metallization layers 118, a protection film 119 and an aluminum metallization layers 120 are formed successively similarly to the device shown in FIG. 1.

In the structure of the device described above, a stray capacitance between adjacent cells can be reduced by forming the insulating film 148b between adjacent lower electrodes 114, similarly to the eighteenth embodiment.

Figure 48:
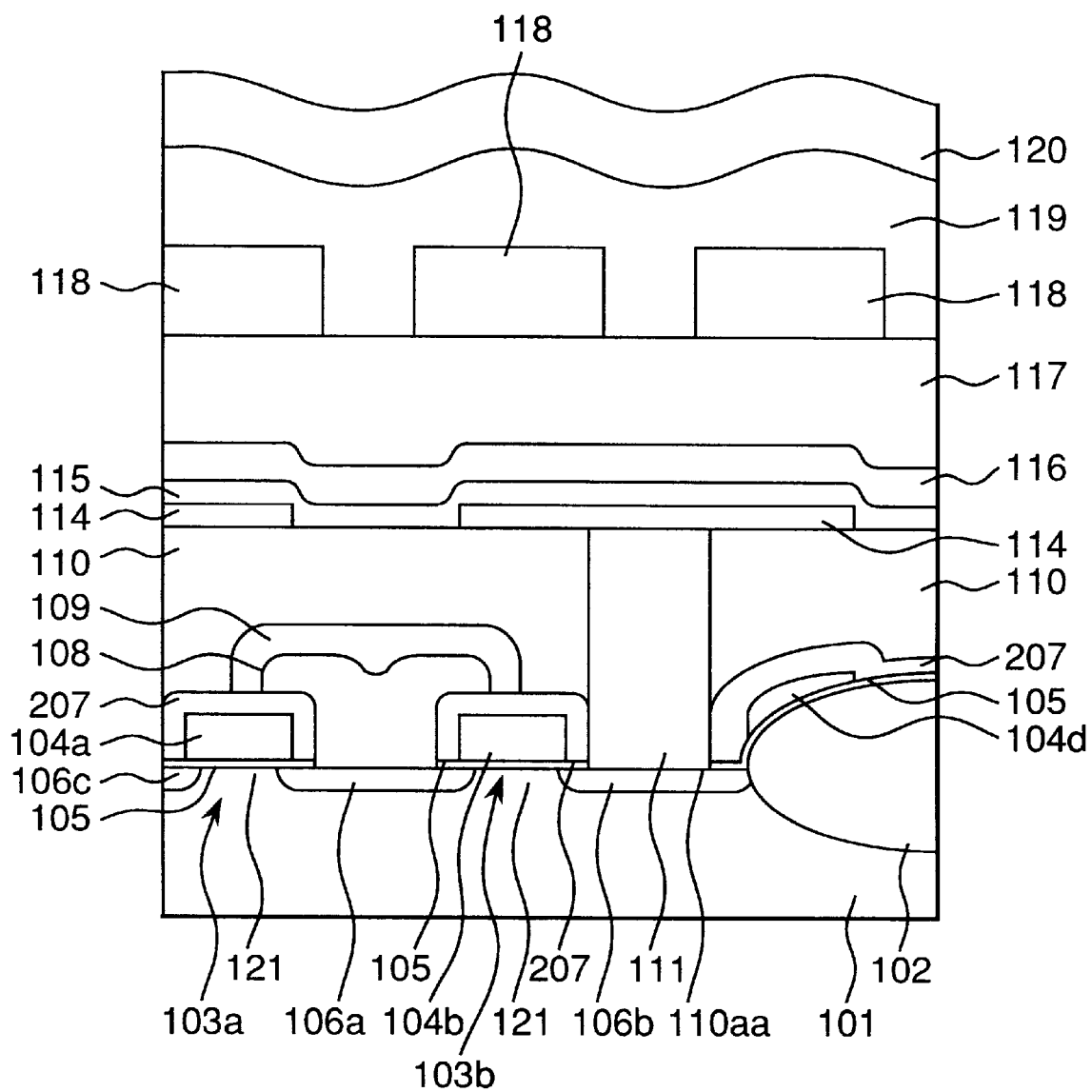
FIG. 48 is a partial sectional view of a dynamic random access memory of a twentieth embodiment of the invention.

FIG. 48 is a partial sectional view of a dynamic random access memory (DRAM) of a twentieth embodiment of the invention. A structure below a thin film capacitor is similar to a prior art structure, but a material for insulator films 207 is not conventional silicon oxide. In this device, transfer transistors 103a and 103b and a field oxide film 102 are formed on a P type semiconductor substrate 101. That is, gate electrodes 104a, 104b, 104d are formed on a gate insulating films 105 and covered with the insulator films 207. The insulator films 207 made of $SrTiO_3$ are deposited with sputtering. A metallic region 104d and an insulating film 107 are also formed on the field oxide film 102. N type impurity regions 106a, 106b are formed in the semiconductor substrate 101 between the gate electrodes 106a, 106b and between the gate electrode 106b and the field oxide film 102. A bit line 108 is formed on the N type impurity region 106a between the gate electrodes 106a, 106b, and an insulating film 109 is formed on the bit line 108. A first layer insulation film 110 are formed on the insulator films 107, 109. A contact hole 110a is formed on the N type impurity region 106b through the first layer insulation film 110, and a plug 111 is formed in the hole 110a.

Next, a thin film capacitor is formed. That is, a lower platinum electrode 114 is formed first so as to be connected to the plug 111. Then, a dielectric film 115 and an upper platinum electrode 116 are formed successively on the lower electrode 214 and the layer insulation film 110. Then, a second layer insulation film 117 is formed on the upper electrode 116. Next, first aluminum metallization layer 118, a protection film 119 and an aluminum metallization layer 120 are formed successively similarly to the device shown in FIG. 1.

Figure 49:
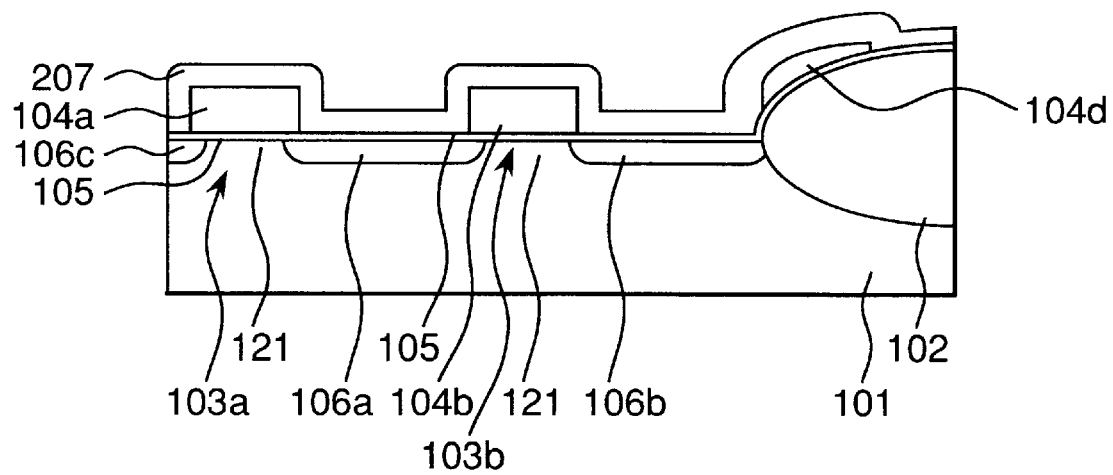
FIG. 49 is a partial sectional view of the dynamic random access memory in a first step in the twentieth embodiment of the invention.

FIGS. 49–52 show fabrication steps of the device of this embodiment. First, as shown in FIG. 49, a field oxide film 102 is formed in an region for separating elements on a principal plane of a P type semiconductor substrate 101 with LOCOS technique. Next, a gate insulation film 105 is formed with thermal oxidation or the like. Then, gate electrodes (word lines) 104a, 104b, 104d are formed selectively on the gate insulation film 105 and the field oxide film 102. Impurity regions 106c, 106a and 106b are formed by using the gate electrodes 104a, 104b, 104d as a mask and by injecting impurities into the principal plane of the semiconductor substrate 101. Then, a $SrTiO_3$ film is deposited as an insulation film 207 with chemical vapor deposition or the like having a good coverage to cover the gate electrodes 104a, 104b and 104c. The insulation film 207 is subjected to patterning in this step, and it is used later as an etching stopper when a contact hole is formed later.

Figure 50:
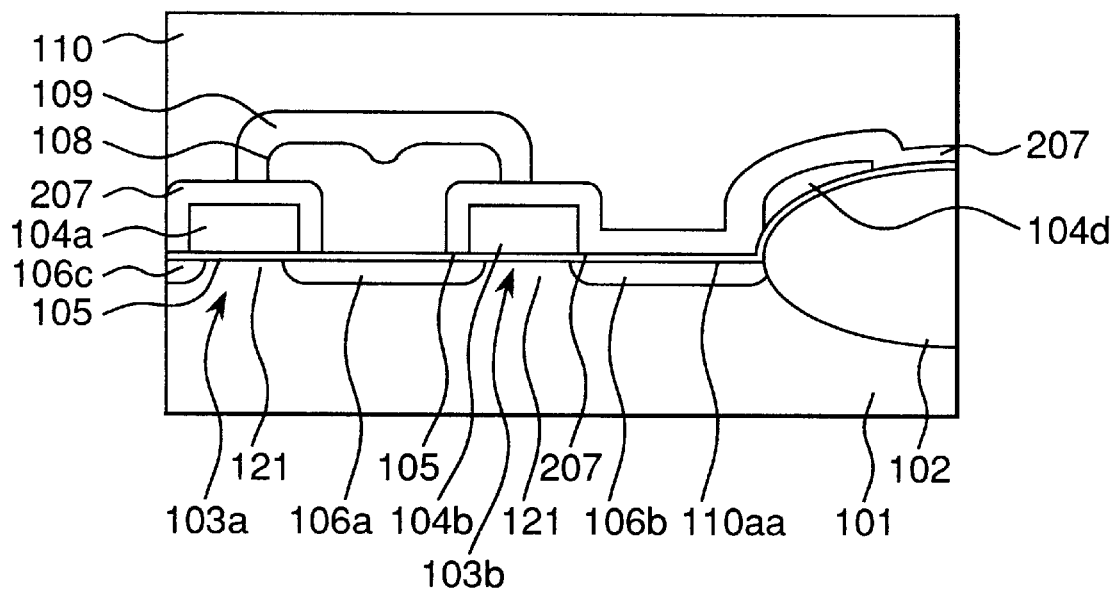
FIG. 50 is a partial sectional view of the dynamic random access memory in a second step in the twentieth embodiment of the invention.

Then, as shown in FIG. 50, a polycrystalline silicon layer is formed on the entire surface and it is subjected to patterning to form a bit line 108 connected to the impurity region 106a. Next, an insulation layer 109 is formed to cover the bit line 108. Then, a first layer insulation film 110 is deposited on the entire surface with chemical vapor deposition or the like, and the upper surface of the first layer insulation film 110 is subjected to flattening processing.

Figure 51:
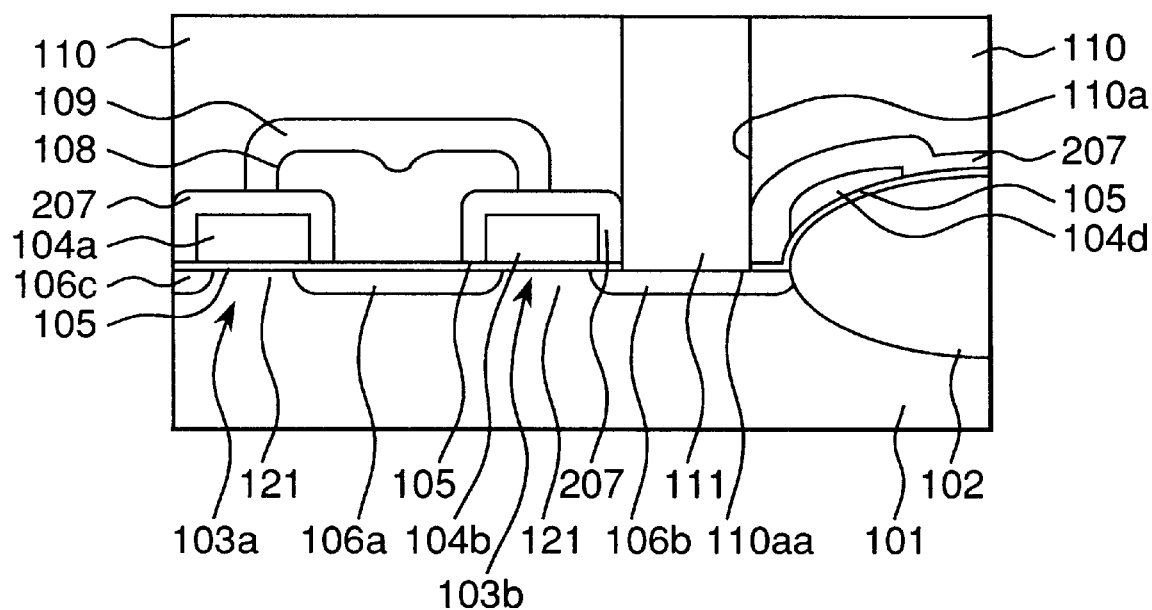
FIG. 51 is a partial sectional view of the dynamic random access memory in a third step in the twentieth embodiment of the invention.

Next, as shown in FIG. 51, by using a resist pattern formed on the first layer insulation film 110 as a mask, anisotropic etching is performed on the first layer insulation film 110 to form a contact hole 110a. Because the insulation layer 107 made of $SrTiO_3$ has high selectivity with respect to reactive ion etching for a silicon oxide film or the like, it is not etched substantially. Thus, the insulation layer 207 remains at the bottom of the contact hole 110a, and this protects the semiconductor surface at the bottom from etching damage on forming the contact hole 110a. After the resist pattern is removed, the insulation layer 207 made of $SrTiO_3$ remained at the bottom is removed with aqua regia or the like with a high selection ratio relative to the impurity regions in the substrate, the layer insulation film and the like. Thus, the contact hole 110a is formed.

Figure 52:
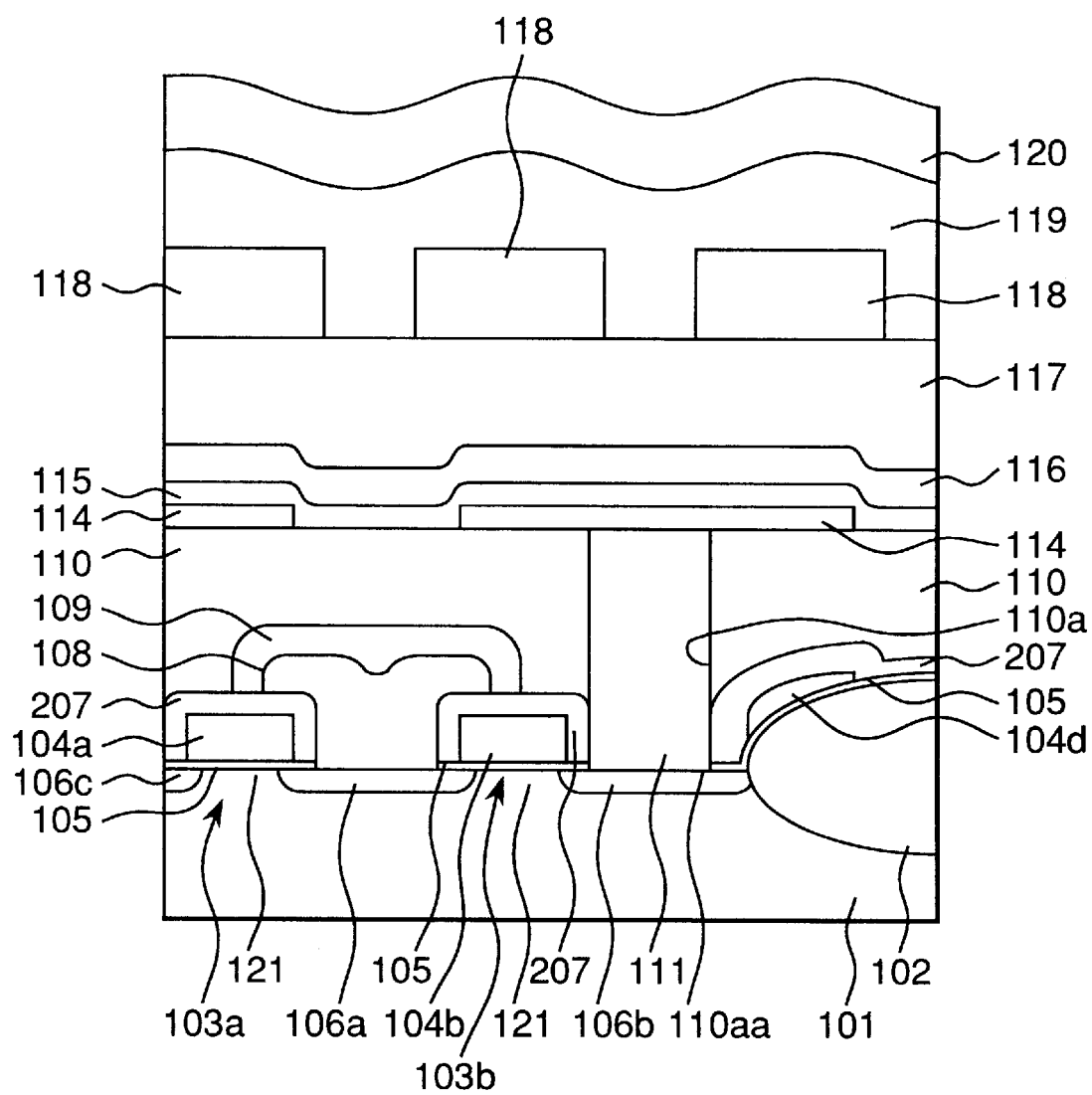
FIG. 52 is a partial sectional view of the dynamic random access memory in a fourth step in the twentieth embodiment of the invention.

After the contact hole 110a is formed, the device is fabricated similarly to a prior art device. That is, as shown in FIG. 52, a polycrystalline silicon layer is formed with chemical vapor deposition or the like to fill the contact hole 110a and to cover the first layer insulation film 110, and it is etched back to form a plug 111 in the contact hole 110a. Next, a platinum layer is formed on the plug 111 and the first layer insulation film 110, and it is etched to form a prescribed shape to form a lower electrode 114. Then, a dielectric film 115 made of a material such as Pb(Zr,Ti)O$_3$ or SrTiO$_3$ having a high dielectric constant is formed to cover the lower electrode 114. Next, another platinum layer is formed on the dielectric film 115, and it is etched to form a prescribed shape to form an upper electrode 116. Then, a second layer insulation layer 117 is formed on the upper electrode 116, and first aluminum metallization layers 118 are formed on the second layer insulation layer 117. Next, a protection layer 119 made of silicon oxide or the like is formed to cover the first aluminum metallization layers 118, and second aluminum metallization layers 120 are formed on the second layer insulation layer 119.

In the structure explained above, the insulation layer 207 made of SrTiO$_3$ acts as an etching stopper layer when the contact hole 110a is formed. In general, the gate insulation layer 207 is made of or includes a titanate, tantalum oxide, titanium oxide or the like which protects the surface of the semiconductor substrate 101 when the contact hole 110a is formed.

Figure 53:
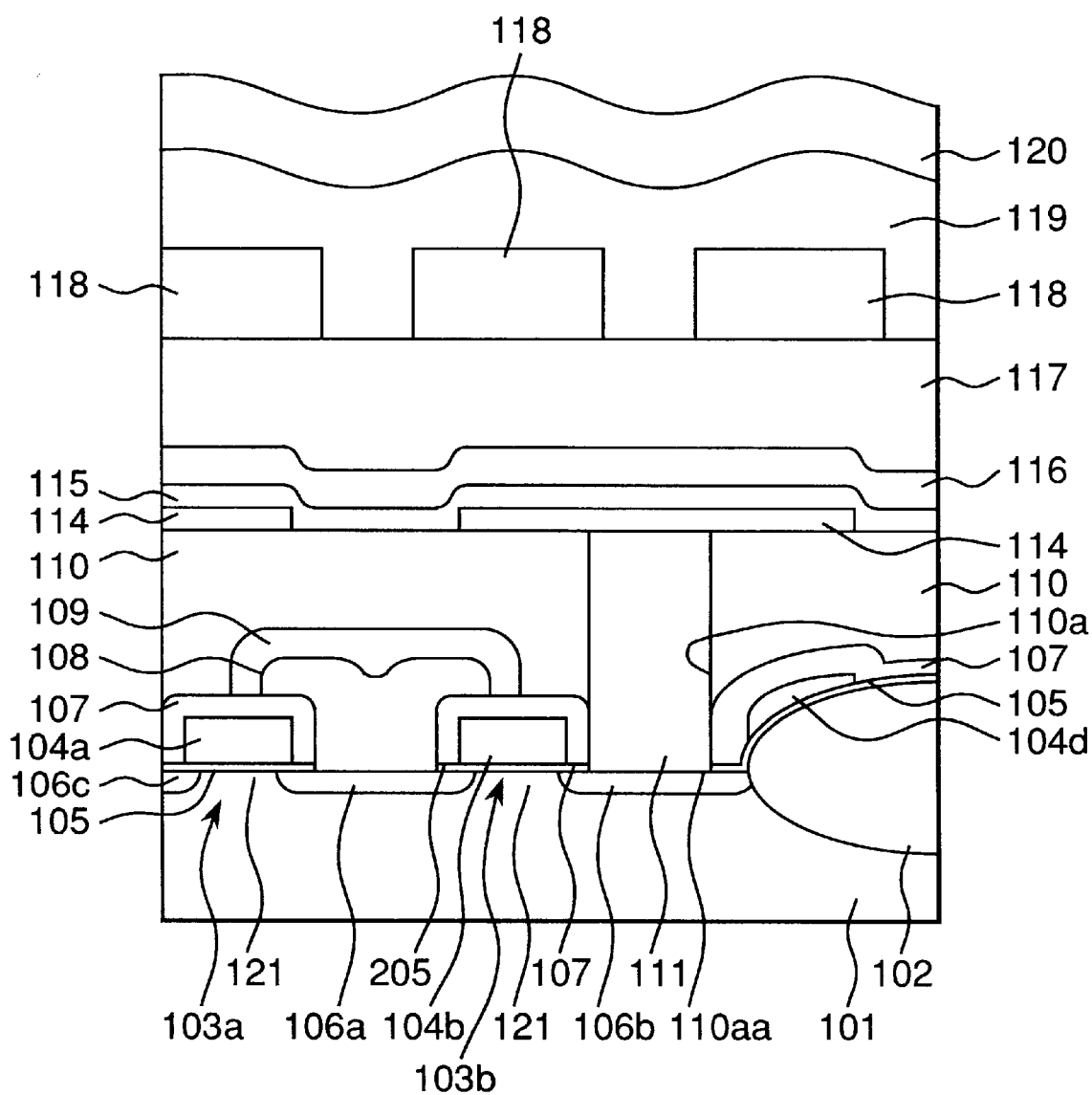
FIG. 53 is a partial sectional view of a dynamic random access memory of a twenty-first embodiment of the invention.

FIG. 53 is a partial sectional view of a dynamic random access memory (DRAM) of a twenty-first embodiment of the invention. A structure below a thin film capacitor is similar to a prior art structure, but a gate insulation film 205 in the transistor connected to the thin film capacitor is different from a conventional one. In this device, transfer transistors 103a and 103b and a field oxide film 102 are formed on a P type semiconductor substrate 101. The transfer gate transistors 103a and 103b have gate electrodes 104a and 104b formed on the gate insulation films 205 above channel regions 121 thereof. The gate insulation films 205 have a layered structure of a silicon oxide film and a SrTiO$_3$ film. Silicon oxide films 107 are deposited to cover the gate electrodes 104a and 104b. The structure above the gate insulation films 205 is similar to that of a prior art one. That is, a bit line 108, an insulating film 109, a first layer insulation film 110, a contact hole 110a, a plug 111, a lower platinum electrode 114, a dielectric film 115, an upper platinum electrode 116, a second layer insulation film 117, first aluminum metallization layers 118, a protection film 119 and an aluminum metallization layers 120 are formed successively similarly to the device shown in FIG. 1.

Figure 54:
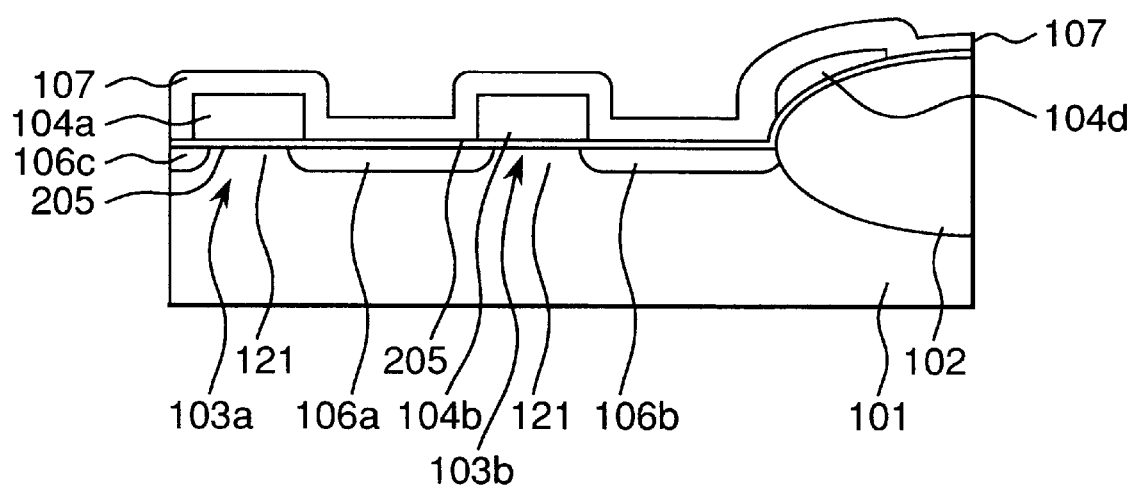
FIG. 54 is a partial sectional view of the dynamic random access memory in a first step in the twenty-first embodiment of the invention.

FIGS. 54–57 show fabrication steps of the device of this embodiment. First, as shown in FIG. 54, a field oxide film 102 is formed in an region for separating elements on a principal plane of a P type semiconductor substrate 101 with LOCOS technique. Next, a gate insulation film 205 made of SrTiO$_3$ is deposited thereon with sputtering or the like up to a thickness of about 100 nm. The gate insulation film 205 is not subjected to patterning in this step, and it is used as an etching stopper layer when a contact hole is formed, similarly in the twentieth embodiment.

Then, gate electrodes (word lines) 104a, 104b, 104d are formed selectively on the gate insulation film 205 and the field oxide film 102. Impurity regions 106c, 106a and 106b are formed by using the gate electrodes 104a, 104b, 104d as a mask and by injecting impurities into the principal plane of the semiconductor substrate 101. Then, an insulation film 107 is deposited to cover the gate electrodes 104a, 104b and 104c.

Figure 55:
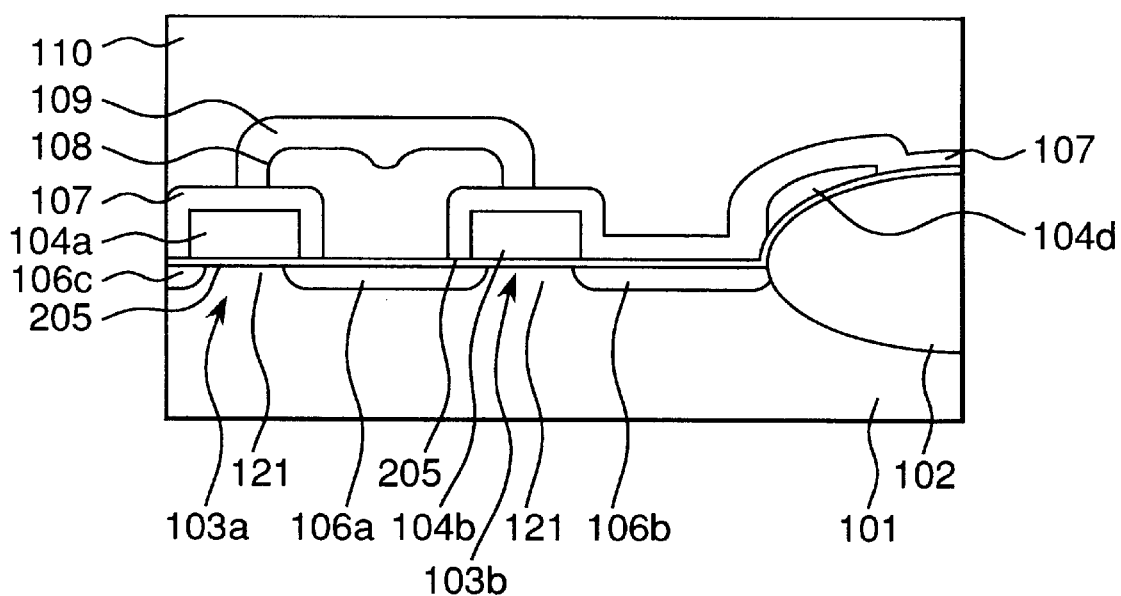
FIG. 55 is a partial sectional view of the dynamic random access memory in a second step in the twenty-first embodiment of the invention.

Then, as shown in FIG. 55, a polycrystalline silicon layer is formed on the entire surface, and it is subjected to patterning to form a bit line 108 connected to the impurity region 106a. Next, an insulation layer 109 is formed to cover the bit line 108. Then, a first layer insulation film 110 is deposited on the entire surface with chemical vapor deposition or the like, and the upper surface of the first layer insulation film 110 is subjected to flattening processing.

Figure 56:
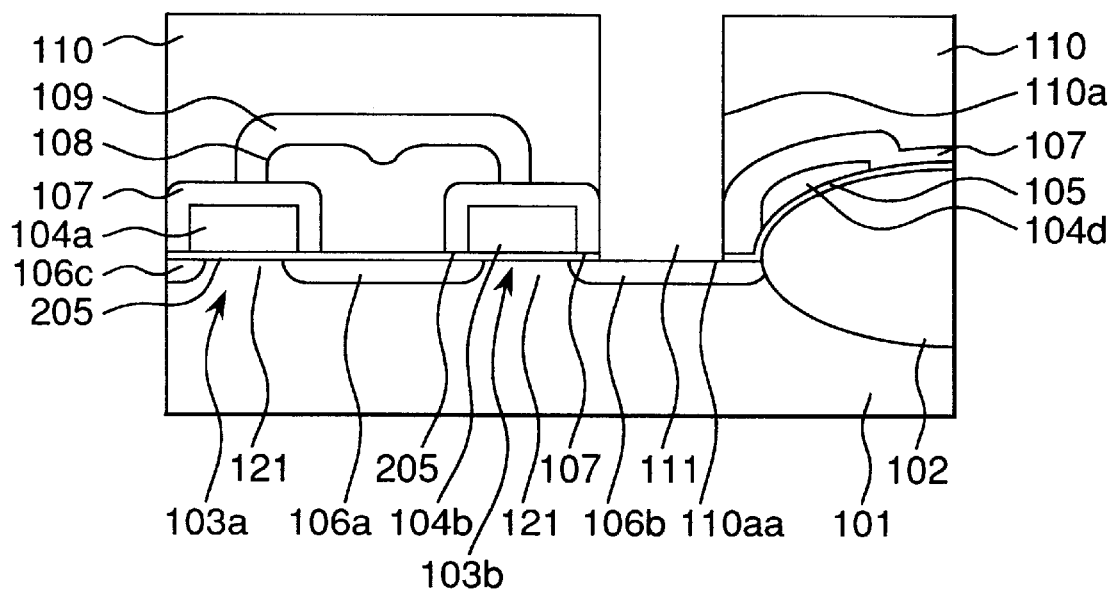
FIG. 56 is a partial sectional view of the dynamic random access memory in a third step in the twenty-first embodiment of the invention.

Next, as shown in FIG. 56, by using a resist pattern formed on the first layer insulation film 110 as a mask, anisotropic etching is performed on the first layer insulation film 110 to form a contact hole 110a. Because the gate insulation film 205 acts as an etching stopper, it protects the semiconductor surface at the bottom from etching damage on forming the contact hole 110a.

Figure 57:
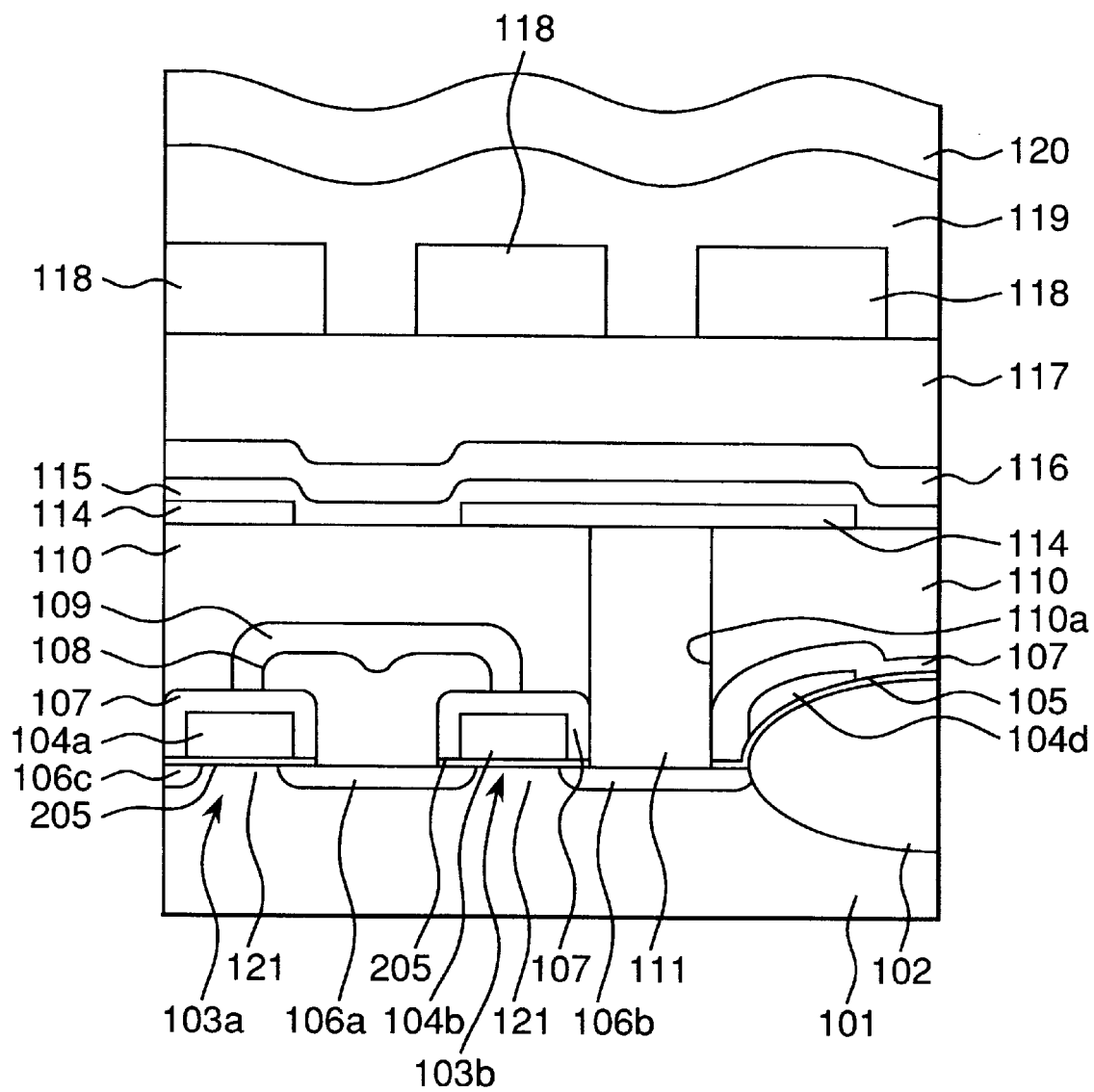
FIG. 57 is a partial sectional view of the dynamic random access memory in a fourth step in the twenty-first embodiment of the invention.

After the contact hole 110a is formed, the device is fabricated similarly to a prior art device. That is, as shown in FIG. 57, a polycrystalline silicon layer is formed with chemical vapor deposition or the like to fill the contact hole 110a and to cover the first layer insulation film 110, and it is etched back to form a plug 111 in the contact hole 110a. Next, a platinum lower electrode 114 is formed on the plug 111. Then, a dielectric film 115 made of a material such as Pb(Zn,Ti)O$_3$ or SrTiO$_3$ is formed to cover the lower electrode 114, and a platinum upper electrode 116 is formed on the dielectric film 115. Then, a second layer insulation layer 117 is formed on the upper electrode 116, and first aluminum metallization layers 118 are formed on the second layer insulation layer 117. Next, a protection layer 119 made of silicon oxide or the like is formed to cover the first aluminum metallization layers 118 and second aluminum metallization layers 120 are formed on the second layer insulation layer 119.

In the structure explained above, the gate insulation layer 205 made of SrTiO$_3$ acts as an etching stopper layer when the contact hole 110a is formed. In general, the gate insulation layer 205 is made of or includes a titanate, tantalum oxide, titanium oxide or the like which protects the surface of the semiconductor substrate 101 when the contact hole 110a is formed.

Figure 58:
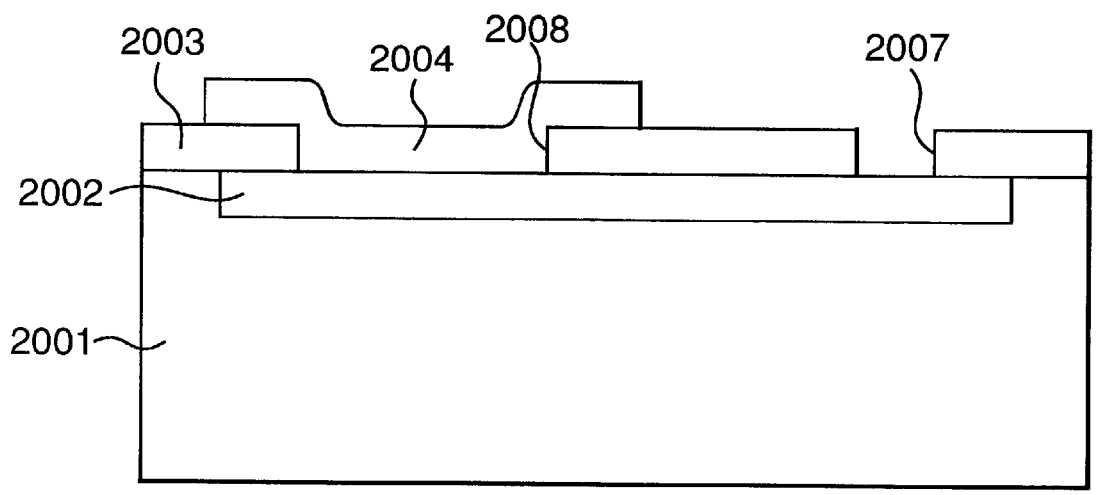
FIG. 58 is a partial sectional view of the dynamic random access memory in a first step in a twenty-second embodiment of the invention.
Figure 59:
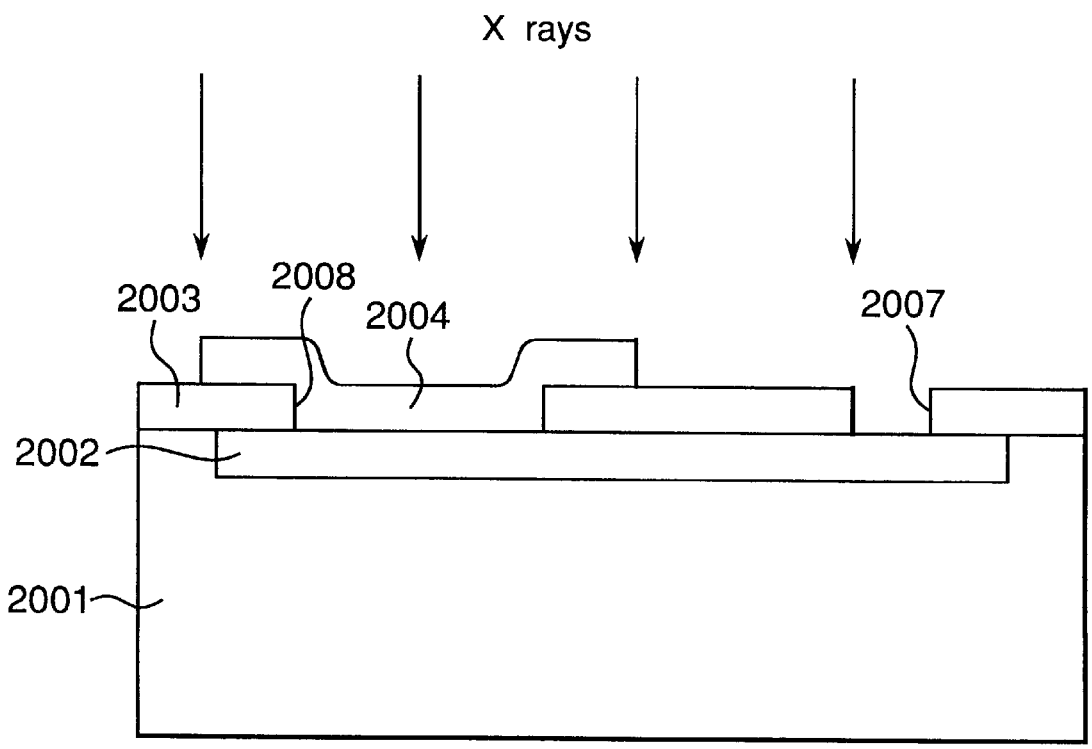
FIG. 59 is a partial sectional view of the dynamic random access memory in a second step in the twenty-second embodiment of the invention.
Figure 60:
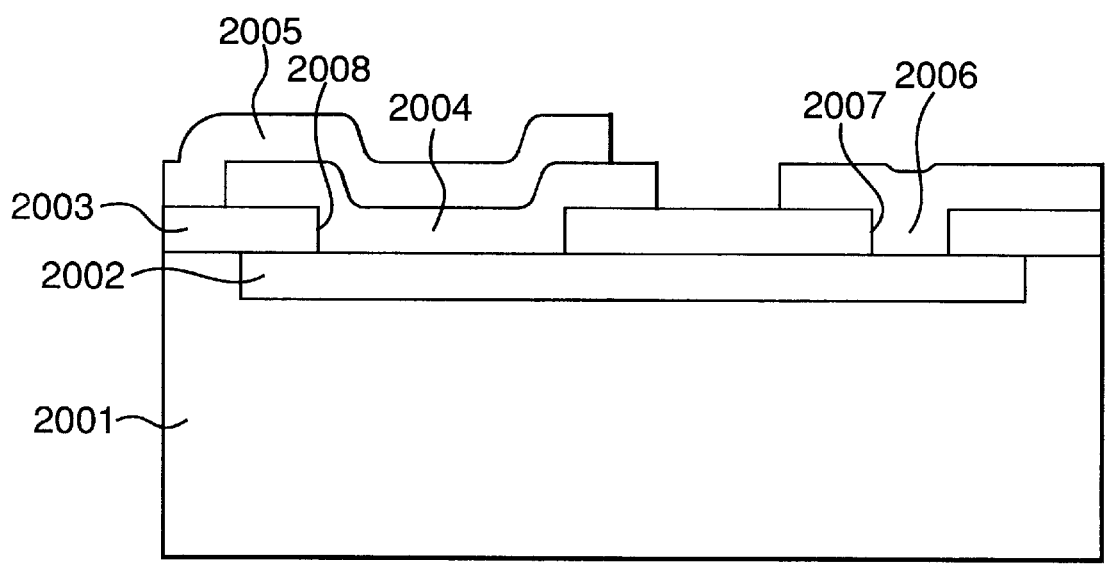
FIG. 60 is a partial sectional view of the dynamic random access memory in a third step in the twenty-second embodiment of the invention.

Next, a fabrication method of a semiconductor device comprising a thin film capacitor of a twenty-second embodiment of the invention is explained, but only a fabrication method of the thin film capacitor which is a feature of this embodiment is explained here. FIGS. 58–60 show steps of the fabrication method of the thin film capacitor which comprises a lower electrode 2002, a dielectric electrode 2004 made of a material having a high dielectric constant, and an upper electrode 2006 (FIG. 60).

As shown in FIG. 58, boron is diffused first in an N type silicon substrate 2001 to form a P type region 2002. Then, an insulation film 2003 is formed to cover the surface. a thickness thereof is preferably 50–500 nm, and 100 nm in this example. Next, an opening 2007 for a capacitor and a capacitor 2008 for an electrode are formed in the insulation film 2003. A size of the opening 2007 is preferably 10–100 $\mu$m square, and it is 10 $\mu$m square in this example. Then, a dielectric film 2004 is deposited on the surface to cover the opening 2008. FIG. 58 shows a section in this step. The thickness of the dielectric film 2004 is preferably 30–300 nm, and it is 100 nm in this example. The dielectric film 2004 is made of a material such as BaTiO$_3$ or the like having a high dielectric constant.

Further, as shown in FIG. 59, the dielectric film 2004 is irradiated with X rays having wavelengths of 0.3–1.5 nm to generate defects therein. In order to detect an influence on the electrical property of the irradiation, dosage of X rays are changed as 0, 10, 100 and 1,000 mJ/cm$^2$.

Then, as shown in FIG. 60, two platinum electrodes 2005 and 2006 are formed on the dielectric film 2004 and on the opening 2008. The thickness of the electrodes 2005 and 2006 is preferably between 50–100 nm, and it is 100 nm in this example. In the thin film capacitor fabricated as described above, the P type region 2002 is used as the lower electrode, while the platinum electrode 2006 is used as an upper electrode and a metallization line. Thus, the dielectric film 2004 is interposed between the upper and lower electrodes 2002 and 2005.

After the platinum electrodes 2005 and 2006 are formed, annealing is performed for thirty minutes. In order to investigate an influence of annealing temperature and environment, the annealing temperature is changed between 200 and 700° C. in an environment of oxygen (O$_2$), nitrogen (N$_2$), hydrogen (H$_2$) and argon. Dielectric constant and leak characteristic are measured on samples prepared as described above.

Figure 61:
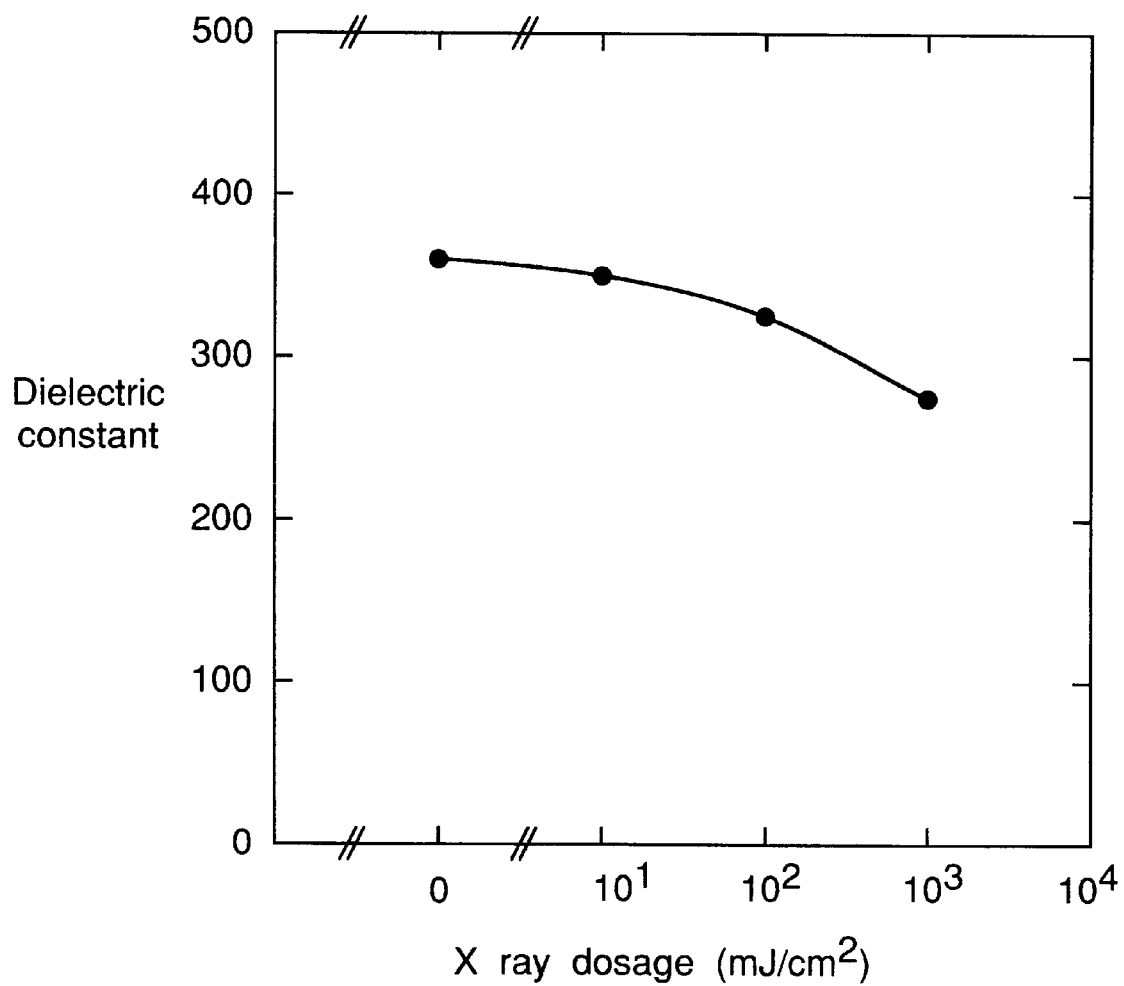
FIG. 61 is a graph of a dielectric constant of thin film capacitor before annealing plotted against X ray dosage.
Figure 62:
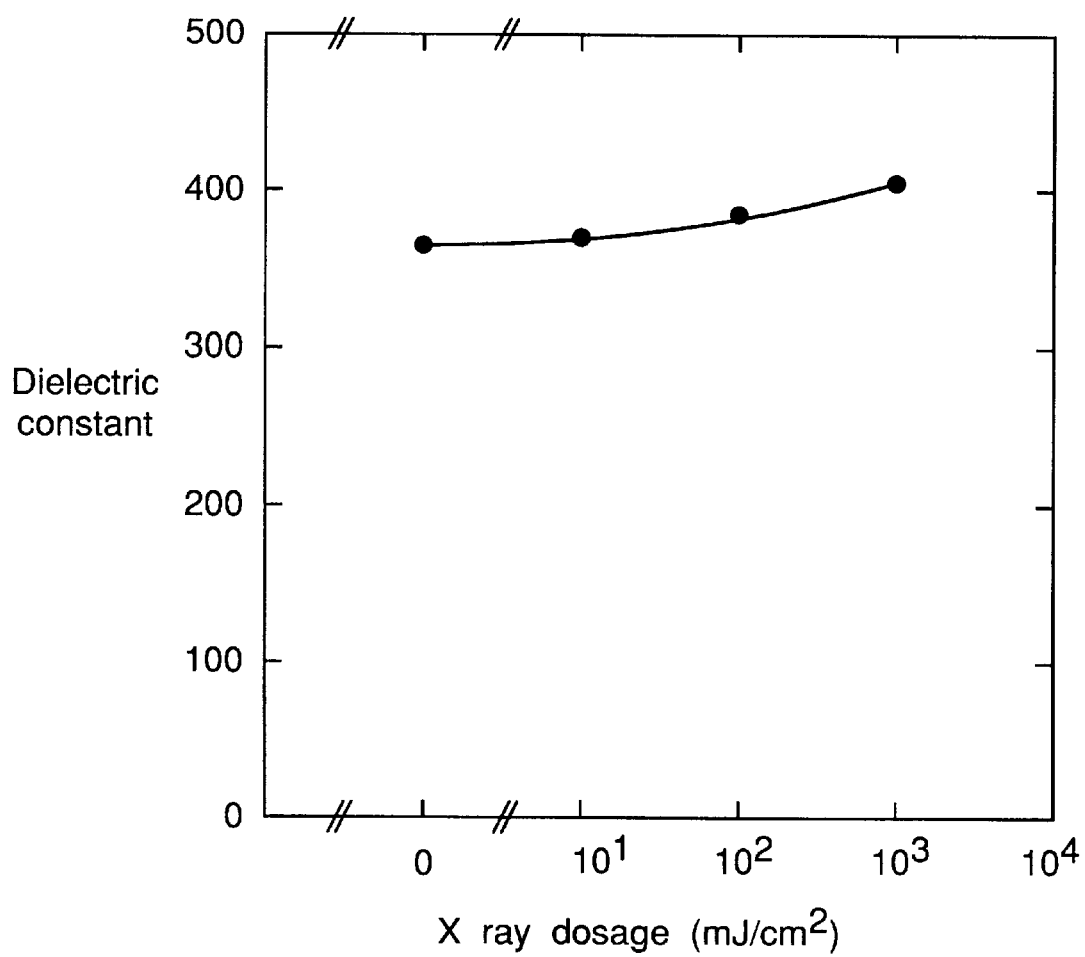
FIG. 62 is a graph of a dielectric constant of thin film capacitor after annealed in $O_2$ environment at 400° C. plotted against X ray dosage.

FIG. 61 shows a dielectric constant of thin film capacitor before annealing plotted against X ray dosage, while FIG. 62 shows the dielectric constant after annealed in O$_2$ environment at 400° C. plotted against X ray dosage The dielectric constant of the thin film capacitor before annealing decreases monotonously with increase in X ray dosage. However, after annealing, there is a tendency that the dielectric constant of the thin film capacitor increases a little with increase in X ray dosage.

Figure 63:
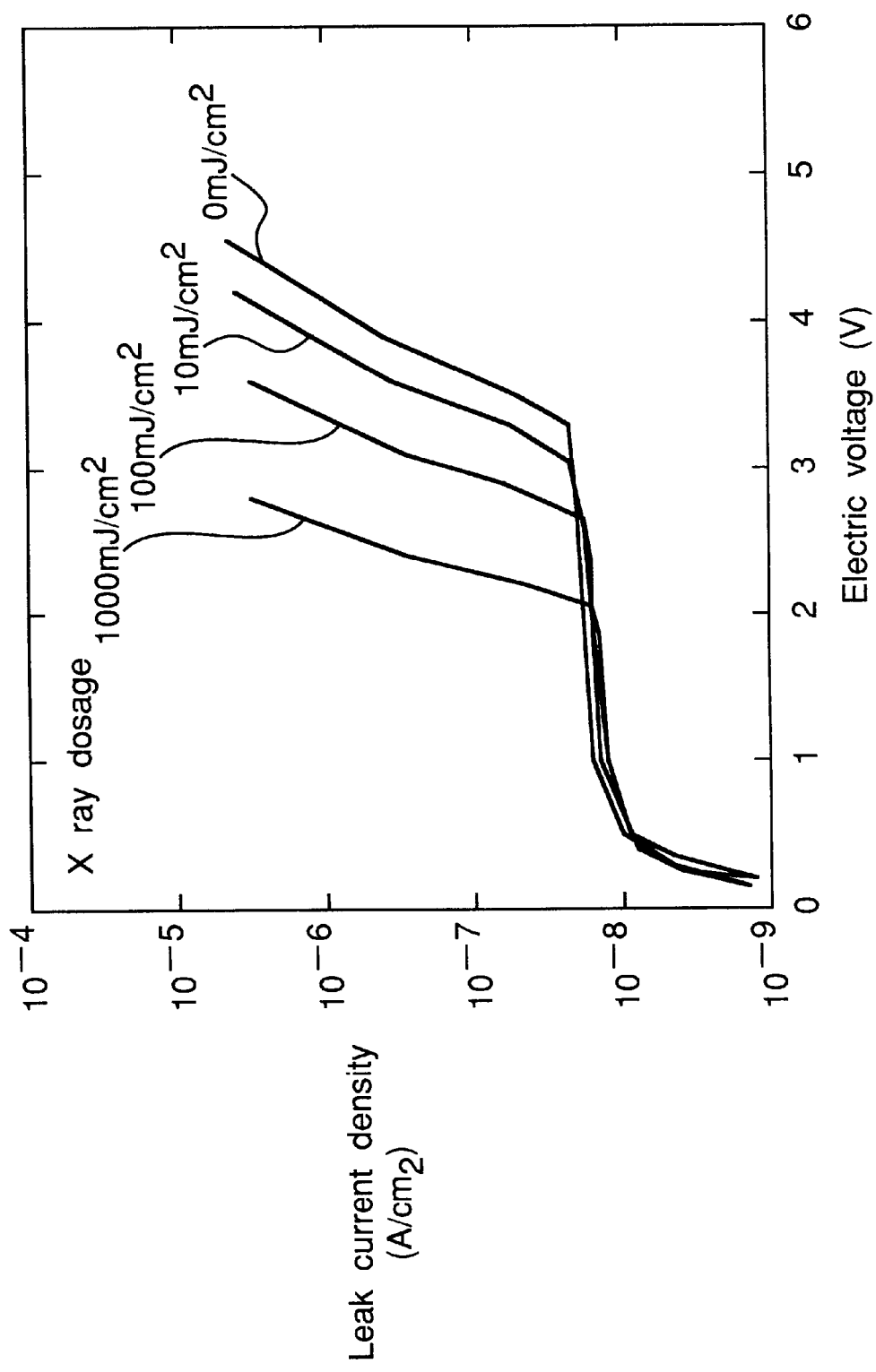
FIG. 63 is a graph of a leak characteristic of thin film capacitor before annealing plotted against X ray dosage.
Figure 64:
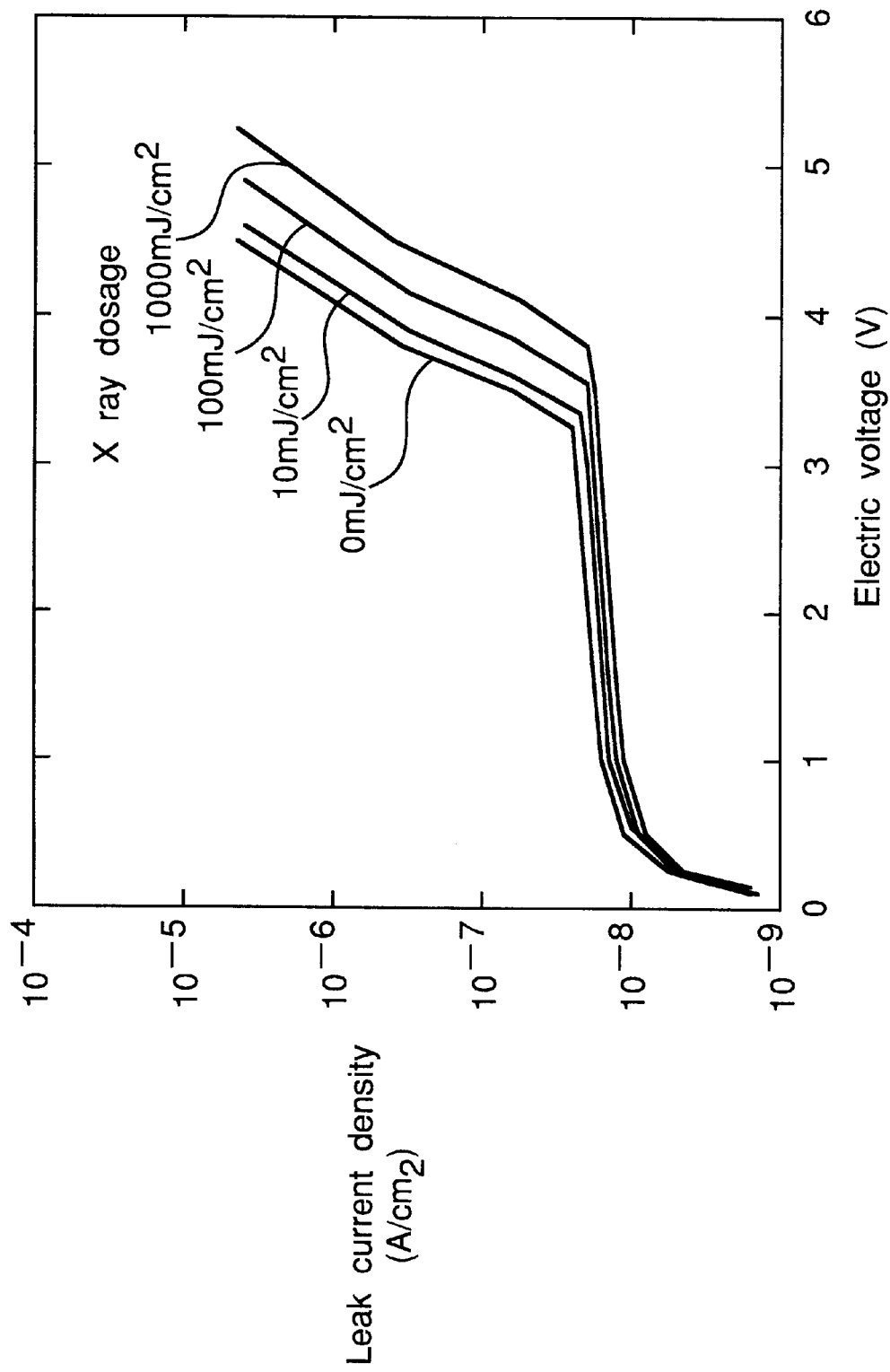
FIG. 64 is a graph of a leak characteristic of thin film capacitor after annealed in $O_2$ environment at 400° C. plotted against X ray dosage.

FIG. 63 shows X ray dosage dependence of a leak characteristic of a thin film capacitor before annealing, while FIG. 64 shows X ray dosage dependence of a leak characteristic of the thin film capacitor after annealed in O$_2$ environment at 400° C. plotted against X ray dosage. Dosage of X rays is increased as 0, 10, 100 and 1,000 mJ/cm$^2$. The leak current density increases with increasing voltage and saturates once thereafter, but it increases again sharply with further increase in voltage. With respect to a voltage at which the sharp increase starts, it decreases monotonously with increase in X ray dosage before annealing, whereas it increases with increase in X ray dosage after annealing. That is, the leak current decreases with increase in X ray dosage. It is considered that this change in the dielectric current and in the leak characteristic depends on an amount of defects in the film. To sum up, it is found that the leak characteristic of the thin film capacitor can be improved by using low temperature annealing which will not affect properties of a film. Further, the improvement is small for dosage less than 10 mJ/cm$^2$, or a dosage of at least 10 mJ/cm$^2$ is needed in order to a practical advantage.

Figure 65:
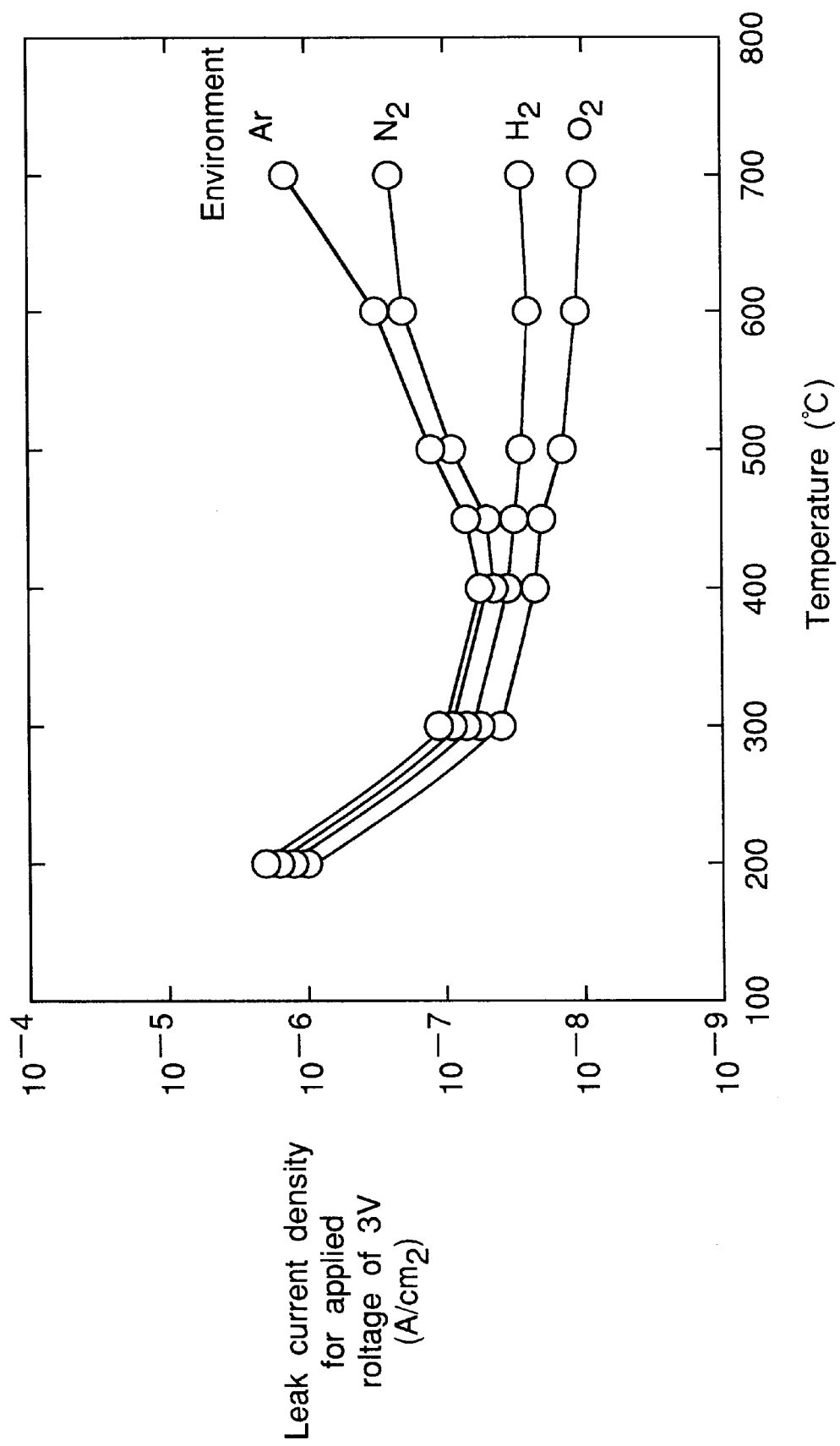
FIG. 65 is a graph of a leak characteristic of thin film capacitor after annealed in various environments plotted against annealing temperature.

FIG. 65 shows a leak characteristic (under an applied voltage of 3 V) of a thin film capacitor after annealed in various environments (Ar, N$_2$, H$_2$ and O$_2$) plotted against annealing temperature (200–700° C.). In environments of O$_2$ and H$_2$, the leak current density decreases with increase in annealing temperature in a range between 300 and 700° C. On the other hand, in environments of N$_2$ and Ar, the leak current density decreases with increase in annealing temperature in a range between 300 and 450° C., while it increases above 450° C. Then, it is found that annealing after X ray dosage is effective in environments of O$_2$ and H$_2$, and annealing temperature is preferably at 300° C. or higher. The effect of the leak characteristic on annealing environment is ascribable to diffusion of oxygen or hydrogen atoms in a dielectric film to compensate defects in the dielectric film.

As described above, the leak current can be decreased by the X ray irradiation and annealing thereafter in a dielectric film made of a material having a high dielectric constant such as BaTiO$_3$. This effect is considered as follows: Quasi-stable defects are introduced in the dielectric film 2004 by X rays, and they are annihilated as pairs with the defects which are included inherently in the dielectric film 2004. Thus, an amount of defects in the film can be decreased more efficiently than in a simple annealing adopted previously. In detail, defects in the dielectric film comprises Schottky defects as pair defects of a metallic ion and an oxygen ion and Frenkel defects such as vacancies and interstitial ions. By providing an appropriate energy to these defects to move them, pair annihilation of defects can be realized. However, because movement of defects needs a high activation energy, high temperature annealing is usually performed. In this embodiment, quasi-stable defect pairs are generated by X ray irradiation. Next, they are moved by annealing at a relatively low temperature towards defects which are hard to be moved and to be annihilated, so that the defects are removed by pair annihilation. Thus, trap levels in the dielectric film of the thin film capacitor can be improved remarkably by using annealing at a relatively low temperature, so that leak characteristic is improved.

In this embodiment, X rays of wavelengths of 0.3–1.5 nm are radiated. However, quasi-stable defect pairs mentioned above may also be generated by different high energy radiations such as X rays at different wavelengths, gamma rays, ultraviolet rays or positron radiations.

In the embodiment described above, X ray irradiation and annealing are performed before the platinum electrodes 2007 and 2008 are formed. However, the main idea of this invention is the introduction of quasi-stable defect pairs and pair annihilation thereof by annealing. Then, the X ray irradiation and the annealing can be performed at any step after the dielectric film 2004 is formed.

If X rays are used for exposure on forming a resist pattern for forming the dielectric film 2004 and the platinum electrodes 2005, 2006, the X rays may also play a role of the X ray irradiation on the dielectric film 2004.

In this embodiment, the dielectric film 2004 is made of BaTiO$_3$, the lower electrode 2002 is made of a P type region in the silicon substrate, and the upper electrodes 2005 is made of platinum. However, they are made of different materials. For example, the dielectric film 2004 may be made of SrTiO$_3$, PbTiO$_3$ or a solid solution thereof. The lower and upper electrodes 2002 and 2005 may be made of Si, Pt, TiN, IrO$_2$, or RuO$_2$.

To sum up, the characteristic of a thin film capacitor in the semiconductor device can be improved and stabilized by irradiation of high energy radiations onto the dielectric film and annealing thereafter. Preferably, the high energy radiations are X rays having a dosage of 10 mJ/cm$^2$ or higher, or annealing is performed at a temperature of 300° C. or higher in an environment including at least one of oxygen and hydrogen.

Figure 66:
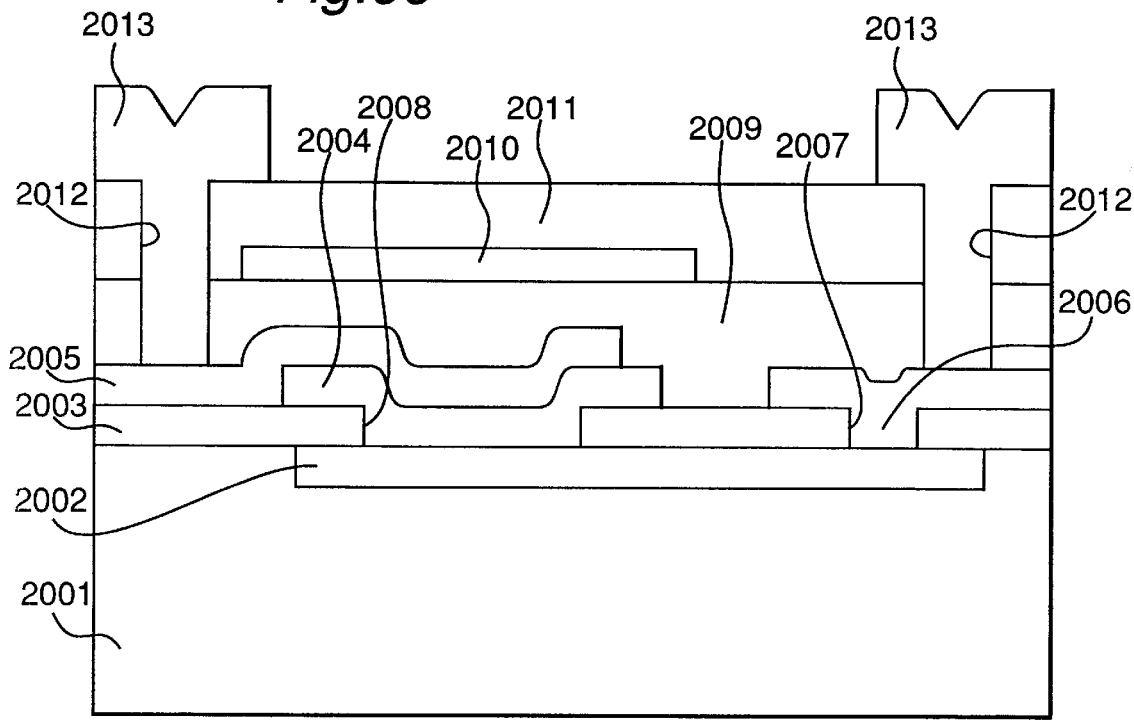
FIG. 66 is a partial sectional view of a thin film capacitor of a twenty-third embodiment of the invention.

FIG. 66 is a partial sectional view of a semiconductor device having a thin film capacitor according to a twenty-third embodiment of the invention. The structure before a layer insulation film 2011 is formed is similar to that of the device of the twenty-second embodiment shown in FIG. 60. Boron is diffused in an N type silicon substrate 2001 to form a P type region 2002. Then, an insulation film 2003 is formed to cover the surface thereof. Next, an opening 2007 for a capacitor and a capacitor 2008 for an electrode are formed in the insulation film 2003. Then, a dielectric film 2004 is deposited on the surface to cover the opening 2008. Further, platinum electrodes 2005 and 2006 are formed on the dielectric film 2004 and on the opening 2007, respectively. The platinum electrode 2005 and the P type region 2002 correspond to an upper electrode and a lower electrode, and the platinum electrode 2006 acts as a metallization line for the P type region 2002. The sizes of the lower electrode 2002 and the like are also similar to the counterparts shown in FIG. 60, but the dielectric film 2004 is not exposed to X rays.

Next, a layer insulation film 2009 is formed on the entire surface, and an X ray absorbing film 2010 is formed on the layer insulation film 2009. The thickness of the first layer insulation film 2009 is preferably between 200 and 500 nm, and it is 300 nm in this example. The X ray absorbing film 2010 is provided above the dielectric film 2004 to cover the entire film, so as to prevent the dielectric film 2004 from absorbing X rays. The thickness of the X ray absorbing film 2010 is explained layer. Then, a second layer insulation film 2022 is formed on the X ray absorbing film 2010 and the first layer insulation film 2009 is formed. The thickness of the second layer insulation film 2011 is preferably between 200 and 500 nm, and it is 300 nm in this example.

Further, two holes 2012 are formed through the first and second layers 2009 and 2011 to the upper electrode 2005 and to the platinum electrode 2006, and two aluminum metallization lines 2013 are formed through the holes 2012 and on the second layer insulation film 2011 to be connected to the upper electrode 2005 and to the platinum electrode 2006. The thickness of the aluminum lines is preferably between 300 nm and 1 μm, and it is 500 nm in this example. The aluminum lines will be connected, for example, to another thin film capacitor or a transistor formed in the same substrate so as to function the thin film capacitor as an element in a semiconductor device.

In the fabrication of the above-mentioned structure, resist patterns prepared with X ray exposure are used. X rays for exposure is a synchrotron radiations having a central wavelength of 0.5 nm, and a dosage of at least about 30 mJ/cm$^2$ is required for each exposure. It is to be noted that annealing at 400° C. is performed before forming the X ray absorbing film 2010 in order to remove defects in the dielectric film 2004 caused by X ray exposure.

The X ray absorbing film 2010 is prepared with sputtering, and it is made of tantalum, osmium, iridium, platinum, tungsten, nickel, copper, molybdenum or silver. The thickness of the X ray absorbing film 2010 is determined so that a product of the thickness and absorbing coefficient of a material of the film 2010 is equal to or larger than one. In detail, as to tantalum, osmium, iridium and platinum, the absorbing coefficient thereof is 4–5*10$^{-5}$ nm$^{-1}$, and it is preferable that the thickness of the film 2010 is 200 nm or more to absorb X rays, while it is preferably 600 nm or less in order to avoid a difficulty on fabrication. In this example, the thickness thereof is 250 nm. Similarly, as to tungsten, nickel or copper, the absorbing coefficient thereof is 2–3*10$^{-5}$ nm$^{-1}$, and it is preferable that the thickness of the film 2010 is between 250 nm and 600 nm, and in this example, it is 300 nm. Similarly, as to molybdenum or silver, the absorbing coefficient thereof is 1–2*10$^{-5}$ nm$^{-1}$, and it is preferable that the thickness of the film 2010 is between 500 nm and 600 nm, and in this example, it is 500 nm. By forming a thin film capacitor as explained above, deterioration due to X ray exposure is not observed though annealing is not performed after forming the X ray absorbing film 2010, even after exposure for the aluminum metallization.

Figure 67:
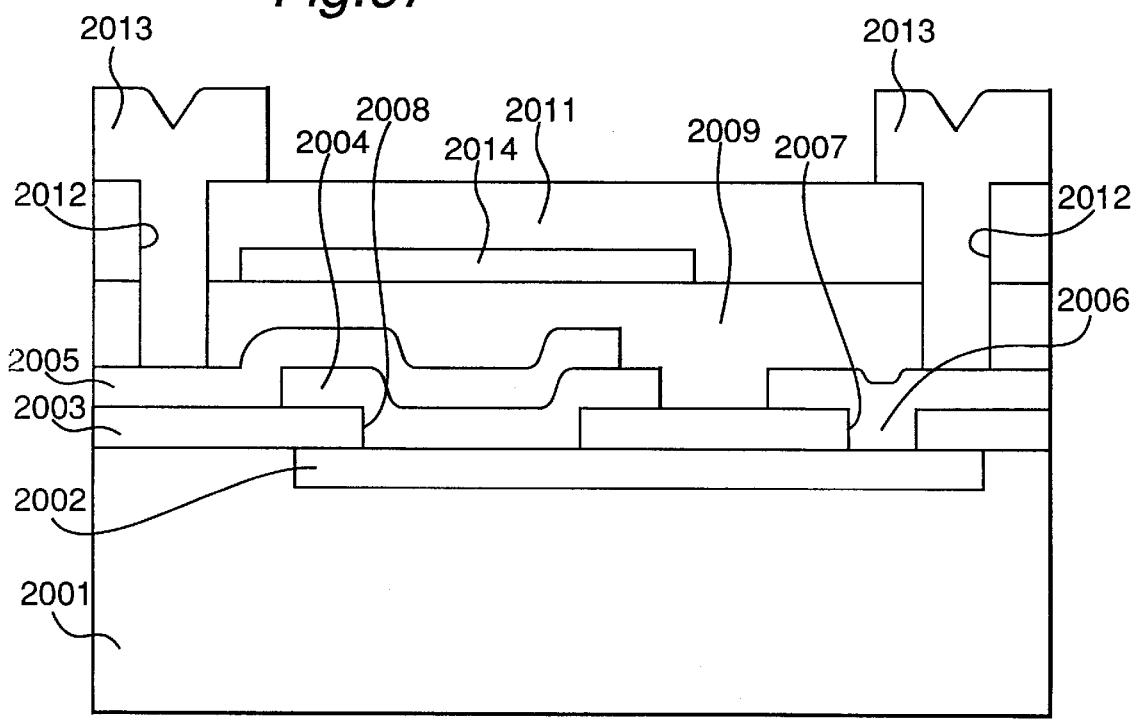
FIG. 67 is a partial sectional view of a thin film capacitor of a twenty-fourth embodiment of the invention.

FIG. 67 is a partial sectional view of a semiconductor device having a thin film capacitor according to a twenty-fourth embodiment of the invention. The structure of the device is the same as that of the twenty-third embodiment except that an X ray absorbing oxide film 2014 is formed on the layer insulation film 2009, instead of the X ray absorbing film 2010, and it is fabricated similarly except the X ray absorbing oxide film 2014. The X ray absorbing oxide film 2014 is provided above the dielectric film 2004 to cover the entire film, so as to prevent the dielectric film 2004 from absorbing X rays. The X ray absorbing film 2014 is prepared by oxidizing in an oxygen environment a film of tantalum, osmium, iridium, tungsten, nickel, copper or molybdenum deposited with sputtering. The thickness of the X ray absorbing oxide film 2014 is determined so that a product of the thickness and absorbing coefficient of a material of the film 2010 is equal to or larger than one, similarly to that of the X ray absorbing film 2010. As to an oxide of tantalum, osmium, iridium and platinum, it is preferable that the thickness of the film 2010 is between 200 nm and 600 nm, and it is 250 nm in this example. As to an oxide of tungsten, nickel or copper, it is preferable that the thickness of the film 2010 is between 250 nm and 600 nm, and in this example, it is 300 nm. As to an oxide of molybdenum or silver, it is preferable that the thickness of the film 2010 is between 500 nm and 600 nm, and in this example, it is 500 nm. By forming a thin film capacitor as explained above, deterioration due to X ray exposure is not observed though annealing is not performed after forming the X ray absorbing film 2010, even after exposure for the aluminum metallization.

Advantages of the structures of the twenty-third and twenty-fourth embodiments are described here. By providing the X ray absorbing film 2010 or the X ray absorbing oxide film 2014 above the dielectric film 2004, a quantity of X rays incident onto the dielectric film 2004 is decreased. Then, generation of defects in the dielectric film 2004 is suppressed, especially due to X ray exposure for aluminum metallization lines. Then, a stable thin film capacitor can be fabricated.

The dielectric film 2004 may also be made of $SrTiO_3$, $PbTiO_3$ or a solid solution thereof, instead of $BaTiO_3$. The lower and upper electrodes are made of Si, Pt, TiN, $IrO_2$ or $RuO_2$ instead of P type region in the silicon substrate or platinum.

Figure 68:
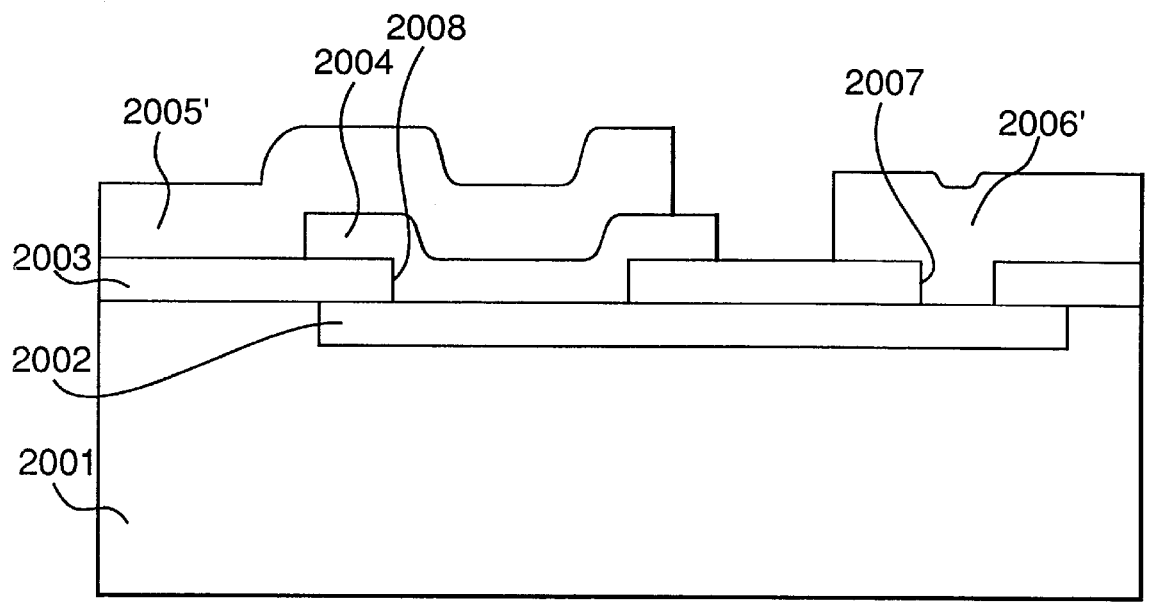
FIG. 68 is a partial sectional view of a thin film capacitor of a twenty-fifth embodiment of the invention.

FIG. 68 is a partial sectional view of a thin film capacitor of a twenty-fifth embodiment of the invention. This structure of the thin film capacitor is the same as that shown in FIG. 60 with the exception of the features of an upper electrode 2005' and an extension 2006' of a lower electrode 2002. That is, boron is diffused in an N type silicon substrate 2001 to form a P type region 2002. Then, an insulation film 2003 is formed to cover the surface thereof. Next, an opening 2007 for a capacitor and a capacitor 2008 for an electrode are formed in the insulation film 2003. Then, a dielectric film 2004 is deposited on the surface to cover the opening 2008. Further, the platinum electrodes 2005' and 2006' are formed on the dielectric film 2004 and on the opening 2007, respectively. The sizes of the lower electrode 2002 and the like are also similar to the counterparts shown in FIG. 60, but the dielectric film 2004 is not exposed to X rays. A structure above the thin film transistor is similar to that of a prior art device, and it is not explained here.

In the fabrication of the thin film capacitor, resist patterns are prepared with X ray exposure. X rays for exposure is synchrotron radiations having a central wavelength of 0.5 nm, and a dosage of at least about 30 mJ/cm$^2$ is required for each exposure. It is to be noted that annealing at 400° C. is performed before forming the X ray absorbing film 2010 in order to remove defects in the dielectric film 2004 caused by X ray exposure.

The electrodes 2005' and 2006' are made of iridium, tantalum or platinum having a large absorption coefficient for X ray wavelengths used for exposure. The thickness thereof are needed to be determined so that X rays are absorbed efficiently, but it does not become an obstacle for fabrication of the device. It is preferably between 200 and 600 nm, and it is 250 nm in this example. Then, generation of defects in the dielectric film is suppressed, and deterioration of characteristics of the thin film capacitor due to X ray exposure is not observed or the thin film capacitor has stable characteristics.

In this embodiment, the dielectric film 2004 may also be made of $SrTiO_3$, $PbTiO_3$ or a solid solution thereof, instead of $BaTiO_3$. The lower and upper electrodes are made of Si, Pt, TiN, $IrO_2$ or $RuO_2$ instead of P type region in the silicon substrate or platinum.

In the above-mentioned embodiments of the invention, various structures and fabrication methods thereof are described for preventing deterioration of characteristics of DRAMs including thin film capacitors. It is obvious for a person skilled in the art that a plurality of technical ideas is combined easily for forming a DRAM. For example, in the structure shown in FIG. 66 or 67, the X ray absorbing film 2010 or the X ray absorbing oxide film 2014 are provided above the dielectric film 2004. In the thin film capacitor of the DRAM, similarly to in the first to fifth embodiments, at least one of the lower and upper electrodes may include a main constituent element at least one metallic element whose oxide or nitride having a relative dielectric constant equal to or larger than 20, or alternately, at least one of the lower and upper electrodes includes as a main constituent element at least one metallic element whose oxide or nitride is electrically conducting. It is also possible to have lattice matching in the thin film capacitor as in the eleventh to thirteenth embodiments in order to prevent a layer having a low dielectric constant.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A capacitor structure included in a semiconductor device, said capacitor structure comprising:

an interlayer insulating film formed on a semiconductor substrate;

a plurality of capacitors including a plurality of first electrodes formed on said interlayer insulating film, a first dielectric film formed on said first electrodes and on portions of said interlayer insulating film between said first electrodes, a second dielectric film formed on said first dielectric film, and a second electrode formed on said second dielectric film; and a silicon oxide film formed at bending portions of said first dielectric layer resulting near periphery portions of said first electrodes.

2. A capacitor structure included in a semiconductor device, said capacitor structure comprising:

an interlayer insulating film formed on a semiconductor substrate;

a plurality of capacitors, each of said plurality of capacitors including a first electrode formed on said interlayer insulating film, a dielectric film formed on said first electrode, and a second electrode formed on said dielectric film; and an inter-capacitor film made of silicon oxide, said inter-capacitor film filling a space on said interlayer insulating film between said first electrodes of said plurality of capacitors.

\* \* \* \* \*